US011651202B2

(12) United States Patent
Chen et al.

(10) Patent No.: US 11,651,202 B2
(45) Date of Patent: *May 16, 2023

(54) INTEGRATED CIRCUIT CHIP DEVICE AND RELATED PRODUCT

(71) Applicant: Cambricon Technologies Corporation Limited, Beijing (CN)

(72) Inventors: Tianshi Chen, Beijing (CN); Shaoli Liu, Beijing (CN); Bingrui Wang, Beijing (CN); Yao Zhang, Beijing (CN)

(73) Assignee: CAMBRICON TECHNOLOGIES CORPORATION LIMITED, Beijing (CN)

( * ) Notice: Subject to any disclaimer, the term of this patent is extended or adjusted under 35 U.S.C. 154(b) by 699 days.

This patent is subject to a terminal disclaimer.

(21) Appl. No.: 16/698,056

(22) Filed: Nov. 27, 2019

(65) Prior Publication Data

US 2020/0097804 A1   Mar. 26, 2020

Related U.S. Application Data

(63) Continuation of application No. 16/698,000, filed on Nov. 27, 2019, which is a continuation-in-part of
(Continued)

(30) Foreign Application Priority Data

Dec. 30, 2017 (CN) .......................... 201711499268.4

(51) Int. Cl.
*G06N 3/063* (2023.01)
*G06N 3/04* (2023.01)
(Continued)

(52) U.S. Cl.
CPC ............... *G06N 3/063* (2013.01); *G06N 3/04* (2013.01); *G06N 3/08* (2013.01); *H03M 7/70* (2013.01)

(58) Field of Classification Search
CPC ............ G06N 3/063; G06N 3/04; G06N 3/08; G06N 3/0454; H03M 7/30
See application file for complete search history.

(56) References Cited

U.S. PATENT DOCUMENTS 5,041,916 A     8/1991  Yoshida et al.
10,891,538 B2 * 1/2021  Dally .................... G06N 3/063
(Continued)

FOREIGN PATENT DOCUMENTS

CN     105512723 A    4/2016
CN     106126481 A    11/2016
(Continued)

OTHER PUBLICATIONS

EP 18 894 430.0—Extended European Search Report, dated Feb. 23, 2021, 13 pages.
(Continued)

*Primary Examiner* — Dhaval V Patel
(74) *Attorney, Agent, or Firm* — Getech Law LLC; Jun Ye

(57) ABSTRACT

The present disclosure provides an integrated circuit chip device and a related product. The integrated circuit chip device includes: a primary processing circuit and a plurality of basic processing circuits. The primary processing circuit or at least one of the plurality of basic processing circuits includes the compression mapping circuits configured to perform compression on each data of a neural network operation. The technical solution provided by the present disclosure has the advantages of a small amount of computations and low power consumption.

20 Claims, 18 Drawing Sheets

Related U.S. Application Data application No. PCT/CN2018/125801, filed on Dec. 29, 2018.

(51) Int. Cl.
*G06N 3/08* (2023.01)
*H03M 7/30* (2006.01)

(56) References Cited

U.S. PATENT DOCUMENTS

| | | | |
|---|---|---|---|
| 11,003,985 B2* | 5/2021 | Kim | G06N 3/04 |
| 11,037,330 B2* | 6/2021 | Bar-On | H04N 19/42 |
| 11,087,234 B2* | 8/2021 | Feng | H04L 41/16 |
| 2015/0281570 A1 | 10/2015 | Takamura | |
| 2017/0220925 A1 | 8/2017 | Alsharif et al. | |
| 2017/0364733 A1 | 12/2017 | Estrada et al. | |
| 2018/0046894 A1 | 2/2018 | Yao | |
| 2018/0260710 A1 | 9/2018 | Zhang et al. | |
| 2021/0201078 A1* | 7/2021 | Yao | G06N 3/08 |

FOREIGN PATENT DOCUMENTS

| | | |
|---|---|---|
| CN | 106447034 A | 2/2017 |
| CN | 106991477 A | 7/2017 |
| CN | 107220706 A | 9/2017 |
| CN | 107229967 A | 10/2017 |
| CN | 107239823 A | 10/2017 |
| CN | 107239825 A | 10/2017 |
| CN | 107239829 A | 10/2017 |
| CN | 107315574 A | 11/2017 |
| CN | 107316078 A | 11/2017 |
| CN | 107329734 A | 11/2017 |
| CN | 107368885 A | 11/2017 |
| CN | 107506722 A | 12/2017 |
| TW | 201541372 A | 11/2015 |
| TW | 201627923 A | 8/2016 |

OTHER PUBLICATIONS

Aojun Zhou, et al., "Incremental Network Quantization: Towards Lossless CNNs with Low-Precision Weights" ICLR 2017, 14 pages.
CN 201711499265.0—First Office Action, dated Aug. 31, 2020, 19 pages. (with English translation).
CN CN201711499266.5—First Office Action, dated Aug. 31, 2020, 20 pages. (with English translation).
TW 107147413—Office Action, dated Nov. 18, 2021, 7 pages. (with brief English explanation).
TW TW107147415—Office Action, dated Dec. 7, 2021, 10 pages. (with brief English explanation).
PCT/CN2018/125801, Search Report, dated Mar. 29, 2019, 12 pages. (with English translation).
CN 201711499267.X, Office Action dated Nov. 28, 2019, 16 Pages. (with English translation).
CN 201111499268.4, Official Action dated Nov. 28, 2019, 16 Pages. (with English translation).

* cited by examiner

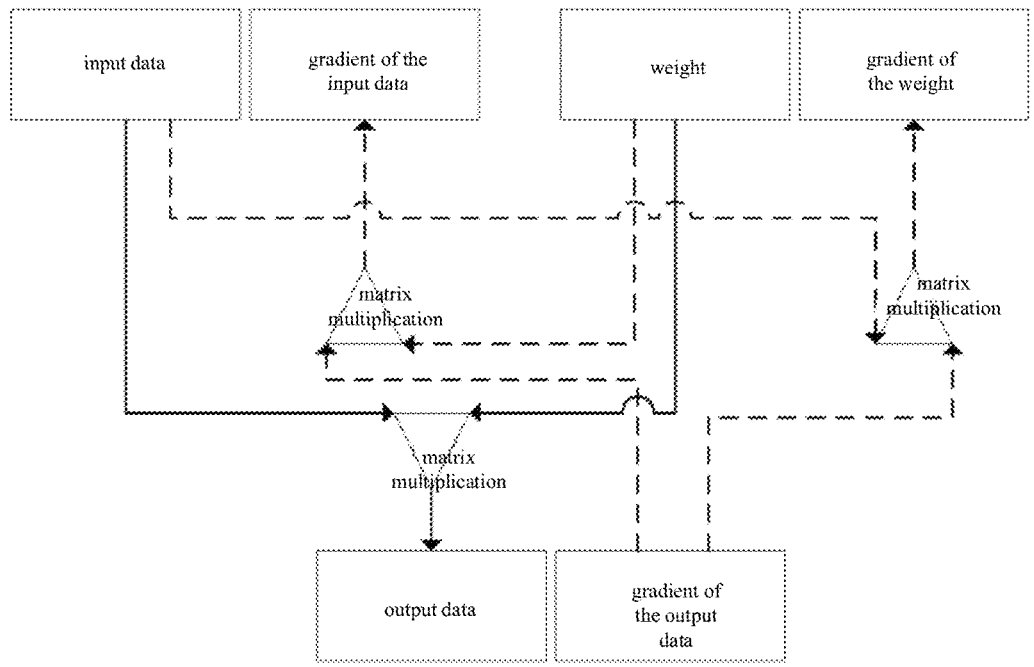

Fig. 3a

S301 distributing, by the control circuit of the primary processing circuit, the weight of each convolution kernel of the weights of the convolution layer to one of the K basic processing circuits; storing, by the control circuit of the primary processing circuit, the weight of each convolution kernel to the on-chip cache and/or the register of the basic processing circuits S302 transmitting, by the control circuit of the primary processing circuit, each part of the input data P to each basic processing circuit in a broadcast manner S303 compressing, by each basic processing circuit, the convolution kernel and the input data P; computing, by each basic processing circuit, the inner product of the compressed convolution kernel and the compressed input data P S304 accumulating, by the accumulator circuit of the each basic processing circuit, a result of the inner product operation; and transmitting, by the accumulator circuit of each basic processing circuit, the accumulated result back to the primary processing circuit

Fig. 3b

INTEGRATED CIRCUIT CHIP DEVICE AND RELATED PRODUCT

TECHNICAL FIELD

The disclosure relates to the field of neural network, particularly to an integrated circuit chip device and a related product.

BACKGROUND

Artificial Neural Network (ANN) is a research hotspot in the field of artificial intelligence since the 1980s, which abstracts the human brain neuron network from the perspective of information processing to establish a simple model, and forms to different networks according to different connection methods. In the field of engineering and academia, artificial neural network is often referred to as neural network. The neural network is an operation model consisting of a large number of interconnected nodes (or neurons). The operation of the existing neural network is based on the CPU (Central Processing Unit) or the GPU (Graphics Processing Unit) to implement the operation of the neural network, which requires a large amount of computation and high power consumption.

SUMMARY

The present disclosure provides an integrated circuit chip device and a related product, which can improve the processing speed and efficiency of a computation device.

A first aspect of the present disclosure provides an integrated circuit chip device, which may include a primary processing circuit, k branch circuits, and k groups of basic processing circuits, where the primary processing circuit may be connected to the k branch circuits respectively, each branch circuit of the k branch circuits may correspond to one group of basic processing circuits of the k groups of basic processing circuits, and one group of basic processing circuits may include at least one basic processing circuit.

Each of the branch circuit may include a compression mapping circuit configured to perform compression on each data in a neural network operation.

The primary processing circuit may be configured to perform operations of the neural network in series and transmit the data to the k branch circuits connected to the primary processing circuit.

The k branch circuits may be configured to forward the data between the primary processing circuit and the k groups of basic processing circuits, and control whether to start the compression mapping circuit to perform compression on the transmitted data according to the operation of the transmitted data.

The k basic processing circuits may be configured to perform operations of the neural network in series according to the data or the compressed data, and transmit an operation result to the primary processing circuit.

A second aspect of the present disclosure provides a neural network operation device, which may include one or more of the integrated circuit chip devices provided by the first aspect.

A third aspect of the present disclosure provides a combined processing device including the neural network operation device provided by the second aspect, a general-purpose interconnection interface, and a general-purpose processing device.

The neural network operation device may be connected to the general-purpose processing device through the general-purpose interconnection interface.

A fourth aspect of the present disclosure provides a chip, which integrates the devices provided by any one of the first aspect to the third aspect.

A fifth aspect of the present disclosure provides an electronic device including the chip of the fourth aspect.

A sixth aspect of the present disclosure provides an operation method of the neural network, which may be applied to the integrated circuit chip device. The integrated circuit chip device may include the integrated circuit chip device described in the first aspect, and the integrated circuit chip device may be configured to perform operations of the neural network.

It can be seen that the compression mapping circuit provided by the present disclosure may compress the data block before performing operations, which could save transmission resources and computing resources. Therefore, adopting the compression mapping circuit has the technical effects of low power consumption and less computation.

BRIEF DESCRIPTION OF THE DRAWINGS

FIG. 3a is diagram of neural network training according to an embodiment of the disclosure.

FIG. 3b is diagram of convolution operation according to an embodiment of the disclosure.

DETAILED DESCRIPTION OF THE EMBODIMENTS

Figure 1A:
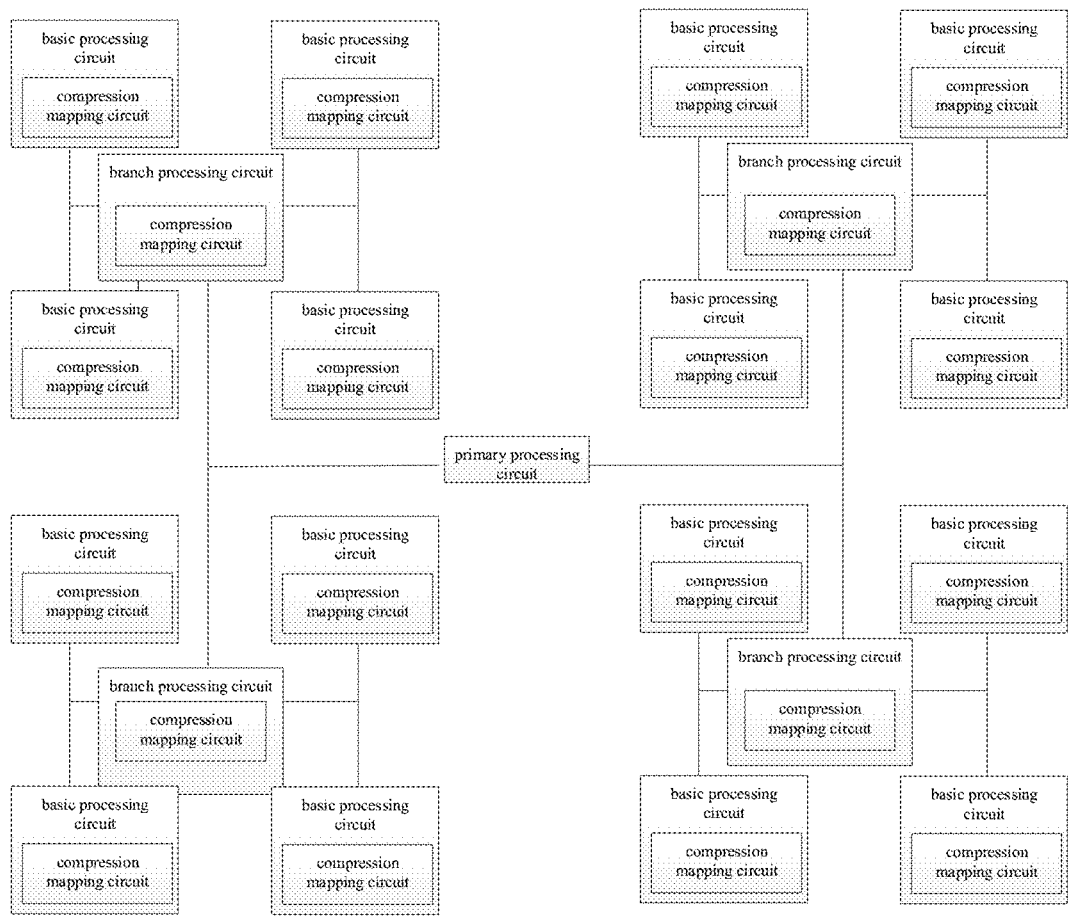
FIG. 1a is a structural diagram of an integrated circuit chip device according to an embodiment of the disclosure.

To facilitate those skilled in the art to understand the present disclosure, technical solutions in the embodiments of the present disclosure will be described clearly and completely hereinafter with reference to the accompanied drawings in the embodiments of the present disclosure. Apparently, the described embodiments are merely some rather than all embodiments of the present disclosure. All other embodiments obtained by those of ordinary skill in the art based on the embodiments of the present disclosure without creative efforts shall fall within the protection scope of the present disclosure.

In the present disclosure, the primary processing circuit may be configured to perform operations of the neural network in series and transmit data to the plurality of basic processing circuits; the k groups of basic processing circuits may be configured to perform operations of the neural network in series according to the data, and transmit the operation result to the primary processing circuit.

In an embodiment, the device may further include k branch circuits. The primary processing circuit may be connected to the k branch circuits respectively, and each branch circuit of the k branch circuits may correspond to one group of basic processing circuits of the k groups of basic processing circuits. The k branch circuits may be configured to forward the data between the primary processing circuit and the k groups of basic processing circuits.

In an optional embodiment, each of the basic processing circuits may include the compression mapping circuit configured to perform compression on each data in the neural network operation. The k groups of basic processing circuits may be specifically configured to control whether to start the compression mapping circuit to perform compression on the transmitted data according to the operation of the data; and the k groups of basic processing circuits may be further configured to perform operations of the neural network in series according to the data or the compressed data, and transmit the operation result to the primary processing circuit.

In an optional embodiment, the primary processing circuit may be configured to obtain data blocks to be computed and an operation instruction, and divide the data blocks to be computed into a data block for distribution and a data block for broadcasting according to the operation instruction; the primary processing circuit may be further configured to split the data block for distribution to obtain a plurality of basic data blocks, distribute the plurality of basic data blocks to circuits connected to the primary processing circuit, and broadcast the data block for broadcasting to circuits connected to the primary processing circuit. The basic processing circuits may be configured to control starting the compression mapping circuit to perform compression on the basic data blocks and the data block for broadcasting according to the operation, then perform an inner product operation to obtain an operation result, and transmit the operation result to the primary processing circuit. The primary processing circuit may be configured to process the operation result to obtain the data blocks to be computed and an instruction result of the operation instruction, where the data blocks to be computed are at least one input neuron and/or one weight to be computed.

In an optional embodiment, the branch circuit may include the compression mapping circuit configured to perform compression on each data in the neural network operation. The primary processing circuit may be configured to perform operations of the neural network in series and transmit the data to the k branch circuits connected to the primary processing circuit. The k branch circuits may be configured to forward the transmitted data between the primary processing circuit and the k groups of basic processing circuits, and control whether to start the compression mapping circuit to perform compression on the transmitted data according to the operation of the data. The k basic processing circuits may be configured to perform operations of the neural network in series according to the transmitted data or the transmitted data after being compressed, and transmit the operation result to the primary processing circuit.

In an optional embodiment, the primary processing circuit may be configured to obtain data blocks to be computed and an operation instruction, and divide the data blocks to be computed into a data block for distribution and a data block for broadcasting according to the operation instruction; the primary processing circuit may be further configured to split the data block for distribution to obtain a plurality of basic data blocks, distribute the plurality of basic data blocks to the k branch circuits connected to the primary processing circuit, and broadcast the data block for broadcasting to the k branch circuits connected to the primary processing circuit. The k branch circuits may be configured to receive the basic data blocks and the data block for broadcasting, start the compression mapping circuit to perform compression on the basic data blocks and the data block for broadcasting, and then forward the compressed basic data blocks and the compressed data block for broadcasting to the k groups of basic processing circuits. The basic processing circuits may be configured to perform the inner product operation on the compressed basic data block and the data block for broadcasting to obtain an operation result, and transmit the operation result to the primary processing circuit. The primary processing circuit may be configured to process the operation result to obtain the data blocks to be computed and an instruction result of the operation instruction; where the data block for distribution and the data block for broadcasting are at least one input neuron and/or one weight.

In an optional embodiment, the primary processing circuit may be specifically configured to broadcast the data block for broadcasting once to the k branch circuits.

In an optional embodiment, the primary processing circuit may be specifically configured to split the data block for broadcasting into a plurality of partial data blocks for broadcasting, and sequentially broadcast the plurality of partial data blocks for broadcasting to the k branch circuits.

In an optional embodiment, the basic processing circuits may be specifically configured to perform an inner product operation on the partial data blocks for broadcasting and the basic data blocks to obtain an inner product operation result, accumulate the inner product operation result to obtain partial operation results, and then transmit the partial operation result to the primary processing circuit.

In an optional embodiment, the basic processing circuits may be specifically configured to reuse the partial data blocks for broadcasting to perform the inner product operation of the partial data blocks for broadcasting and the n basic data blocks to obtain n partial processing results, accumulate the n partial processing results to obtain n partial operation results, and transmit the n partial operation results to the primary processing circuit, where n is an integer greater than or equal to 2.

In an embodiment, the primary processing circuit may include a primary register or a primary on-chip caching circuit. Or the branch circuits may include a basic register or a basic on-chip caching circuit. Or each of the basic processing circuits may include a basic register or a basic on-chip caching circuit.

In an optional embodiment, the primary processing circuit may include one or any combination of a vector computing unit circuit, an arithmetic logic unit circuit, an accumulator circuit, a matrix transposition circuit, a DMA (direct memory access) circuit, a compression mapping circuit, or a data rearrangement circuit.

In an optional embodiment, the data may include one or any combination of a vector, a matrix, a three-dimensional data block, a four-dimensional data block, and an n-dimensional data block.

In an optional embodiment, if the operation instruction is a multiplication instruction, the primary processing circuit determines that a multiplier data block is a data block for broadcasting, and a multiplicand data block is a data block for distribution; if the operation instruction is a convolution instruction, the primary processing circuit determines that an input data block is a data block for broadcasting, and a convolution kernel is a data block for distribution.

In an optional embodiment, the operations of the neural network involved in the present disclosure may include one or any combination of a convolution operation, a matrix multiplying matrix operation, a matrix multiplying vector operation, an offset operation, a full connection operation, a GEMM operation, a GEMV operation, and an activation operation.

FIG. 1a is a structural diagram of an integrated circuit chip device according to an embodiment of the disclosure. As shown in FIG. 1a, the chip device may include a primary processing circuit, basic processing circuits, and branch processing circuits (optional). The integrated circuit chip device may include a primary processing circuit, k branch circuits (as shown in FIG. 1a, k=4; in practical applications, k may also be another value, such as 8, 16 and so on), and k groups of basic processing circuits. The primary processing circuit may be connected to the k branch circuits respectively, and each branch circuit of the k branch circuits may correspond to one group of basic processing circuits of the k groups of basic processing circuits, where a group of basic processing circuits may include at least one basic processing circuit. In practical applications, the compression mapping circuit may be disposed in the basic processing circuits or the branch circuits as shown by the dotted box. The compression mapping circuit may be configured to compress data, which will be described in the following of the present disclosure.

Figure 1B:
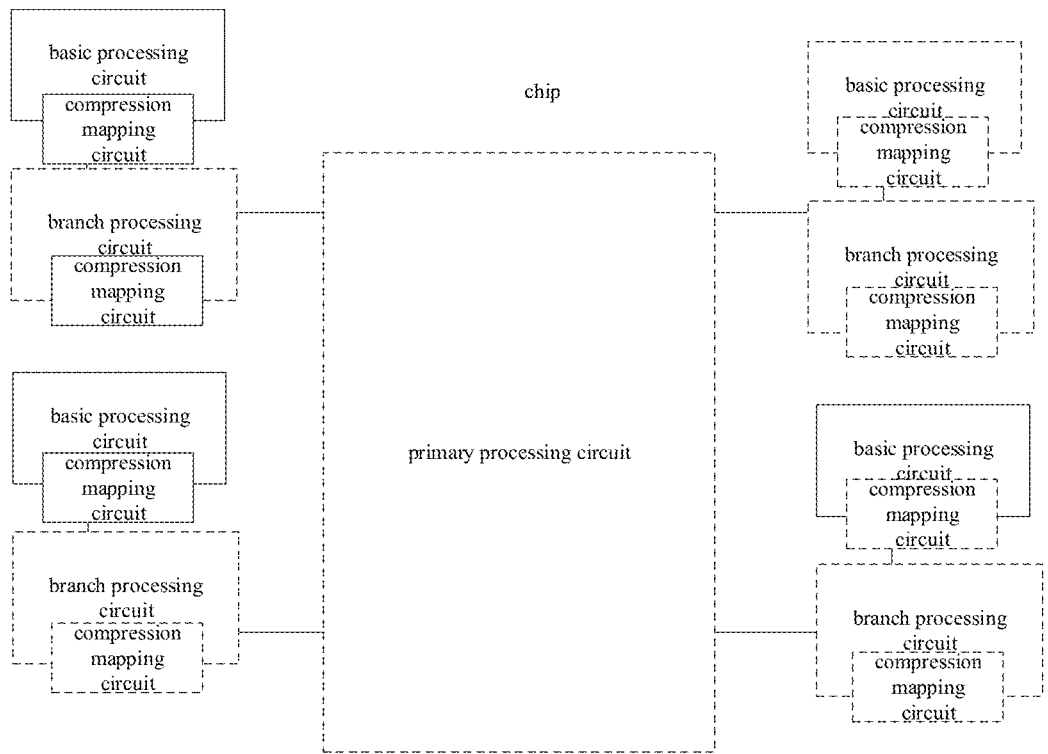
FIG. 1b is a structural diagram of another integrated circuit chip device according to an embodiment of the disclosure.
Figure 1C:
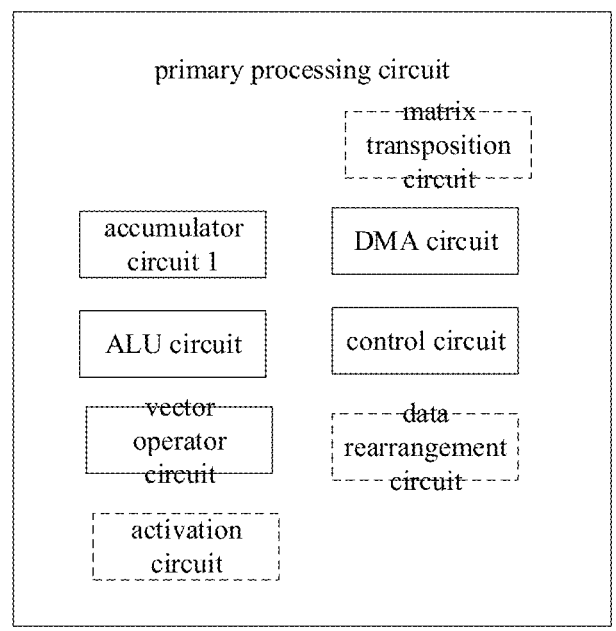
FIG. 1c is a structural diagram of a basic processing circuit according to an embodiment of the disclosure.
Figure 1D:
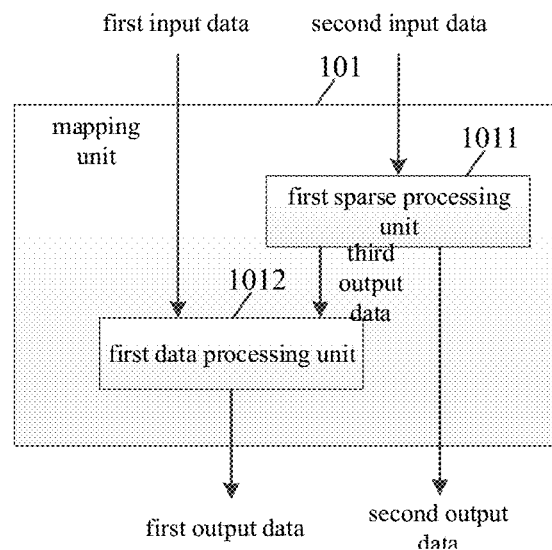
FIG. 1d is a local structural diagram of a compression mapping circuit according to an embodiment of the disclosure.

The primary processing circuit (as shown in FIG. 1d) may include a register and/or an on-chip caching circuit, and the primary processing circuit may further include a control circuit, a vector computing unit circuit, an ALU (arithmetic and logic unit) circuit, an accumulator circuit, a DMA circuit, and the like. In practical applications, the primary processing circuit may further include a transposition circuit (such as a matrix transposition circuit), a data rearrangement circuit, or an activation circuit, or the like.

Optionally, the primary processing circuit may include a compression mapping circuit configured to perform compression on received or transmitted data, for example, data that is 0 or smaller than a preset threshold (such as 0.1) may be removed in practical applications. The preset threshold is customized on the user side or the terminal device side, for example, 0.1, 0.05, and the like. The present disclosure does not limit the specific form of the compression mapping circuit. The compression process will be specifically described below.

The primary processing circuit may further include a data transmitting circuit, a data receiving circuit or an interface, and the data transmitting circuit can integrate a data distributing circuit and a data broadcasting circuit. Of course, in practical applications, the data distributing circuit and the data broadcasting circuit may be set separately; the data transmitting circuit and the data receiving circuit may also be integrated to form a data transmitting and receiving circuit. The primary processing circuit needs to transmit data for broadcasting to each basic processing circuit. The primary processing circuit needs to selectively transmit data for distribution to the some basic processing circuits, and the specific selection manner may be specifically determined by the primary processing circuit according to a load and computation manner. The data for broadcasting may be transmitted to each basic processing circuit by broadcasting (in practical applications, the data for broadcasting may be transmitted to each basic processing circuit by broadcasting one time or any times, the embodiments of the present disclosure do not limit the times of broadcasting). The data for distribution may be selectively transmitted to some basic processing circuits by distributing.

When distributing data, a control circuit of the primary processing circuit transmits data to part or all of the basic processing circuits, where the data may be the same or different. Specifically, if the data is transmitted by distributing, the data received by each basic processing circuit may be different, or the data received by some basic processing circuits may be the same. If the data is transmitted by broadcasting, the control circuit of the primary processing circuit transmits data to part or all of the basic processing circuits, where each basic processing circuit may receive same data.

Optionally, the vector computing unit circuit of the primary processing circuit may perform vector operations, which include but are not limited to addition, subtraction, multiplication and division of two vectors, addition, subtraction, multiplication, and division of a vector and a constant, or arbitrary operations on each element in the vector. The successive operations may specifically include addition, subtraction, multiplication, division, activation, accumulation, and the like of a vector and a constant.

Each basic processing circuit may include a basic register and/or a basic on-chip caching circuit, and each basic processing circuit may further include one or any combination of an inner product computing unit circuit, a vector computing unit circuit, and an accumulator circuit. The inner product computing unit circuit, the vector computing unit circuit, and the accumulator circuit may be integrated circuits. The inner product computing unit circuit, the vector computing unit circuit, and the accumulator circuit may be also set separately.

Optionally, the chip device may further include one or more branch processing circuits. When the chip device has branch processing circuits, the primary processing circuit may be connected to the branch processing circuits, and the branch processing circuits are connected to the basic processing circuits. The inner product computing unit circuits of the basic processing circuits are configured to perform the inner product operation on the data blocks, the control circuit of the primary processing circuit may be configured to control the data receiving circuit or the data transmitting circuit to transmit and receive external data, and control the data transmitting circuit to distribute the external data to the branch processing circuits, and the branch processing circuits are configured to transmit and receive data from the primary processing circuit or the basic processing circuits. The structure shown in FIG. 1a is suitable for the computation of complex data. Because for the primary processing circuit, a count of units connected to the primary processing circuit may be limited, it is necessary to add the branch processing circuits between the primary processing circuit and the basic processing circuits to achieve the access of more basic processing circuits so as to realize the computation of complex data blocks. Connection structures of the branch processing circuits and the basic processing circuit may be arbitrary, and may be not limited to an H-type structure as shown in FIG. 1a. Optionally, the connection structure of the primary processing circuit and the basic processing circuits may be a broadcasting or distribution structure, and the connection structure of the basic processing circuits and the basic processing circuits may be a gather structure. The broadcasting structure, the distribution structure and the gather structure are defined as follows: regarding the broadcasting structure or the distributing structure, when a count of the basic processing circuits is greater than a count of the primary processing circuit, that is, one primary processing circuit corresponds to several basic processing circuits, the structure of the primary processing circuit and the several basic processing circuits is the broadcast or the distribution structure; on the contrary, when the count of the basic processing circuits is no greater than the count of the primary processing circuit, the structure of the several basic processing circuits and the primary processing circuit is the gather structure.

The basic processing circuits may receive the data distributed or broadcast by the primary processing circuit and store the data into an on-chip cache of the basic processing circuits, perform an operation to obtain an operation result, and transmit the data to the primary processing circuit.

The data involved in the basic processing circuits may be the compressed data, and the specific implementation method of compression will be described later.

Optionally, each basic processing circuit may include a compression mapping circuit, or compression mapping circuits may be configured in a part of the basic processing circuits; the compression mapping circuit may be configured to compress the received or transmitted data. The present disclosure does not limit the specific form of the compression mapping circuit.

Optionally, the vector computing unit circuits of the basic processing circuits may perform a vector operation on two compressed vectors. In practical applications, the inner product computing unit circuits of the basic processing circuits may perform an inner product operation on the two compressed vectors, and the accumulator circuit may accumulate a result of the inner product operation.

Optionally, the two vectors may be stored into on-chip caches and/or registers, and the basic processing circuits may extract two vectors to perform the operations as needed for actual computation. The operations include but are not limited to an inner product operation, a multiplication, an addition, or other operations.

Optionally, the results of the inner product operations may be accumulated to the on-chip caches and/or the registers. In this way, the amount of data transferred between the basic processing circuits and the primary processing circuit may be reduced, the operation efficiency may be improved, and the power consumption of data transmission may be reduced.

Optionally, instead of being accumulated, the results of the inner product operations may be transmitted directly, which could reduce the computation amount inside the basic processing circuits and improve the operation efficiency of the basic processing circuits.

Optionally, each basic processing circuit may perform the inner product operation on a plurality of groups of two vectors, and accumulate results of the plurality of groups of inner product operations separately.

Optionally, the plurality of groups of two vectors may be stored into the on-chip caches and/or the registers.

Optionally, the results of the plurality of groups of inner product operations may be accumulated to the on-chip caches and/or the registers separately.

Optionally, instead of being accumulated, the results of the plurality of groups of inner product operations may be transmitted directly.

Optionally, each basic processing circuit may perform the inner product operation on a same vector with the plurality of vectors separately ("one-to-many" inner product operation, that is, one of the two vectors is shared by each group of the plurality of groups of inner product operations), and accumulate inner product results corresponding to each vector separately. By using the technical solution, a same set of weights can perform multiple computations on different input data, which could increase data reusing, reduce data transmission amount of internal data of the basic processing circuits, improve computation efficiency, and reduce power consumption.

Specifically, sources of the data used to compute the inner product, the vector shared by each group, and the other vector of each group (that is, the vector different between each group) may be different.

Optionally, when the inner product is computed, the vector shared by each group may be broadcast or distributed by the primary processing circuit or the branch processing circuits.

Optionally, when the inner product is computed, the vector shared by each group may be from the on-chip caches.

Optionally, when the inner product is computed, the vector shared by each group may be from the registers.

Optionally, when the inner product operation is computed, the vector different between each group may be broadcast or distributed by the primary processing circuit or the branch processing circuits.

Optionally, when the inner product is computed, the vector different between each group may be from the on-chip caches.

Optionally, when the inner product is computed, the vector different between each group may be from the registers.

Optionally, when the inner product operation is performed on the plurality of groups, the vector shared by each group may retain an arbitrary number of copies in the on-chip caches and/the registers of the basic processing circuits.

Optionally, the shared vector may retain one copy corresponding to each group of inner product operation.

Optionally, the shared vector may only retain one copy.

Specifically, the results of the plurality of groups of inner product operations may be accumulated to the on-chip caches and/or the registers respectively.

Specifically, instead of being accumulated, the results of the plurality of groups of inner product operations may be transmitted directly.

Referring to the structure shown in FIG. 1a, the structure includes a primary processing circuit (which may perform vector operation) and a plurality of basic processing circuits (which may perform an inner product operation). The technical effect of this combination is that the device can not only perform matrix and vector multiplication operations using the basic processing circuits, but also perform other arbitrary vector operations using the primary processing circuit, so that more operations can be completed more quickly under the configuration of limited hardware circuits. In this way, times of data transmission between inside and outside of the device can be reduced, the computation efficiency may be improved, and the power consumption may be reduced. In addition, the chip may set the compression mapping circuit in the basic processing circuits and/or the primary processing circuit, so that the amount of data need to be computed can be reduced when the neural network computation is performed. Moreover, the chip can dynamically allocate which circuit to perform data compression according to the computation amount (the amount of load) of each circuit (the circuit mainly includes the primary processing circuit and the basic processing circuit), which can reduce the complexity of the data computation, reduce the power consumption. The dynamic allocation of data compression may not affect the chip computing efficiency. The manner of allocation includes, but is not limited to, load balancing, load minimum allocation, and the like.

The device as shown in FIG. 1b includes a primary processing circuit and basic processing circuits, and optionally includes branch processing circuits. The device shown in FIG. 1b includes a primary processing circuit and N basic processing circuits, where the primary processing circuit (the specific structure is shown in FIG. 1c) can be directly or indirectly connected to the N basic processing circuits. If the primary processing circuit is indirectly connected to the N basic processing circuits, in an optional scheme, the device may include N/4 branch processing circuits as shown in FIG. 1a, and each branch processing circuit is respectively connected to four basic processing circuits. The circuits respectively included in the primary processing circuit and the N basic processing circuits may be referred to FIG. 1a, which is not repeated here. It should be noted that the basic processing circuits may also be disposed in the branch processing circuits. In addition, the count of basic processing circuits connected to each branch processing circuit may not be limited to four, and the manufacturer may configure the count of basic processing circuits according to actual needs. The primary processing circuit and/or the N basic processing circuits may all include the compression mapping circuit. Specifically, the primary processing circuit may include the compression mapping circuit, or the N basic processing circuits or a part of the N basic processing circuits may include the compression mapping circuits, or the primary processing circuit and the N basic processing circuits or a part of the N basic processing circuits all include the compression mapping circuit. The primary processing circuit can dynamically allocate an operating entity for the data compression step according to a neural network computation instruction. Specifically, the primary processing circuit may determine whether to perform data compression on the data according to its own load. Specifically, a value of the load may be set to multiple ranges, and each range corresponds to an execution body of the data compression step. Taking 3 ranges as an example, the load value of an range 1 is low, and the data compression step can be independently performed by the primary processing circuit; the load value of an range 2 is between the range 1 and the range 3, and the data compression step may be performed by the primary processing circuit and the N basic processing circuits; and the load value of an range 3 is high, and the data compression step can be performed by the N basic processing circuits. The above step may be performed in an explicit manner, for example, the primary processing circuit may be configured with a special indication or instruction, and when the basic processing circuits receive the special indication or instruction, it is determined that the data compression step should be performed; or when the basic processing circuits do not receive the special indication or instruction, it is determined that the data compression step should not be performed. The above step may be also performed in an implicit manner, for example, when the basic processing circuits receive sparse data (that is, data includes 0, or the amount of data less than a preset threshold is greater than a preset number) and that an inner product operation needs to be performed, the sparse data should be compressed.

Embodiments of the data compression involved in the present disclosure are described below. It should be noted that the data in the present disclosure may be an input neuron or a weight in a neural network, which may be matrix data or vector data, etc., and the data is not limited herein. In other words, the data or data block described below in the present disclosure may be the input neuron or the weight in the neural network, which may be embodied in the form of a matrix or a vector.

Since the neural network is an algorithm with high computational burden and high memory access, the more weights, the larger amount of computation and memory access. Specially, in the case where the weight is small (for example, the weight is 0, or the weight if less than a set value), in order to increase the computation rate and reduce overhead, it is necessary to compress the data with smaller weights. In practical applications, data compression has the most obvious effect when applied in sparse neural network, such as reducing the workload of data computation, reducing the extra cost of data, and improving the data computation rate.

The present disclosure will take the input data as an example to illustrate the embodiment of data compression performed by the compression mapping circuit. The input data includes, but is not limited to, at least one input neuron and/or at least one weight.

In a first embodiment, the compression mapping circuit may compress both an input neuron and a weight.

After receiving the input data (specifically, the input data is a data blocks to be computed sent by the primary compression circuit), a compression mapping circuit 101 may perform compression on the input data to obtain compressed input data. The input data may include at least one input neuron and at least one weight, and the compressed input data may include the compressed input neuron and the compressed weight.

The input data may include at least one input neuron and at least one weight. The compression mapping circuit 101 may determine whether an absolute value of each of the at least one input neuron is greater than a first threshold. When the absolute value of the input neuron is less than or equal to the first threshold, the compression mapping circuit 101 may delete the input neuron; when the absolute value of the input neuron is greater than the first threshold, the compression mapping circuit 101 may retain the input neuron, and the compression mapping circuit 101 may output deleted input neuron as an input neuron after compression. The compression mapping circuit 101 may obtain connection relation data of the input neuron, and the connection relation data of the input neuron indicates position information of the input neuron whose absolute value is greater than the first threshold in the at least one input neuron. The compression mapping circuit 101 may determine whether the absolute value of each of the at least one weight is greater than a second threshold. When the absolute value of the weight is less than or equal to the second threshold, the compression mapping circuit 101 may delete the weight, select the relevant weight from the deleted weight according to the connection relation data of the input neuron, and output the selected weight as the weight after compression.

In an embodiment, the input data may include at least one input neuron and at least one weight. The compression mapping circuit 101 may determine whether an absolute value of each of the at least one weight is greater than the second threshold. When the absolute value of the weight is less than or equal to the second threshold, the compression mapping circuit 101 may delete the weight; when the absolute value of the weight is greater than the second threshold, the compression mapping circuit 101 may retain the weight, and the compression mapping circuit 101 may output the deleted weight as a weight after compression. The compression mapping circuit 101 may obtain connection relation data of the weight, and the connection relation data of the weight indicates data of the connection relation between the at least one input neuron and the output neuron. The compression mapping circuit 101 may determine whether the absolute value of each of the at least one input neuron is greater than the first threshold. When the absolute value of the input neuron is less than or equal to the first threshold, the compression mapping circuit 101 may delete the input neuron, select the relevant input neuron from the deleted input neuron according to the connection relation data of the weight, and output the selected input neuron as the input neuron after compression.

Further, the compression mapping circuit 101 may store the compressed input neuron and the compressed weight into a storage circuit in a one-to-one format.

Specifically, the manner that the compression mapping circuit 101 stores the compressed input neuron and the compressed weight into the storage circuit in a one-to-one format may be that each of the compressed input neuron and the corresponding compressed weight are taken as a data set, and the data set is stored into the storage circuit.

Specifically, as shown in FIG. 1*d*, the compression mapping circuit 101 includes:

a first sparse processing unit 1011 configured to perform compression on second input data to obtain third output data and second output data, and transmit the third output data to a first data processing unit 1012;

the first data processing unit 1012 configured to receive first input data and the third output data, and output the first output data according to the third output data and the first input data.

When the first input data includes at least an input neuron, and the second input data includes at least a weight, then the first output data is a compressed input neuron, the second output data is a compressed weight, and the third output data is connection relation data of the weight. When the first input data includes at least a weight, and the second input data includes at least an input neuron, then the first output data is a compressed weight, the second output data is a compressed input neuron, and the third output data is connection relation data of the input neuron.

Specifically, when the second input data is a weight, and the weight is in the form of wij, the wij represents a weight between the $i^{th}$ input neuron and the $j^{th}$ output neuron. The first sparse processing unit 1011 determines connection relation data (that is, the third output data) according to the weight, and deletes the weights whose absolute values are less than or equal to a second threshold to obtain the compressed weights (that is, the second output data). When the second input data is an input neuron, the first sparse processing unit 1011 determines the connection relation data according to the input neuron, and deletes the input neurons whose absolute values are less than or equal to a first threshold to obtain the compressed input neurons.

Optionally, the first threshold may be 0.1, 0.08, 0.05, 0.02, 0.01, 0 or other values. The second threshold may be 0.1, 0.08, 0.06, 0.05, 0.02, 0.01, 0 or other values. The first threshold and the second threshold may or may be the same or different.

The connection relation data may be represented in the form of a stride index or a direct index.

Specifically, the connection relation data represented by the direct index form is a string composed of 0 and 1. When the second input data is a weight, 0 indicates that an absolute value of the weight is less than or equal to the second threshold, that is, an input neuron corresponding to the weight is not connected to an output neuron corresponding to the weight, and 1 indicates that an absolute value of the weight is greater than the second threshold, that is, the input neuron corresponding to the weight is connected to the output neuron corresponding to the weight. The connection relation data represented by the direct index form has two representation orders: a string of 0 and 1 composed of the connection states of each output neuron and all input neurons may be used to represent the connection relation data of the weight; or a string of 0 and 1 composed of the connection states of each input neuron and all output neurons may be used to represent the connection relation data of the weight. When the second input data is the input neuron, 0 represents that the absolute value of the input neuron is less than or equal to the first threshold, and 1 represents that the absolute value of the input neuron is greater than the first threshold.

It should be understood that the connection relation data can also be represented in the form of a vector/matrix, where 0 represents that the data of input neuron/weight corresponding to the position is 0 or less than the first threshold; accordingly, 1 represents that the data of input neuron/weight corresponding to the position is not 0 or greater than the first threshold, which is not limited by the present disclosure. Optionally, the connection relation data can also be called a mask matrix/a mask vector.

When the second input data is the weight, the connection relation data represented in the form of the stride index is a string composed of a distance value between the input neuron connected to the output neuron and the previous input neuron connected to the output neuron. When the second input data is the input neuron, the data represented in the form of the stride index is represented by a string composed of a distance value between the input neuron whose current absolute value is greater than the first threshold and the previous input neuron whose absolute value is greater than the first threshold.

Figure 1E:
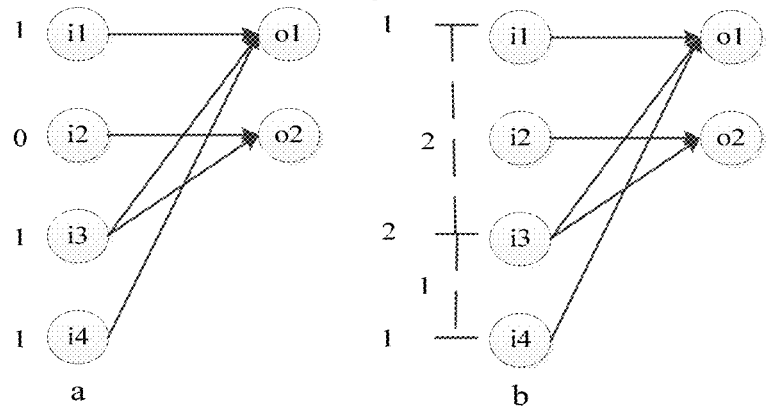
FIG. 1e is a structural diagram of a neural network according to an embodiment of the disclosure.

For example, if the first threshold and the second threshold are both 0.01, please refer to FIG. 1e, which is a structural diagram of a neural network according to an embodiment of the disclosure. As shown in figure a in the FIG. 1e, the first input data is the input neuron, which may include input neuron i1, i2, i3 and i4, and the second input data is the weight. For output neuron o1, the weights are w11, w21, w31 and w41; for output neuron o2, the weights are w12, w22, w32 and w42, where the weights w21, w12 and w42 have a value of 0, and the absolute values of the weights w21, w12 and w42 are less than the first threshold 0.01. The first sparse processing unit 1011 may determine that the input neuron i2 is not connected to the output neuron o1, the input neurons i1 and i4 are not connected to the output neuron o2, the input neurons i1, i3 and i4 are connected to the output neuron o1, and the input neurons i2 and i3 are connected to the output neuron o2. The connection relation data is represented by the connection states of each output neuron and all the input neurons, so that the connection relation data of the output neuron o1 is "1011", and the connection relation data of the output neuron o2 is "0110" (that is, the connection relation data is "10110110"). The connection relation data is represented by the connection states of each input neuron and all the output neurons, so that the connection relation data of the input neuron i1 is "10", the connection relation data of the input neuron i2 is "01", the connection relation data of the input neuron i3 is "11", and the connection relation data of the input neuron i4 is "10" (that is, the connection relation data is "10011110").

For the output neuron o1, the compression mapping circuit 101 takes the i1 and w11, i3 and w31, and i4 and w41 as a data set respectively, and stores the data set into the storage circuit. For the output neuron o2, the compression mapping circuit 101 takes the i2 and w22, i3 and w32 as a data set respectively, and stores the data set into the storage circuit.

For the output neuron o1, the second output data is w11, w31 and w41; and for the output neuron o2, the second output data is w22 and w32.

When the second input data is the input neurons i1, i2, i3, and i4, and the values of the input neurons i1, i2, i3, and i4 are 1, 0, 3, 5, the connection relation data (that is, the third output data) is "1011", and the second output data is 1, 3, and 5.

As shown in figure b in the FIG. 1e, the first input data includes input neurons i1, i2, i3, and i4, and the second input data is a weight. For the output neuron o1, the weights are w11, w21, w31 and w41; for the output neuron o2, the weights are w12, w22, w32 and w42, where the weights w21, w12 and w42 have a value of 0. The sparse processing unit 1011 may determine that the input neurons i1, i3, and i4 are connected to the output neuron o1, and the input neurons i2 and i3 are connected to the output neuron o2. The connection relation data of the output neuron o1 and the input neuron is "021", where the first number "0" of the connection relation data indicates that the distance between the first input neuron connected to the output neuron o1 and the first input neuron is 0, that is, the first input neuron connected to the output neuron o1 is the input neuron i1; the second number "2" of the connection relation data indicates that the distance between the second input neuron connected to the output neuron o1 and the first input neuron connected to the output neuron o1 (that is, the input neuron i1) is 2, that is, the second input neuron connected to the output neuron o1 is the input neuron i3; and the third number "1" of the connection relation data indicates that the distance between the third input neuron connected to the output neuron o1 and the second input neuron connected to the output neuron o1 is 1, that is, the third input neuron connected to the output neuron o1 is the input neuron i4.

The connection relation data of the output neuron o2 and the input neuron is "11", where the first number "1" of the connection relation data indicates that the distance between the first input neuron connected to the output neuron o2 and the first input neuron (that is, the input neuron i1) is 1, that is, the first input neuron connected to the output neuron o2 is the input neuron i2; and the second number "1" of the connection relation data indicates that the distance between the second input neuron connected to the output neuron o2 and the first input neuron connected to the output neuron o2 is 1, that is, the second input neuron connected to the output neuron o2 is the input neuron i3.

For the output neuron o1, the compression mapping circuit 101 takes the i1 and w11, i3 and w31, and i4 and w41 as a data set respectively, and stores the data set into the storage circuit. For the output neuron o2, the compression mapping circuit 101 takes the i2 and w22, i3 and w32 as a data set respectively, and stores the data set into the storage circuit.

For the output neuron o1, the second output data is w11, w31 and w41; and for the output neuron o2, the second output data is w22 and w32.

When the second input data is the input neurons i1, i2, i3, and i4, and the values of the input neurons i1, i2, i3, and i4 are 1, 0, 3, 5, the connection relation data (that is, the third output data) is "021", and the second output data is 1, 3, and 5.

When the first input data is the input neuron, the second input data is the weight, and the third output data is the connection relation data between the output neuron and the input neuron. After receiving the input neuron, the first data processing unit 1012 deletes the input neuron whose absolute value is less than or equal to the second threshold, selects the relevant input neuron associated with the weight from the deleted input neuron according to the connection relation data, and outputs the selected input neuron as first output data.

For example, assuming that the first threshold is 0, the input neurons are i1, i2, i3, and i4, and the values of i1, i2, i3, and i4 are 1, 0, 3, and 5 respectively. For the output neuron o1, the third output data (that is, the connection relation data) is "021", and the second output data is w11, w31 and w41. The first data processing unit 1012 deletes the input neurons with the value of 0 in the input neurons i1, i2, i3 and i4, and then the input neurons i1, i3 and i4 may be obtained. The first data processing unit 1012 determines that the input neurons i1, i3, and i4 are all connected to the output neurons according to the third output data "021", so the data processing unit 1012 outputs the input neurons i1, i3, and i4 as the first output data, that is, 1, 3, and 5 are output.

When the first input data is the weight and the second input data is the input neuron, the third output data is the connection relation data of the input neuron. After receiving the weights w11, w21, w31, and w41, the first data processing unit 1012 deletes the weight whose absolute value is smaller than the first threshold, selects the relevant weight associated with the input neuron from the deleted weight according to the connection relation data, and outputs the selected weight as the first output data.

For example, assuming that the second threshold is 0, the weights are w11, w21, w31, and w41, and the values of w11, w21, w31, and w41 are 1, 0, 3, and 4 respectively. For the output neuron o1, the third output data (that is, the connection relation data) is "1011", and the second output data is i1, i3 and i5. The first data processing unit 1012 deletes the weights with the value of 0 in the weights w11, w21, w31, and w41, and then the weights w11, w21, w31 and w41 may be obtained. The first data processing unit 1012 determines that the value of the input neuron i2 in the input neurons i1, i2, i3, and i4 is 0 according to the third output data "1011", so that the first data processing unit 1012 outputs the input neurons 1, 3 and 4 as the first output data.

In an optional embodiment, third input data and fourth input data are at least one weight and at least one input neuron respectively. The compression mapping circuit 101 determines the position of the input neuron whose absolute value is greater than the first threshold of the at least one input neuron, and obtains the connection relation data of the input neuron; and the compression mapping circuit 101 determines the position of the weight whose absolute value is greater than the first threshold of the at least one weight, and obtains the connection relation data of the weight. The compression mapping circuit 101 obtains new connection relation data according to the connection relation data of the weight and the connection relation data of the input neuron, where the connection relation data represents the relationship between the input neuron whose absolute value is greater than the first threshold of the at least one input neuron and the output neuron, and the connection relation data also represents the value of weight corresponding to the input neuron. The compression mapping circuit 101 obtains the compressed input neuron and the compressed weight according to the new connection relation data, the at least one input neuron, and the at least one weight.

Further, the compression mapping circuit 101 may store the compressed input neuron and the compressed weight into a storage circuit in a one-to-one format.

Specifically, the manner that the compression mapping circuit 101 stores the compressed input neuron and the compressed weight into the storage circuit in a one-to-one format may be that each of the compressed input neuron and the corresponding compressed weight are taken as a data set, and the data set is stored into the storage circuit.

For the case where the compression mapping circuit 101 includes the first sparse processing unit 1011 and the first data processing unit 1012, the sparse processing unit 1011 in the compression mapping circuit 101 performs sparse compression on the input neuron or weight, which could reduce the count of the weight or the input neuron, thereby reducing the times of operations performed by the operation unit, and improving the efficiency of the operation.

Figure 1F:
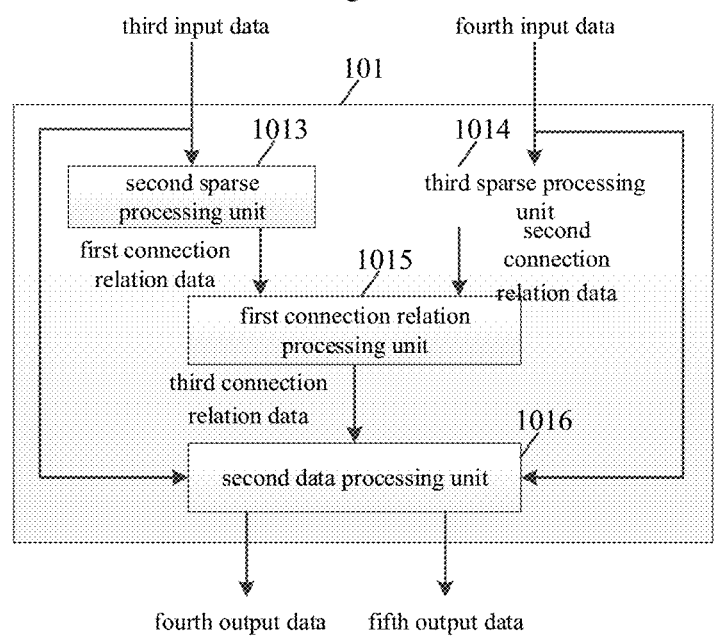
FIG. 1f is a local structural diagram of another compression mapping circuit according to an embodiment of the disclosure.

Specifically, as shown in FIG. 1*f*, the compression mapping circuit 101 may include:

a second sparse processing unit 1013 configured to receive third input data, obtain first connection relation data according to the third input data, and transmit the first connection relation data to a connection relation processing unit 1015;

a third sparse processing unit 1014 configured to receive fourth input data, obtain second connection relation data according to the fourth input data, and transmit the second connection relation data to the connection relation processing unit 1015;

the connection relation processing unit 1015 configured to obtain third connection relation data according to the first connection relation data and the second connection relation data, and transmit the third connection relation data to a second data processing unit 1016; and the second data processing unit 1016 configured to compress the third input data and the fourth input data according to the third connection relation data after receiving the third input data, the fourth input data and the third connection relation data, so as to obtain fourth output data and fifth output data.

When the third input data includes at least one input neuron, and the fourth input data includes at least one weight, the first connection relation data is connection relation data of the input neuron, the second connection relation data is connection relation data of the weight, the fourth output data is the compressed input neuron, and the fifth output data is the compressed weight. When the third input data includes at least one weight, and the fourth input data includes at least one input neuron, the first connection relation data is connection relation data of the weight, the second connection relation data is connection relation data of the input neuron, the fourth output data is the compressed weight, and the fifth output data is the compressed input neuron.

When the third input data includes at least one input neuron, the first connection relation data is a string indicating a position of an input neuron whose absolute value is greater than the first threshold among the at least one input neuron. When the third input data includes at least one weight, the first connection relation data is a string indicating whether the input neuron is connected to the output neuron.

When the fourth input data includes at least one input neuron, the second connection relation data is a string indicating a position of an input neuron whose absolute value is greater than the first threshold among the at least one input neuron. When the fourth input data includes at least one weight, the second connection relation data is a string indicating whether the input neuron is connected to the output neuron.

It should be noted that the first connection relation data, the second connection relation data, and the third connection relation data may be represented in the form of a stride index or a direct index. For details, please refer to the above related description.

In other words, the connection relation processing unit 1015 may perform compression on the first connection relation data and the second connection relation data to obtain the third connection relation data. The third connection relation data may be represented in the form of a direct index or a stride index.

Specifically, when the first connection relation data and the second connection relation data are both represented in the form of the direct index, the connection relation processing unit 1015 may perform an AND operation on the first connection relation data and the second connection relation data, so as to obtain the third connection relation data, where the third connection relation data is represented in the form of the direct index.

It should be noted that the strings representing the first connection relation data and the second connection relation data are stored in order of height of memory physical addresses, either in order of highest to lowest or in order of lowest to highest.

When the first connection relation data and the second connection data are represented in the form of the stride index, and the strings representing the first connection relation data and the second connection relation data are stored in order of lowest to highest, the connection relation processing unit 1015 accumulates each element in the string of the first connection relation data and elements whose memory physical addresses are lower than the memory physical address of the element, and the obtained new element constitutes the fourth connection relation data. Similarly, the connection relation processing unit 1015 performs the same compression on the string of the second connection relation data to obtain the fifth connection relation data. Then, the connection relation processing unit 1015 selects the same elements from the string of the fourth connection relation data and the string of the fifth connection relation data, and sorts the elements in order of smallest to largest to form a new string. The connection relation processing unit 1015 subtracts an adjacent element whose value is smaller than that of the minuend element from each element in the new string to obtain a new element. In this way, corresponding operation may be performed on each element in the new string to obtain third connection relation data.

For example, assuming that the first connection relation data and the second connection relation data are represented in the form of the stride index, the string of the first connection relation data is "01111", and the string of the second connection relation data is "022", the connection relation processing unit 1015 adds each element in the string of the first connection relation data to the adjacent previous element to obtain the fourth connection relation data "01234"; similarly, the connection relation processing unit 1015 performs the same compression on the string of the second connection relation data to obtain the fifth connection relation data "024". The connection relation processing unit 1015 selects the same elements from the fourth connection relation data "01234" and the fifth connection relation data "024" to obtain a new string "024". The connection relation processing unit 1015 subtracts the adjacent previous element from each element in the new string, that is, 0, (2-0), (4-2), to obtain third connection data "022".

When any one of the first connection relation data and the second connection relation data is represented in the form of the stride index and the other is represented in the form of the direct index, the connection relation processing unit 1015 converts the connection relation data represented in the form of the stride index into the connection relation data represented in the form of the direct index or converts the connection relation data represented in the form of the direct index into the connection relation data represented in the form of the stride index. Then, the connection relation processing unit 1015 performs compression in accordance with the above method to obtain the third connection relation data (that is, the fifth output data).

Optionally, when the first connection relation data and the second connection relation data are both represented in the form of the direct index, the connection relation processing unit 1015 converts the first connection relation data and the second connection relation data into the connection relation data in the form of the stride index. And then, the connection relation processing unit 1015 performs compression on the first connection relation data and the second connection relation data according to the above method to obtain the third connection relation data.

Specifically, the third input data may be an input neuron or a weight, the fourth input data may be an input neuron or a weight, and the third input data and the fourth input data are inconsistent. The second data processing unit 1016 selects data related to the third connection relation data from the third input data (that is, input neurons or weights) as the fourth output data according to the third connection relation data; the second data processing unit 1016 selects data related to the third connection relation data from the fourth input data as the fifth output data according to the third connection relation data.

Further, the second data processing unit 1016 takes the compressed input neurons and the corresponding compressed weights as a data set, and stores the data set into the storage circuit.

For example, assuming that the third input data includes the input neurons i1, i2, i3, and i4, the fourth input data includes the weights w11, w21, w31, and w41, and the third connection relation data is represented in the form of the direct index, that is, "1010", then the fourth output data output by the second data processing unit 1016 is the input neuron i1 and i3, and the output fifth output data is the weight w11 and w31. The second data processing unit 1016 takes the input neuron i1 and the weight w11, and the input neuron i3 and the weight w31 as a data set respectively, and stores the two data sets into the storage circuit.

For the case where the compression mapping circuit 101 includes the second sparse processing unit 1013, the third sparse processing unit 1014, the connection relation processing unit 1015, and the second data processing unit 1016, the sparse processing unit in the compression mapping circuit 101 performs sparse compression on the input neuron and the weight, so that the count of input neuron and weight could be further reduced, thereby the computation amount of the operation unit could be reduced and the operation efficiency could be improved.

Optionally, before the compression mapping circuit 101 performs compression on the input data, the compression mapping circuit 101 may be further configured to:

group the at least one input neuron to obtain M groups of input neurons, where the M is an integer greater than or equal to 1;

determine whether each group of input neurons of the M groups of input neurons meets a first preset condition, where the first preset condition includes that in a group of input neurons, the count of input neurons whose absolute values are less than or equal to a third threshold is less than or equal to a fourth threshold;

delete the group of input neurons when any one of the M groups of input neurons does not meet the first preset condition;

group the at least one weight to obtain N groups of weights, where the N is an integer greater than or equal to 1;

determine whether each group of weights of the N groups of weights meets a second preset condition, where the second preset condition includes that the count of weights whose absolute values are less than or equal to a fifth threshold in a group of weights is less than or equal to a sixth threshold; and delete the group of weights when any one of the N groups of weights does not meet the second preset condition.

Optionally, the third threshold may be 0.5, 0.2, 0.1, 0.05, 0.025, 0.0, 0 or other values. The fourth threshold is related to the count of input neurons in a group of input neurons. Optionally, the fourth threshold=the count of input neurons in a group of input neurons−1, or the fourth threshold may be other values. Optionally, the fifth threshold may be 0.5, 0.2, 0.1, 0.05, 0.025, 0.01, 0 or other values. The sixth threshold is related to the count of weights in a group of weights. Optionally, the sixth threshold=the count of weights in a group of weights−1, or the sixth threshold may be other values.

It should be noted that the third threshold and the fifth threshold may be the same or different, and the fourth threshold and the sixth threshold may be the same or different. Optionally, the storage circuit may be configured to store the compressed input neuron, the compressed weight, and related operation instructions.

Figure 1G:
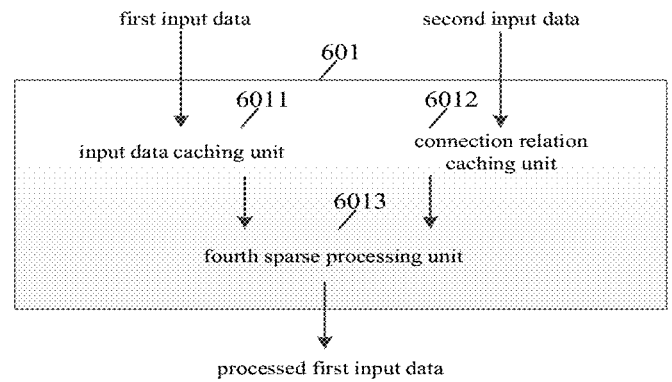
FIG. 1g is a local structural diagram of another compression mapping circuit according to an embodiment of the disclosure.

In an optional embodiment, the compression mapping circuit as shown in FIG. 1g may compress the input data by using the connection relation data of the input data in the case where the connection relation data of the input data is known. The input data may include at least one input neuron or at least one weight. Specifically, as shown in FIG. 1g, a compression mapping circuit 601 may include:

an input data caching unit 6011 configured to cache first input data, where the first input data may include at least one input neuron or at least one weight; and a connection relation caching unit 6012 configured to cache connection relation data of the first input data, that is, the connection relation data of the input neuron or the connection relation data of the weight.

The connection relation data of the input neuron is a string indicating whether the absolute value of the input neuron is less than or equal to the first threshold. The connection relation data of the weight is a string indicating whether the absolute value of the weight is less than or equal to the first threshold, or a string indicating whether the input neuron corresponding to the weight is connected to the output neuron corresponding to the weight. The connection relation data of the input neuron and the connection relation data of the weight may be represented in the form of a direct index or a stride index.

It should be noted that the descriptions of the direct index and the stride index may refer to the related description of the embodiment as shown in FIG. 1b.

The compression mapping circuit 601 may further include a fourth sparse processing unit 6013 configured to perform compression on the first input data according to the connection relation data of the first input data to obtain compressed first input data, and store the compressed first input data into a first input caching unit 605.

When the first input data is at least one input neuron, the fourth sparse processing unit 6013 compresses and processes one input neuron and connection relation data in one clock cycle, that is, the fourth sparse processing unit 6013 selects a valid input neuron from S1 input neurons in one clock cycle, where S1 is an integer greater than 1.

In one embodiment, the fourth sparse processing unit 6013 compresses and processes a plurality of input neurons and a plurality of connection relation data in one clock cycle, that is, the fourth sparse processing unit 6013 selects S2 valid input data from S1 input neurons in one clock cycle, where S2 is an integer greater than 0 and less than or equal to the S1.

Figure 1H:
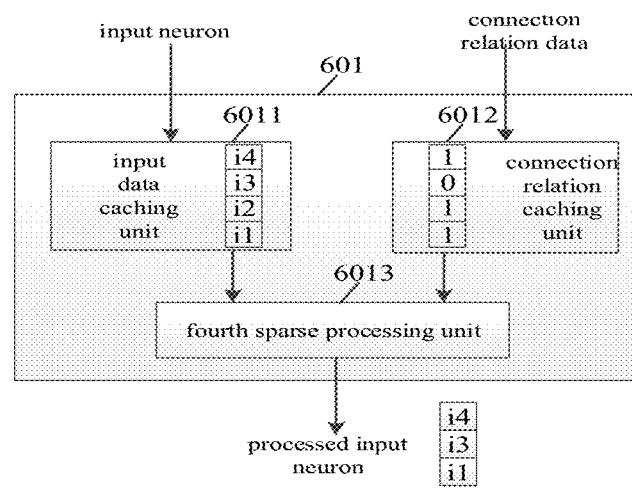
FIG. 1h is a local structural diagram of another compression mapping circuit according to an embodiment of the disclosure.

For example, as shown in FIG. 1h, the input neurons are i1, i2, i3 and i4, and the connection relation data represented in the form of direct index is "1011". Moreover, the fourth sparse processing unit 6013 may select a connected (that is, valid) input neuron from four input neurons in one clock cycle. After acquiring the input neurons i1, i2, i3, and i4 and the connection relation data "1011" from the input data caching unit 6011 and the connection relation caching unit 6012 respectively, the fourth sparse processing unit 6013 may select connected input neurons i1, i3 and i4 from the input neurons i1, i2, i3 and i4 according to the connection relation data "1011". As shown in FIG. 1h, since the fourth sparse processing unit 6013 can select a connected (that is, valid) input neuron from four input neurons in one clock cycle, the fourth sparse processing unit 6013 may sequentially output the input neurons i1, i3 and i4 in three clock cycles. The fourth sparse processing unit 6013 may store the input neurons i1, i3 and i4 into the first input caching unit.

Figure 1I:
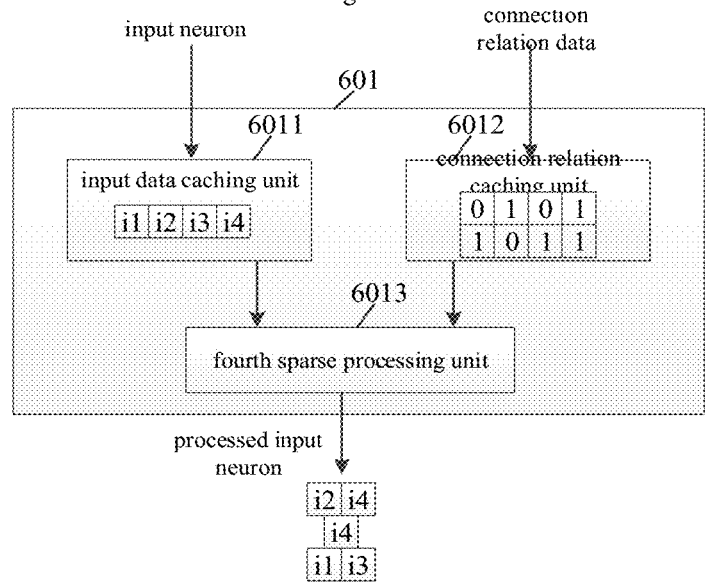
FIG. 1i is a local structural diagram of another compression mapping circuit according to an embodiment of the disclosure.

For another example, as shown in FIG. 1i, the input neurons are i1, i2, i3, and i4, and the connection relation data represented in the form of direct index has two groups "1011" and "0101". The fourth sparse processing unit 6013 may select two connected (that is, valid) input neurons from the four input neurons in one clock cycle. The fourth sparse processing unit 6013 may select connected input neurons i1, i3 and i4 from the input neurons i1, i2, i3 and i4 according to the connection relation data "1011", and select connected input neurons i2 and i4 from the input neurons i1, i2, i3 and i4 according to the connection relation data "0101". Since the fourth sparse processing unit 6013 can select two connected (that, valid) input neurons from four input neurons in one clock cycle, for the connection relation data connection "1011", the fourth sparse processing unit 6013 may select the input neurons i1 and i3 from the input neurons i1, i2, i3, and i4 in a first clock cycle, and store the input neurons i1 and i3 into the first input caching unit 606; the fourth sparse processing unit 6013 may further select the input neuron i4 from the input neurons i1, i2, and i4 in a second clock cycle, and store the input neuron i4 into the first input caching unit 606. Moreover, as shown in FIG. 1i, for the connection relation data connection "0101", the fourth sparse processing unit 6013 may select the input neurons i2 and i4 from the input neurons i2 and i4 in one clock cycle, and then store the input neurons i2 and i4 into the first input caching unit.

Figure 1J:
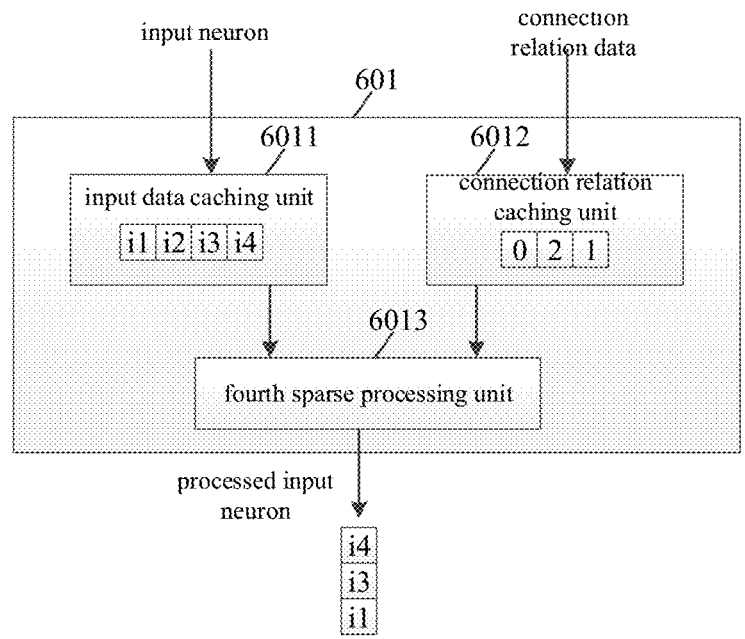
FIG. 1j is a local structural diagram of another compression mapping circuit according to an embodiment of the disclosure.

For example, as shown in FIG. 1j, the input data is input neurons i1, i2, i3, and i4, connection relation data represented in the form of a stride index is "021", and the fourth sparse processing unit 6013 may select a connected (that is, valid) input neuron from four input neurons in one clock cycle.

After acquiring the input neurons i1, i2, i3, and i4 and the connection relation data "021" from the input data caching unit 6011 and the connection relation caching unit 6012 respectively, the fourth sparse processing unit 6013 may select connected input neurons i1, i3 and i4 from the input neurons i1, i2, i3 and i4 according to the connection relation data "1011". As shown in FIG. 1*j*, since the fourth sparse processing unit 6013 can select a connected (that is, valid) input neuron from four input neurons in one clock cycle, the fourth sparse processing unit 6013 may sequentially output the input neurons i1, i3 and i4 in three clock cycles. The fourth sparse processing unit 6013 may store the input neurons i1, i3 and i4 into the first input caching unit.

Figure 1K:
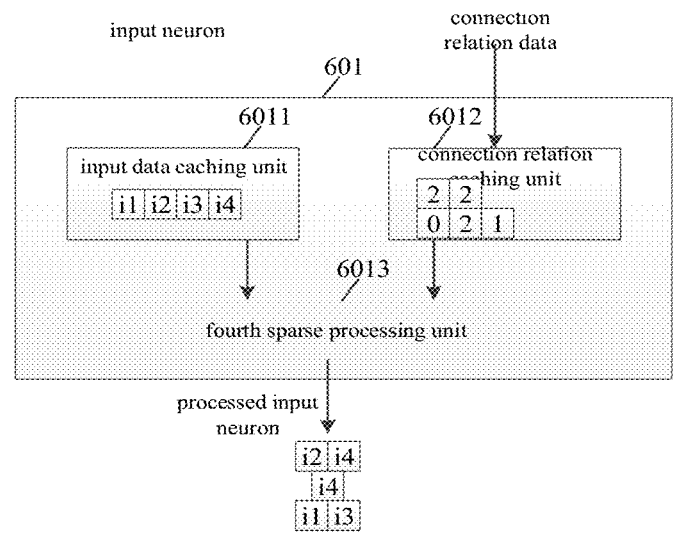
FIG. 1k is a local structural diagram of another compression mapping circuit according to an embodiment of the disclosure.

For another example, as shown in FIG. 1*k*, the input data is input neurons i1, i2, i3, and i4, and the connection relation data represented in the form of a stride index has two groups "021" and "22". The fourth sparse processing unit 6013 may select two connected (that is, valid) input neurons from the four input neurons in one clock cycle. The fourth sparse processing unit 6013 may select connected input neurons i1, i3 and i4 from the input neurons i1, i2, i3 and i4 according to the connection relation data "021", and select connected input neurons i2 and i4 from the input neurons i1, i2, i3 and i4 according to the connection relation data "22". Since the fourth sparse processing unit 6013 can select two connected (that is, valid) input neurons from four input neurons in one clock cycle, for the connection relation data connection "021", the fourth sparse processing unit 6013 may select the input neurons i1 and i3 in a first clock cycle, and store the input neurons i1 and i3 into the first input caching unit 606; the fourth sparse processing unit 6013 may further select the input neuron i4 in a second clock cycle, and store the input neuron i4 into the first input caching unit 606. Moreover, as shown in FIG. 1*k*, for the connection relation data connection "22", the fourth sparse processing unit 6013 may select the input neurons i2 and i4 in one clock cycle and then output the i2 and i4, and then store the input neurons i2 and i4 into the first input caching unit.

In one embodiment, the first input data cached by the input data caching unit 6011 may include at least one weight. When the data cached by the connection relation caching unit 6012 is the connection relation data of the weight, and the absolute value of the at least one weight is greater than the first threshold, the fourth sparse processing unit 6013 may set the value of the weight between the input neuron and the output neuron that is not connected to the input neuron to 0 according to the connection relation data of the weight, and store the weight whose value is 0 and the at least one weight into a second input caching unit.

For example, the weight is in the form of wij, where the wij represents a weight between the $i^{th}$ input neuron and the $j^{th}$ output neuron. It is assumed that the input neurons include i1, i2, i3 and i4, the output neurons include o1, the first input data (weight) is w11, w31, and w41, and the connection data of the first input data 1011 (that is, the connection relation data of the weight) is represented in the form of a direct index, then the fourth sparse processing unit 6013 may determine, based on the second input data, that there is no connection between the input neuron i2 and the output neuron o1; the fourth sparse processing unit 6013 may further set the value of the weight w21 between the input neuron i2 and the output neuron o1 to 0, and store w11, w21 (0), w31, w41 into the second input caching unit.

The first input caching unit may be configured to cache the compressed input neuron. The second input caching unit may be configured to cache the compressed weight read from the storage circuit.

In an optional embodiment, when the first input data is at least one weight, the fourth sparse processing unit 6013 may compress a weight and a connection relation data in one clock cycle, that is, the fourth sparse processing unit 6013 may select a valid weight from S3 weights in one clock cycle, where the S3 is an integer greater than 1.

Optionally, the fourth sparse processing unit 6013 may compress and process a plurality of weights and a plurality of connection relation data in one clock cycle, that is, the fourth sparse processing unit 6013 may select S4 valid weights from S3 weights in one clock cycle, where S4 is an integer greater than 0 and less than or equal to the S3.

The first input caching unit may be configured to cache the compressed weight. The second input caching unit may be configured to cache the compressed input neuron read from the storage circuit.

It should be noted that related descriptions may be referred to the above embodiments, which is not repeated herein.

Optionally, before performing compression on the first input data, the compression mapping circuit 601 may be further configured to: group the at least one input neuron to obtain M groups of input neurons, where the M is an integer greater than or equal to 1; determine whether each group of input neurons of the M groups of input neurons meets a first preset condition, where the first preset condition includes that the count of input neurons whose absolute values are less than or equal to a third threshold in a group of input neurons is less than or equal to a fourth threshold; delete the group of input neurons when any one of the M groups of input neurons does not meet the first preset condition; group the at least one weight to obtain N groups of weights, where the N is an integer greater than or equal to 1; determine whether each group of weights of the N groups of weights meets a second preset condition, where the second preset condition includes that the count of weights whose absolute values are less than or equal to a fifth threshold in a group of weights is less than or equal to a sixth threshold; delete the group of weights when any one of the N groups of weights does not meet the second preset condition.

It should be noted that related descriptions may be referred to the above embodiments, which is not repeated herein. The first threshold, the second threshold, the third threshold, the fourth threshold, the fifth threshold, and the sixth threshold may all be stored into the storage circuit or a first output caching unit; some threshold of the first threshold, the second threshold, the third threshold, the fourth threshold, the fifth threshold, and the sixth threshold are stored into the storage circuit, and the some threshold is stored into the first output caching unit. The first input caching unit, the second input caching unit and the output caching unit may be a functional unit in the compression mapping circuit or the primary processing circuit, or a functional unit shared by other processing circuits, which is not limited by the present disclosure.

In an optional embodiment, the connection relation data of the input neuron and the connection relation data of the weight are composed of a string/a matrix represented by 0 or 1, where 0 means that the absolute value of the input neuron/the weight is less than or equal to the first threshold, and 1 means that the absolute value of the input neuron/the weight is greater than the first threshold, which is independent of the output neuron. For example, the input data is matrix S $$\begin{bmatrix} 3 & 0 \\ 0 & 2 \end{bmatrix},$$

assuming the first threshold is 0, then the corresponding connection relation data is $$\begin{bmatrix} 1 & 0 \\ 0 & 1 \end{bmatrix}.$$

In this embodiment, the connection relation data (that is, the connection relation data of the neuron/weight) may also be referred to as a mask matrix.

In addition to being represented in the form of a direct index and a stride index, the connection relation data of the weight and/or the connection relation data of the neuron in the present disclosure may be also represented by the following cases: List of Lists (LIL), Coordinate list (COO), Compressed Sparse Row (CSR), Compressed Sparse Column (CSC), ELL Pack (ELL), Hybrid (HYB), etc., and the present disclosure does not limit the representation form.

In addition, the input neurons mentioned in the present disclosure are not the neurons in an input layer of the entire neural network; instead, for any two adjacent layers of neurons in the network, the neurons in a lower layer of the feed-forward operation of the network are input neurons. The output neurons mentioned in the present disclosure are not the neurons in an output layer of the entire neural network, but for any two adjacent layers of neurons in the network, the neurons in an upper layer of the feed-forward operation of the network are output neurons. Taking a convolution neural network as an example, assuming that a convolution neural network has L layers, K=1, 2, 3 . . . L−1, for a $K^{th}$ layer and a $K+1^{th}$ layer, the $K^{th}$ layer may be defined as the input layer, where the neurons in the $K^{th}$ layer are the input neurons, and $K+1^{th}$ layer may be defined as the output layer, where the neurons in the $K^{th}$ layer are the output neurons. That is, except for a top layer, each layer can be defined as an input layer, and the next layer is the corresponding output layer.

The following embodiment provides a computation method implemented by a device as shown in FIG. 1a, and the computation method may include a computation method of a neural network, such as a forward operation of a neural network, a training of a neural network. In practical applications, the forward operation may perform a matrix multiplying matrix operation, a convolution operation, an activation operation, a transformation operation, and the like according to different input data, and the above operations all can be implemented by the device as shown in FIG. 1a.

The control circuit of the primary processing circuit may transmit data to the basic processing circuits through the branch processing circuits, where the branch processing circuits may compress the data firstly through the compression mapping circuit and then forward the data to the basic processing circuits. For example, the compression circuit of the branch processing circuits may compress the data and then transmit the compressed data to the basic processing circuits, which could reduce the data amount of the transmitted data, and reduce the total count of transmitted bits, therefore the basic processing circuits can also perform data operation with higher efficiency and lower power consumption.

If the data received by the branch processing circuits is sparse data, the branch processing circuits can compute the data after the compression mapping circuit compresses the sparse data. For example, when the branch processing circuits receive the sparse data transmitted from the primary processing circuit, the compression mapping circuit may compress the sparse data and then transmit the data to the inner product computing unit circuit, the vector computing unit circuit or the accumulator circuit of the basic processing circuits to perform operation on the compressed data, so as to improve the operation efficiency and reduce the power consumption.

The primary processing circuit may transmit the data to be computed to all or part of the basic processing circuits. Taking a computation of matrix multiplying vector as an example, the control circuit of the primary processing circuit may split matrix data into columns, where each column may be taken as basic data. For example, m*n may be split into n vectors with m rows, and then the control circuit of the primary processing circuit may distribute the split n vectors with m rows to a plurality of basic processing circuits. For vectors, the control circuitry of the primary processing circuit may broadcast the vector as a whole to each basic processing circuit. If a value of m is relatively large, the control circuit may split the m*n matrix into x*n vectors firstly. For example, x=2, the matrix may be split into 2n vectors, where each vector includes m/2 rows, that is, each of the n vectors with m rows may be equally divided into 2 vectors; taking a first row as an example, if a first vector of the n vectors with m rows has 1000 rows, then the above step that each of the n vectors with m rows may be equally divided into 2 vectors may be: first 500 rows form into a first vector, and last 500 rows form into a second vector, and then the control circuit can broadcast the 2 vectors to a plurality of basic processing circuits by broadcasting twice.

The manner of data transmission may be broadcasting or distribution, or any other possible manner of transmission.

After receiving the data, the basic processing circuits may perform operation to obtain an operation result. And then, the basic processing circuits may transmit the result back to the primary processing circuit, where the operation result may be an intermediate operation result or a final operation result.

The device as shown in FIG. 1a is adopted to complete an operation of matrix multiplying vector (the operation of matrix multiplying vector may be an inner product operation of each row in the matrix with the vector, and the results may be arranged into a vector in an order of corresponding rows).

A multiplication of a matrix S with M rows and L columns and a vector P with length being L is described below, where each row in the matrix S has the same length as the vector P does, and the data in matrix S corresponds to the data in vector P one-to-one based on position. As shown in FIG. 2a, a neural network computing device has K basic processing circuits.

Figure 2:
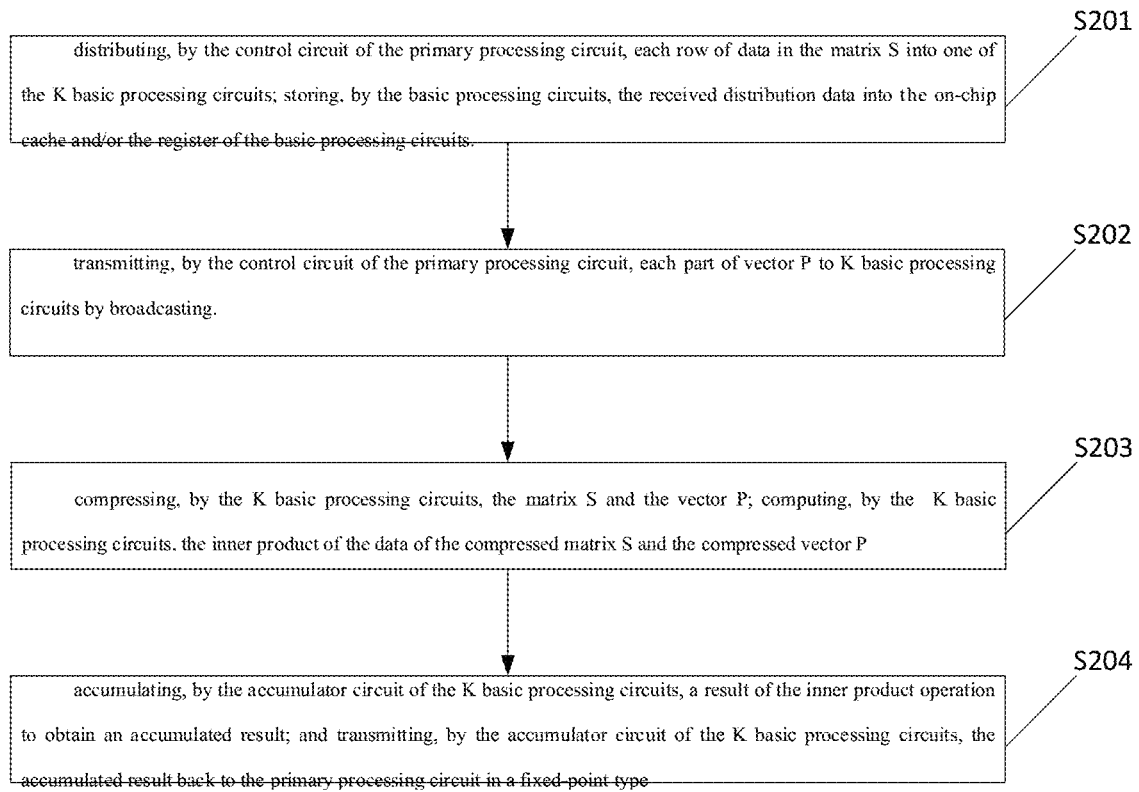
FIG. 2 is a flowchart of a matrix multiplied by a vector according to an embodiment of the disclosure.
Figure 2A:
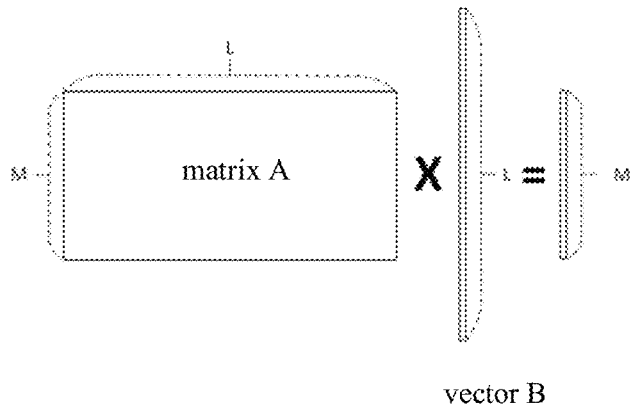
FIG. 2a is a diagram of matrix multiplied by vector according to an embodiment of the disclosure.

FIG. 2 provides a method for implementing matrix multiplying vector, which may specifically include:

step S201, distributing, by the control circuit of the primary processing circuit, each row of data in the matrix S into one of the K basic processing circuits; storing, by the basic processing circuits, the received distribution data into an on-chip cache and/or a register of the basic processing circuits.

In an optional embodiment, when the device includes branch circuits, the branch circuits include the compression mapping circuit. The control circuit of the primary processing circuit compresses each row of data in the input matrix S with M rows and L columns through the branch processing circuits and distributes the compressed data to one of the K basic processing circuits, and the basic processing circuits store the received distribution data into the on-chip cache and/or register of the basic processing circuits.

Specifically, the branch processing circuits can receive an input matrix S1 with M1 rows and L1 columns distributed by the primary processing circuit, where M1 is less than or equal to M, L1 is less than or equal to L, and S1 is a part of S, that is, the data block for distribution described above. Further, the compression mapping circuit of the branch processing circuits may compress each row of data of the input matrix S1 with M1 rows and L1 columns to obtain a compressed matrix S2 with M2 rows and L2 columns, and then forward the compressed matrix S2 to the basic processing circuits, where M is greater than or equal to M1, M is greater than or equal to M2, L is greater than or equal to L1, and L is greater than or equal to L2.

For example, the compression mapping circuit may delete the data whose value is a specified value (such as 0) and/or the data less than a preset threshold (such as 0.1) in the input matrix S2 and matrix P2. In practical applications, deletion may be implemented according to the corresponding mask matrix of matrix S2 and matrix P2, for example, when the data in the mask matrix is 0, its corresponding data in the matrix S2/P at the same position may be deleted. Specific descriptions may be referred to the above embodiments of data compression, which are not repeated herein. It should be understood that the matrix S and the matrix P herein may also be correspondingly understood as the input neuron (also referred to as input neuron matrix) and the weight (also referred to as weight matrix) in the foregoing embodiments.

In an optional embodiment, M is the count of rows of the matrix S, if M<=K, the control circuit of the primary processing circuit may respectively distribute one row of data of the matrix S to the K basic processing circuits.

In an optional embodiment, M is the count of rows of the matrix S, if M>K, the control circuit of the primary processing circuit may respectively distribute one or more rows of data of the matrix S to each basic processing circuit.

A set of rows in S distributed to the $i^{th}$ basic processing circuit is Ai, and there are Mi rows in total. The FIG. 2c illustrates the computation to be performed in the $i^{th}$ basic processing circuit.

In an optional embodiment, in each basic processing circuit, for example, the $i^{th}$ basic processing circuit, the received distribution data such as matrix Ai can be stored into a register and/or on-chip cache of the $i^{th}$ basic processing circuit, which could reduce the data transmission amount of the distributed data, improve the computation efficiency, and reduce the power consumption.

The method for implementing matrix multiplying vector may further include:

step S202, transmitting, by the control circuit of the primary processing circuit, each part of vector P to K basic processing circuits by broadcasting.

In an optional embodiment, when the device includes branch circuits, the branch circuits include the compression mapping circuit. The control circuit of the primary processing circuit compresses each part of the input vector P with length being L by corresponding branch processing circuits in a broadcast manner, and then transmits the compressed each part of the input vector P with length being L to the K basic processing circuits.

Specifically, the branch processing circuits can receive an input vector P1 with length being L1 distributed by the primary processing circuit, where L1 is less than or equal to L, P1 is a part of P, that is, the data block for broadcasting described above. Further, the compression mapping circuit of the branch processing circuits may compress the data of the input vector P1 with length being L1 to obtain a compressed vector P2 with L2 columns, and then forward the compressed vector P2 to the basic processing circuits, where L2 is less than or equal to L1 and less than or equal to L.

In an optional embodiment, the control circuit of the primary processing circuit can broadcast each part of the vector P only once to the register or the on-chip cache of each basic processing circuit, and the $i^{th}$ basic processing circuit fully reuses the data of the vector P obtained this time to complete the corresponding inner product operation of each row in the matrix Ai, which could reduce the amount of data transmitted repeatedly from the primary processing circuit to the basic processing circuits, improve the execution efficiency, and reduce the transmission power.

In an optional embodiment, the control circuit of the primary processing circuit can sequentially broadcast each part of the vector P to the register or the on-chip cache of each basic processing circuit, and the $i^{th}$ basic processing circuit does not reuse the data of the vector P obtained each time, instead, the $i^{th}$ basic processing circuit completes the corresponding inner product operation on each row in the matrix Ai by several times, which could reduce the amount of data of the vector P transmitted inside the basic processing circuits each time, reduce the capacity of the basic processing circuit cache and/or the register, improve the execution efficiency, reduce the transmission power consumption, and reduce the cost.

In an optional embodiment, the control circuit of the primary processing circuit can sequentially broadcast each part of the vector P to the register or the on-chip cache of each basic processing circuit, and the $i^{th}$ basic processing circuit reuses part of the data of the vector P obtained each time to complete the corresponding inner product operation with each row in the matrix Ai, which could reduce the amount of data transmitted from the primary processing circuit to the basic processing circuits, reduce the amount of data transmitted inside the basic processing circuits, improve the execution efficiency, and reduce the transmission power.

The method for implementing matrix multiplying vector may further include:

step S203, computing, by the inner product computing unit circuit of each of the K basic processing circuits, the inner product of the data of the matrix S and the vector P, for example, computing, by the $i^{th}$ basic processing circuit, the inner product of the data of the matrix Ai and the vector P.

In an optional embodiment, when the compression mapping circuit in the device is disposed in the basic processing circuits, after the basic processing circuits receive the matrix S and the vector P transmitted by the primary processing circuit, the basic processing circuit may firstly compress the matrix S and the vector P by using the compression mapping circuit in the basic processing circuits, and then compute the inner product of compressed data of the matrix S and the vector P by using the inner product computing unit circuit.

Specifically, the compression mapping circuit may compress the input matrix S with M1 rows and L1 columns to obtain a compressed matrix S with M rows and L columns. For example, the compression mapping circuit may delete the data whose value is a specified value (such as 0) and/or the data less than a preset threshold (such as 0.1) in the input matrix S and matrix P. In practical applications, deletion may be implemented according to the corresponding mask matrices of matrix S and matrix P, for example, when the data in the mask matrix is 0, its corresponding data in the matrix S/P at the same position may be deleted. For the specific descriptions of data compression, please refer to the above embodiments, which are not repeated herein. It should be understood that the matrix S and the matrix P herein may also be correspondingly understood as the input neuron (also referred to as input neuron matrix) and the weight (also referred to as weight matrix) in the foregoing embodiments.

The method for implementing matrix multiplying vector may further include:

step S204, accumulating, by the accumulator circuit of the K basic processing circuits, a result of the inner product operation to obtain an accumulated result; and transmitting, by the accumulator circuit of the K basic processing circuits, the accumulated result back to the primary processing circuit in a fixed-point type.

In an optional embodiment, a partial sum (the some sum is a part of the accumulated result, for example, the accumulated result is: F1*G1+F2*G2+F3*G3+F4*G4+F5*G5, then the some sum can be the value of: F1*G1+F2*G2+F3*G3) of each inner product operation performed by the basic processing circuits may be transmitted back to the primary processing circuit for accumulation, which could reduce the amount of computation inside the basic processing circuits and improve the operation efficiency of the basic processing circuits.

In an optional embodiment, a partial sum of each inner product operation performed by the basic processing circuits may be stored in the register and/or on-chip cache of the basic processing circuits, and be transmitted into the primary processing circuit after being accumulated, which could reduce the amount of data transferred between the basic processing circuits and the primary processing circuit, improve the operation efficiency, and reduce the data transmission power consumption.

In an optional embodiment, in some cases, a partial sum of each inner product operation performed by the basic processing circuits may be stored into the register and/or on-chip cache of the basic processing circuits for accumulation; in some cases, a partial sum of each inner product operation performed by the basic processing circuits may be transmitted to the primary processing circuit for accumulation. After being accumulated, the some sum may be transmitted back the primary processing circuit. In this way, the amount of data transferred between the basic processing circuits and the primary processing circuit may be reduced, the operation efficiency may be improved, the data transmission power consumption may be reduced, the operation amount inside the basic processing circuit may be reduced, and the operation efficiency of the basic processing circuits may be improved.

Figure 2B:
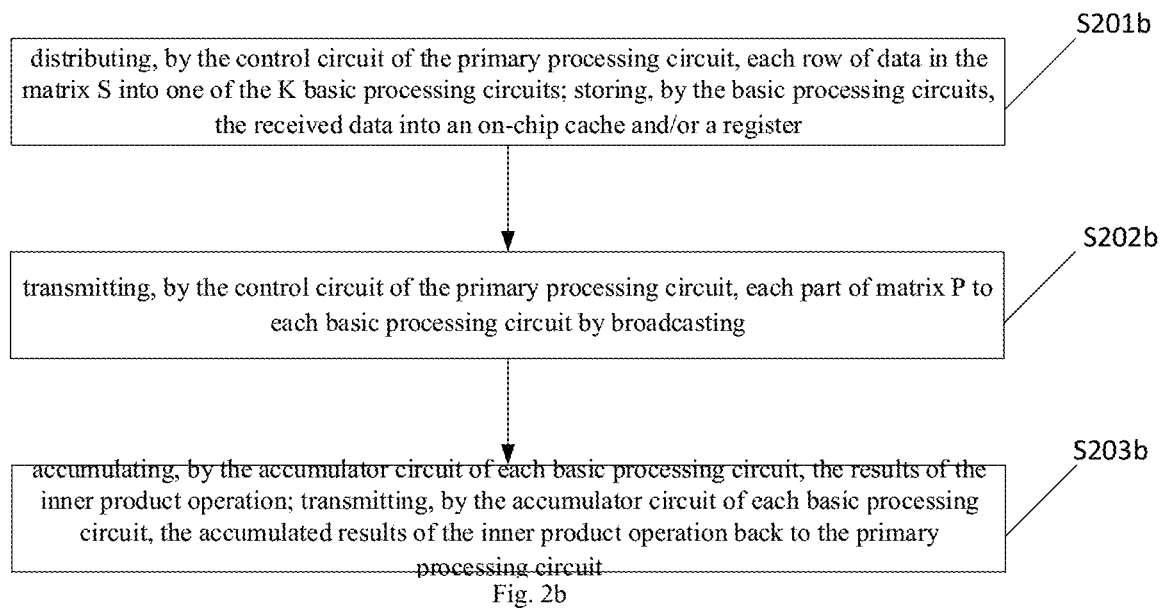
FIG. 2b is a flowchart of matrix multiplied by matrix according to an embodiment of the disclosure.
Figure 2C:
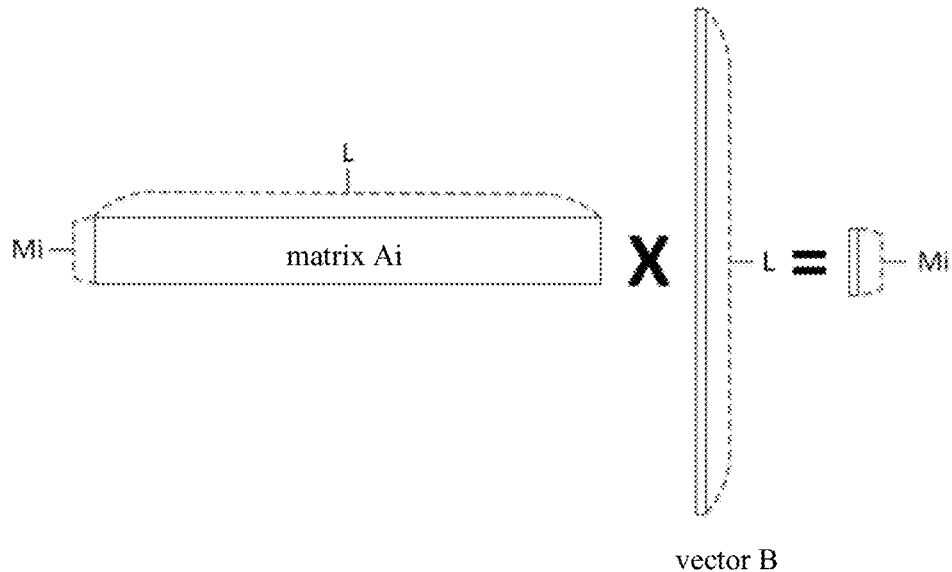
FIG. 2c is a diagram of matrix Ai multiplied by vector B according to an embodiment of the disclosure.

Referring to FIG. 2b, the device as shown in FIG. 1a may be adopted to perform an operation of matrix multiplying matrix.

Figure 2D:
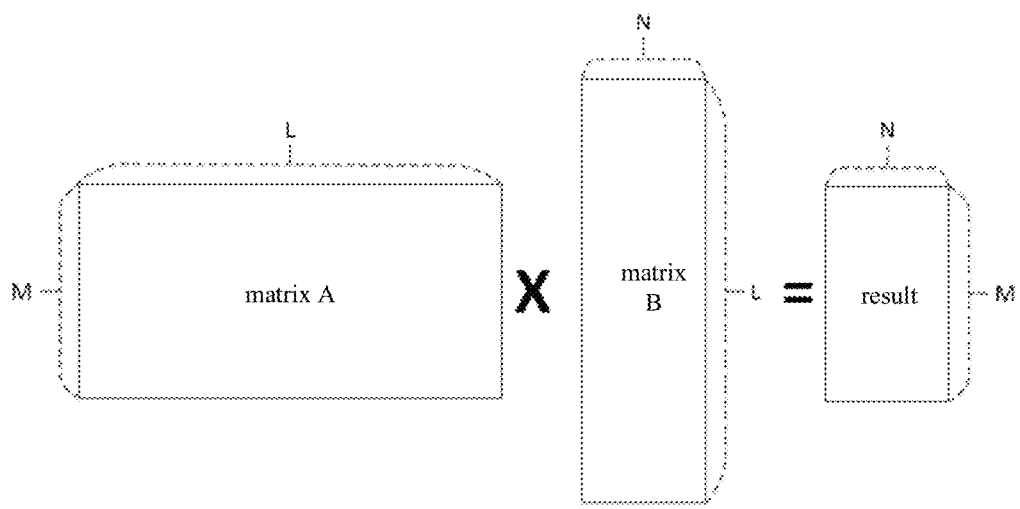
FIG. 2d is a diagram of matrix A multiplied by matrix B according to an embodiment of the disclosure.

A multiplication of matrix S with M rows and L columns and matrix P with L rows and N columns is described below. As shown in FIG. 2d, each row in matrix S has the same length as each column in matrix P does. A neural network computing device has K basic processing circuits.

The method for implementing matrix multiplying vector may further include:

step S201b, distributing, by the control circuit of the primary processing circuit, each row of data in the matrix S into one of the K basic processing circuits; storing, by the basic processing circuits, the data into an on-chip cache and/or a register.

In an optional embodiment, the compression mapping circuit is set in the branch processing circuits, and the control circuit of the primary processing circuit compresses each row of data of the matrix S through the branch processing circuits and then distributes the data to one of the K basic processing circuits. The basic processing circuits store the data in the on-chip cache and/or the register.

Specifically, the control circuit of the primary processing circuit compresses each row of data of the input matrix S with M rows and L columns through the branch processing circuits and distributes the compressed data to one of the K basic processing circuits. Correspondingly, the branch processing circuits can receive the input matrix S1 with M1 rows and L1 columns distributed by the primary processing circuit, where M1 is less than or equal to M, and L1 is less than or equal to L. Further, the compression mapping circuit of the branch processing circuits compresses each row of data of the input matrix S1 with M1 rows and L1 columns to obtain a compressed matrix S2 with M2 rows and L2 columns, and then forwards the compressed matrix S2 to the corresponding basic processing circuits, where M is greater than or equal to M1 and greater than or equal to M2, L is greater than or equal to L1 and greater than or equal to L2.

For example, the compression mapping circuit may delete the data whose value is a specified value (such as 0) and/or the data less than a preset threshold (such as 0.1) in the input matrix S2 and matrix P2. In practical applications, deletion may be implemented according to the corresponding mask matrix of matrix S2 and matrix P2, for example, when the data in the mask matrix is 0, its corresponding data in the matrix S2/P2 at the same position may be deleted. Specific descriptions may be referred to the above embodiments of data compression, which are not repeated herein. It should be understood that the matrix S and the matrix P herein may also be correspondingly understood as the input neuron (also referred to as input neuron matrix) and the weight (also referred to as weight matrix) in the foregoing embodiments.

In an optional embodiment, M is the count of rows of the matrix S, if M<=K, the control circuit of the primary processing circuit may respectively distribute one row of data of the matrix S to the M basic processing circuits.

In an optional embodiment, M is the count of rows of the matrix S, if M>K, the control circuit of the primary processing circuit may respectively distribute one or more rows of data of the matrix S to each basic processing circuit.

Figure 2E:
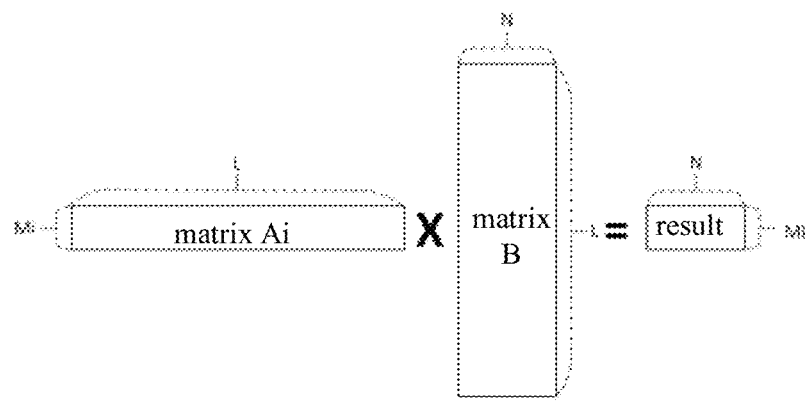
FIG. 2e is a diagram of matrix Ai multiplied by matrix B according to an embodiment of the disclosure.

A set of rows in S distributed to the $i^{th}$ basic processing circuit is Ai, and there are Mi rows in total. The FIG. 2e represents the computation to be performed in the $i^{th}$ basic processing circuit.

In an optional embodiment, in each basic processing circuit, for example, the $i^{th}$ basic processing circuit, the received matrix Ai distributed by the primary processing circuit can be stored into a register and/or an on-chip cache of the $i^{th}$ basic processing circuit, which could reduce the transmission amount of the data, improve the computation efficiency, and reduce the power consumption.

The method for implementing matrix multiplying vector may further include:

step S202b, transmitting, by the control circuit of the primary processing circuit, each part of matrix P to each basic processing circuit by broadcasting.

In an optional embodiment, the compression mapping circuit is set in the branch processing circuits, and the control circuit of the primary processing circuit compresses each part of the matrix P by the branch processing circuits in a broadcasting manner, and then transmits the compressed each part of the matrix P to each basic processing circuit.

Specifically, the branch processing circuits can receive an input vector P1 with length being L1 distributed by the primary processing circuit, where L1 is less than or equal to L, P1 is a part of P, that is, the data block for broadcasting described above. Further, the compression mapping circuit of the branch processing circuits may compress the data of the input vector P1 with length L1 to obtain a compressed vector P2 with L2 columns, and then forward the compressed vector P2 to the basic processing circuits, where L2 is less than or equal to L1 and less than or equal to L.

In an optional embodiment, the control circuit of the primary processing circuit can broadcast each part of the matrix P only once to the register or the on-chip cache of each basic processing circuit, and the $i^{th}$ basic processing circuit fully reuses the data of the matrix P obtained this time to complete the corresponding inner product operation with each row in the matrix Ai. The reusing in this embodiment specifically refers to the basic processing circuits are used repeatedly in computation, for example, the reusing of the data of the matrix P may be referred to the data of matrix P is used multiple times.

In an optional embodiment, the control circuit of the primary processing circuit can sequentially broadcast each part of the matrix P to the register or the on-chip cache of each basic processing circuit, and the $i^{th}$ basic processing circuit does not reuse the data of the matrix P obtained each time, instead, the $i^{th}$ basic processing circuit completes the corresponding inner product operation of each row in the matrix Ai by several times.

In an optional embodiment, the control circuit of the primary processing circuit can sequentially broadcast each part of the matrix P to the register or the on-chip cache of each basic processing circuit, and the $i^{th}$ basic processing circuit reuses part of the data of the vector P obtained each time to complete the corresponding inner product operation with each row in the matrix Ai.

In an optional embodiment, each basic processing circuit, for example, the $i^{th}$ basic processing circuit completes the inner product operation of the data of matrix Ai and the data of matrix P.

The method for implementing matrix multiplying vector may further include:

step S203b, accumulating, by the accumulator circuit of each basic processing circuit, the results of the inner product operation; transmitting, by the accumulator circuit of each basic processing circuit, the accumulated results of the inner product operation back to the primary processing circuit.

In an optional embodiment, the compression mapping circuit is set in the basic processing circuits. After the basic processing circuits compresses the matrix S and the matrix P, an inner product of the data of the compressed matrix S and the data of the compressed vector P obtained by using the inner product computing unit circuit may be the result of the inner product operation.

Specifically, the compression mapping circuit compresses the input matrix S with M1 rows and L1 columns and the input matrix P with L1 rows and N1 columns to obtain the compressed matrix S with M rows and L columns and the compressed matrix P with L rows and N columns. Further, the computing unit of the basic processing units can perform an inner product operation on the compressed matrix S and matrix P to obtain a structure of inner product operation. For example, the compression mapping circuit deletes the data whose value is a specified value (such as 0) and/or the data less than a preset threshold (such as 0.1) in the input matrix S and matrix P. In practical applications, deletion may be implemented according to the corresponding mask matrix of matrix S and matrix P, for example, when the data in the mask matrix is 0, its corresponding data in the matrix S/P at the same position may be deleted. Specific descriptions may be referred to the above embodiments of data compression, which are not repeated herein. It should be understood that the matrix S and the matrix P herein may also be correspondingly understood as the input neuron (also referred to as input neuron matrix) and the weight (also referred to as weight matrix) in the foregoing embodiments.

In an optional embodiment, the basic processing circuits can transmit a partial sum of each inner product operation back to the primary processing circuit for accumulation.

In an optional embodiment, a partial sum of each inner product operation performed by the basic processing circuits may be stored in the register and/or on-chip cache of the basic processing circuits, and be transmitted back to the primary processing circuit after being accumulated.

In an optional embodiment, in some cases, a partial sum of each inner product operation performed by the basic processing circuits may be stored into the register and/or on-chip cache of the basic processing circuits for accumulation; in some cases, a partial sum of each inner product operation performed by the basic processing circuits may be transmitted to the primary processing circuit for accumulation. After being accumulated, the some sum may be transmitted back the primary processing circuit.

Referring to FIG. 3a, a full connection operation is completed by using the device as shown in FIG. 1a.

If input data of a full connection layer is a vector (that is, the input of the neural network is a single sample), then a weight matrix of the full connection layer is taken as the matrix S, and an input vector is taken as the vector P, in this way, a multiplication of the matrix and the vector as shown in FIG. 2 could be performed according to a method of use of the device.

If the input data of the full connection layer is a matrix (that is, the input of the neural network is multiple samples as batch), then a weight matrix of the full connection layer is taken as the matrix S, an input vector is taken as the matrix P, or a weight matrix of the full connection layer is taken as the matrix P, an input vector is taken as a matrix S, in this way, a multiplication of the matrix and the matrix as shown in FIG. 2c could be performed according to a method of use of the device.

Referring to FIG. 3b, a convolution operation is completed by using the device as shown in FIG. 1a.

For a convolution layer, a count of convolution kernels is denoted as M.

The method for implementing matrix multiplying vector may further include:

step S301, distributing, by the control circuit of the primary processing circuit, the weight of each convolution kernel of the weights of the convolution layer to one of the K basic processing circuits; storing, by the control circuit of the primary processing circuit, the weight of each convolution kernel to the on-chip cache and/or the register of the basic processing circuits.

In an optional embodiment, the branch processing circuits include the compression mapping circuit, and the control circuit of the primary processing circuit compresses the weight of each convolution kernel in the convolution layer weight by the branch processing circuits and distributes the weight of each convolution kernel to one of the K basic processing circuits, then the compressed weight of each convolution kernel is stored in the on-chip cache and/or the register of the basic processing circuits.

Specifically, after receiving the weight of each convolution kernel of the weights in the convolution layer transmitted by the primary processing circuit, the branch processing circuits may use the compression mapping circuit of the branch processing circuits to compress the weight of each convolution kernel of the weights in the convolution layer to obtain a compressed weight of each convolution kernel of the weights in the convolution layer, and then transfer the compressed weight of each convolution kernel of the weights in the convolution layer to the basic processing circuits for operation. For the compression of data, please refer to the related description in the foregoing embodiment, which is not described herein again.

In an optional embodiment, M is the count of rows of the matrix S, if M<=K, the control circuit of the primary processing circuit may respectively distribute a weight of a convolution kernel to the M basic processing circuits.

In an optional embodiment, M is the count of rows of the matrix S, if M>K, the control circuit of the primary processing circuit may respectively distribute the weight of one or more convolution kernels to each basic processing circuit.

A total of Mi convolution kernels are distributed to the $i^{th}$ basic processing circuit, and a set of the weight of the convolution kernels is called Ai.

In an optional embodiment, in each basic processing circuit, for example, the $i^{th}$ basic processing circuit, the received Ai distributed by the primary processing circuit is stored in the register and/or the on-chip cache of the basic processing circuits.

The method for implementing matrix multiplying vector may further include:

step S302, transmitting, by the control circuit of the primary processing circuit, each part of the input data P to each basic processing circuit in a broadcasting manner.

In an optional embodiment, if the branch processing circuits include the compression mapping circuit, the control circuit of the primary processing circuit compresses each part of the input data P through the corresponding branch processing circuits and distributes each compressed part of the input data P to each basic processing circuit, which is not described herein again.

In an optional embodiment, the control circuit of the primary processing circuit can broadcast each part of the input data P only once to the register or the on-chip cache of each basic processing circuit, and the $i^{th}$ basic processing circuit fully reuses the data of the input data P obtained this time to complete the corresponding inner product operation with each convolution kernel in the Ai.

In an optional embodiment, the control circuit of the primary processing circuit can sequentially broadcast each part of the input data P to the register or the on-chip cache of each basic processing circuit, and the $i^{th}$ basic processing circuit does not reuse the data of the input data P obtained each time, instead, the $i^{th}$ basic processing circuit completes the corresponding inner product operation of each convolution kernel in the Ai by several times.

In an optional embodiment, the control circuit of the primary processing circuit can sequentially broadcast each part of the input data P to the register or the on-chip cache of each basic processing circuit, and the $i^{th}$ basic processing circuit reuses part of the data of the input data P obtained each time to complete the corresponding inner product operation with each convolution kernel in the Ai.

The method for implementing matrix multiplying vector may further include:

step S303, computing, by each basic processing circuit, the inner product of the convolution kernel and the input data P, for example, computing, by the $i^{th}$ basic processing circuit, the inner product of each convolution kernel in the Ai and the input data P.

In an optional embodiment, when each of the basic processing circuits includes a compression mapping circuit, after the basic processing circuits receive the convolution kernel and the input data P transmitted by the primary processing circuit, the basic processing circuit may firstly compress the convolution kernel and the input data P by using the compression mapping circuit in the basic processing circuits, and then compute the inner product of the compressed convolution kernel and the input data P by using the inner product computing unit circuit. For example, the $i^{th}$ basic processing circuit may compute an inner product of each convolution kernel of the compressed Ai and the compressed input data P.

The method for implementing matrix multiplying vector may further include:

step S304, accumulating, by the accumulator circuit of the each basic processing circuit, a result of the inner product operation; and transmitting, by the accumulator circuit of each basic processing circuit, the accumulated result back to the primary processing circuit.

In an optional embodiment, a partial sum of each inner product operation performed by the basic processing circuits may be transmitted back to the primary processing circuit for accumulation.

In an optional embodiment, a partial sum of each inner product operation performed by the basic processing circuits may be stored in the register and/or on-chip cache of the basic processing circuits, and be transmitted into the primary processing circuit after being accumulated.

In an optional embodiment, in some cases, a partial sum of each inner product operation performed by the basic processing circuits may be stored into the register and/or on-chip cache of the basic processing circuits for accumulation; in some cases, a partial sum of each inner product operation performed by the basic processing circuits may be transmitted to the primary processing circuit for accumulation. After being accumulated, the some sum may be transmitted back the primary processing circuit.

A method of updating the weight using the device as shown in FIG. 1a: using the vector computing unit circuit of the primary processing circuit to realize updating of the weight in the training process of the neural network. Specifically, updating of the weight refers to the method of updating the weight using a gradient of the weight.

In an optional embodiment, the vector computing unit circuit of the primary processing circuit is adopted to add and subtract the two vectors of the weight and the gradient of the weight to obtain an operation result, and the operation result is an updated weight.

In an optional embodiment, the vector computing unit circuit of the primary processing circuit is adopted to multiply or divide the weight and the gradient of the weight by a number to obtain an intermediate weight and an intermediate gradient of the weight, and then the vector computing unit circuit is adopted to add and subtract the intermediate weight and the intermediate gradient of the weight to obtain an operation result, where the operation result is an updated weight.

In an optional embodiment, a set of momentum may be obtained by using the gradient of the weight, and addition and subtraction may be performed on the set of momentum and the weight to obtain the updated weight.

The present disclosure also provides a chip including a computing device, and the computing device includes:

a primary processing circuit, where data involved in the primary processing circuit may be compressed data. In an optional embodiment, the compressed data includes at least one input neuron or at least one weight, where each of the at least one input neuron is greater than a first threshold or each of the at least one weight is greater than a second threshold. The first threshold and the second threshold are customized by users, which may be the same or different.

In an optional embodiment, the primary processing circuit includes a compression mapping circuit, and the primary processing circuit includes an operation unit that performs data compression, such as a vector operation unit; specifically, the primary processing circuit includes a data input interface that receives input data.

In an optional embodiment, the computing device further includes a branch processing circuit, where data involved in the branch processing circuit may be compressed data. In an optional embodiment, the compressed data includes at least one input neuron or at least one weight, where each of the at least one input neuron is greater than a first threshold or each of the at least one weight is greater than a second threshold. The first threshold and the second threshold are customized by users, which may be the same or different.

In an optional embodiment, the branch processing circuit includes a compression mapping circuit.

In an optional embodiment, the branch processing circuit includes an operation unit that performs data compression, such as a vector operation unit; and specifically, the branch processing circuit includes a data input interface that receives input data.

In an optional embodiment, the data source may be from the outside of an operation circuit device of a neural network or part or all of basic processing circuits of the operation circuit device of the neural network.

In an optional embodiment, there may be a plurality of data input interfaces. Specifically, a data output interface for outputting data may be included.

In an optional embodiment, the data may be output to the external of an operation circuit device of a neural network or part or all of basic processing circuits of the operation circuit device of the neural network.

In an optional embodiment, there may be a plurality of data output interfaces.

In an optional embodiment, the branch processing circuit includes an on-chip cache and/or a register.

In an optional embodiment, the branch processing circuit includes an operation unit that can perform data operations.

In an optional embodiment, the branch processing circuit includes an arithmetic operation unit.

In an optional embodiment, the branch processing circuit includes a vector operation unit that may perform operations on a group of data at the same time. Specifically, the arithmetic operation and/or the vector operation may be any type of operation, including but not limited to: an addition, a subtraction, a multiplication, and a division of two numbers; an addition, a subtraction, a multiplication, and a division of a number and a constant; an exponential operation on a number; a power operation on a number; a logarithm operation on a number; various non-linear operations on a number; a comparison operation on two numbers; and a logical operation on two numbers, etc. The arithmetic operation and/or the vector operation may further include an addition, a subtraction, a multiplication, and a division of two vectors; an addition, a subtraction, a multiplication, and a division of each element in a vector and a constant; an exponential operation on each element in a vector; a power operation on each element in a vector; a logarithm operation on each element in a vector; various non-linear operations on each element in a vector; a comparison operation on every two corresponding elements of a vector; and a logical operation on every two corresponding elements of a vector, etc.

In an optional embodiment, the primary processing circuit includes a data rearrangement unit configured to transmit data to the basic processing circuit in a certain order, or rearrange the data in place in a certain order.

In an optional embodiment, the order of data arrangement includes: rearranging the dimensional order of a multi-dimensional data block; and dividing a data block then transmitting the divided data block to different basic processing circuits.

The computing device also includes a plurality of basic processing circuits, where each basic processing circuit is configured to compute an inner product of two vectors. A method of computation is: the basic processing circuits receiving two groups of numbers, multiplying elements of the two groups of numbers correspondingly, and accumulating a result of multiplication. The inner product is transmitted to other basic processing circuits or the primary processing circuit according to a position of the basic processing circuits.

Data involved in the basic processing circuits may be compressed data. In an optional embodiment, the compressed data includes at least one input neuron or at least one weight, where each of the at least one input neuron is greater than a first threshold or each of the at least one weight is greater than a second threshold. The first threshold and the second threshold are customized by users, which may be the same or different.

In an optional embodiment, each of the basic processing circuits may include a compression mapping circuit.

In an optional embodiment, each of the basic processing circuits may include a vector operation unit that performs data compression.

Specifically, each of the basic processing circuits may include a storage unit consisting of an on-chip cache and/or a register.

Specifically, each of the basic processing circuits may include one or more data input interfaces configured to receive data.

In an optional embodiment, two data input interfaces are included, and one or more data can be respectively obtained from the two data input interfaces at a time.

In an optional embodiment, the basic processing circuits can receive input data from the data input interface and store the input data into the register and/or the on-chip cache.

The data received by the data input interface may be from other basic processing circuits and/or the primary processing circuit. Specifically, the data received by the data input interface may be from the primary processing circuit of the operation circuit device of the neural network, or the other basic processing circuits of the operation circuit device of the neural network (the operation circuit device of the neural network has a plurality of basic processing circuits).

Specifically, one or more data output interfaces for transmitting output data may be included.

In an optional embodiment, one or more data may be output by the data output interface.

Specifically, data output by the data output interface may be one or any combination of data received from the data input interface, data stored in the on-chip cache and/or the register, a multiplier operation result, an accumulator operation result, or an inner product computing unit operation result.

In an optional embodiment, three data output interfaces may be included, where two of the three data output interfaces correspond to two data input interfaces, each layer outputs the data received by the previous layer from the data input interface, and the third data output interface is responsible for outputting the operation result.

Specifically, the data may be output by the data output interface to the primary processing circuit of the operation circuit device of the neural network, or the other basic processing circuits of the operation circuit device of the neural network (the operation circuit device of the neural network has a plurality of basic processing circuits), where the sources of the data and the destinations of the data determine a connection relationship of the basic processing circuits in the device.

Specifically, an arithmetic operation circuit may be included. The arithmetic operation circuit includes one or any combination of one or more multiplier circuits, one or more accumulator circuits, and one or more circuits that perform an inner product operation on two sets of number.

In an optional embodiment, a multiplication of two numbers may be performed. The result of the multiplication may be stored in the on-chip cache and/or the register, or be accumulated to the on-chip cache and/or the register directly.

In an optional embodiment, an inner product operation on two sets of number may be performed. The result of the inner product operation may be stored in the on-chip cache and/or the register, or be accumulated to the on-chip cache and/or the register directly.

In an optional embodiment, an accumulation operation of data may be performed, and the data may be accumulated to the on-chip cache and/or the register.

Specifically, the data accumulated by the accumulator circuit may be one or any combination of data received from the data input interface, data stored in the on-chip cache and/or the register, a multiplier operation result, an accumulator operation result, or an inner product computing unit operation result.

It should be noted that the "data input interface" and the "data output interface" used in the above description of the basic processing circuits refer to the data input interface and the data output interface of each basic processing circuit, rather than the data input interface and the data output interface of the entire device.

The integrated circuit chip device provided by another aspect of the present disclosure includes a primary processing circuit and a plurality of basic processing circuits.

The plurality of basic processing circuits are arranged in an array, and each basic processing circuit is connected to an adjacent basic processing circuit. The primary processing circuit may be connected to k basic processing circuits of the plurality of basic processing circuits, where the k basic processing circuits may include n basic processing circuits in a first row, and m basic processing circuits in a first column.

Part or all of the plurality of basic processing circuits may include the compression mapping circuits configured to perform compression on each data in the neural network operation.

The primary processing circuit may be configured to perform operations of the neural network in series and transmit the data to the k basic processing circuits.

The k basic processing circuits may be configured to forward data between the primary processing circuit and the plurality of basic processing circuits.

Part or all of the plurality of basic processing circuits may be configured to control whether to start the compression mapping circuit to perform compression on the transmitted data according to the operation of the data; the plurality of basic processing circuits may be further configured to perform operations of the neural network in series according to the transmitted data or the compressed transmitted data, and transmit a result to the primary processing circuit through the basic processing circuits connected to the primary processing circuit.

In an optional embodiment, when the plurality of basic processing circuits all include a compression mapping circuit, the plurality of basic processing circuits may be configured to control whether to start the compression mapping circuit to perform compression on the transmitted data according to the operation of the transmitted data, perform the operation of the neural network in parallel according to the compressed transmitted data, and transmit an operation result to the primary processing circuit through the k basic processing circuits connected to the primary processing circuit.

In an optional embodiment, the primary processing circuit may be configured to obtain data blocks to be computed and an operation instruction, and divide the data blocks to be computed into a data block for distribution and a data block for broadcasting according to the operation instruction; the primary processing circuit may be further configured to split the data block for distribution to obtain a plurality of basic data blocks, distribute the plurality of basic data blocks to the k basic processing circuits connected to the primary processing circuit, and broadcast the data block for broadcasting to k basic processing circuits connected to the primary processing circuit. The plurality of basic processing circuits may be configured to control the starting of the compression mapping circuit so as to perform compression on the basic data blocks and the data block for broadcasting according to the received basic data blocks, the data block for broadcasting, and the operation instruction, then perform an inner product operation on the compressed basic data blocks and the compressed data block for broadcasting to obtain an operation result, and transmit the operation result to the primary processing circuit through the k basic processing circuits. The primary processing circuit may be configured to process the operation result to obtain the data blocks to be computed and an instruction result of the operation instruction, where the data block for distribution and the data block for broadcasting are at least one input neuron and/or one weight.

In an optional embodiment, when the k basic processing circuits of the plurality of basic processing circuits all include a compression mapping circuit, the k basic processing circuits may be configured to control whether to start the compression mapping circuit to perform compression on the transmitted data according to the operation of the data, and transmit the compressed transmitted data to the primary processing circuit through the k basic processing circuits. The plurality of basic processing circuits may be configured to perform operations of the neural network in series according to the compressed data, and transmit the operation result to the primary processing circuit through the basic processing circuits connected to the primary processing circuit.

In an optional embodiment, the primary processing circuit may be configured to obtain data blocks to be computed and an operation instruction, and divide the data blocks to be computed into a data block for distribution and a data block for broadcasting according to the operation instruction; the primary processing circuit may be further configured to split the data block for distribution to obtain a plurality of basic data blocks, distribute the plurality of basic data blocks to the k basic processing circuits connected to the primary processing circuit, and broadcast the data block for broadcasting to k basic processing circuits connected to the primary processing circuit. The k basic processing circuits may be configured to control the starting of the compression mapping circuit to perform compression on the basic data blocks and the data block for broadcasting according to the received basic data blocks, the data block for broadcasting, and the operation instruction, and transmit the compressed basic data blocks and the compressed data block for broadcasting to the basic processing circuits connected to the k basic processing circuits. The plurality of basic processing circuits may be configured to perform the inner product operation on the compressed basic data blocks and the compressed data block for broadcasting to obtain an operation result, and transmit the operation result to the primary processing circuit. The primary processing circuit may be further configured to process the operation result to obtain the data blocks to be computed and an instruction result of the operation instruction, where the data block for distribution and the data block for broadcasting are at least one input neuron and/or one weight.

Figure 4A:
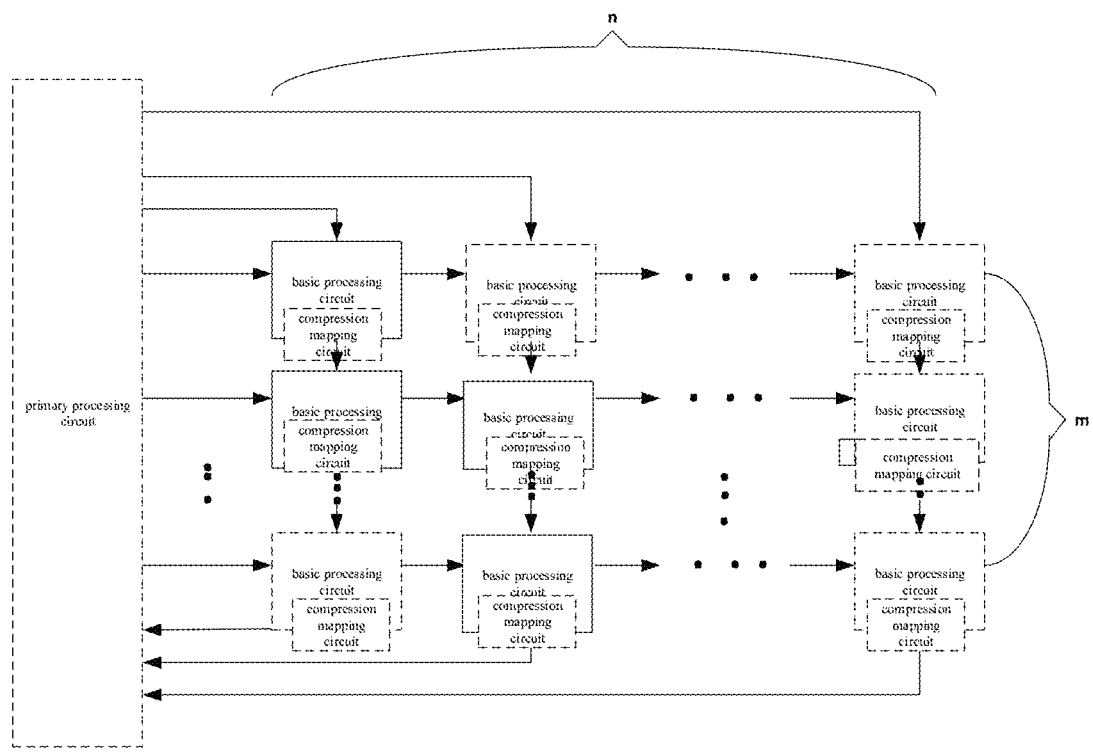
FIG. 4a is a structural diagram of another integrated circuit chip device according to an embodiment of the disclosure.

FIG. 4a is an integrated circuit chip device provided by the present disclosure. The integrated circuit chip device may include a primary processing circuit and a plurality of basic processing circuits. The plurality of basic processing circuits are arranged in an array (m*n array), where m and n are integers greater than or equal to 1, and at least one of m and n has a value greater than or equal to 2. For the plurality of basic processing circuits arranged in the m*n array, each basic processing circuit may be connected to an adjacent basic processing circuit, the primary processing circuit may be connected to k basic processing circuits of the plurality of basic processing circuits, where the k basic processing circuits may include n basic processing circuits in the first row, n basic processing circuits in the $m^{th}$ row, and m basic processing circuits in the first column. Regarding the integrated circuit chip device as shown in FIG. 1a, the primary processing circuit and/or the plurality of basic processing circuits may include the compression mapping circuits, specifically, a part of the plurality of basic processing circuits may include the compression mapping circuits. For example, in an optional embodiment, the k basic processing circuits may be configured with the compression mapping circuit, in this way, n basic processing circuits may be respectively responsible for performing data compression on the data of m basic processing circuits of this column. This device can improve the computation efficiency and reduce power consumption. For the n basic processing circuits of the first row, since it first receives the data transmitted by the primary processing circuit, compressing the data can reduce the computation amount of the subsequent basic processing circuits and the amount of data transmitted between the subsequent basic processing circuits. Similarly, configuring the compression mapping circuit for the m basic processing circuits of the first column also has the technical effects of small amount of computation and low power consumption. In addition, according to the configuration, the primary processing circuit can adopt a dynamic data transmission strategy, for example, the primary processing circuit may broadcast data to the m basic processing circuits of the first column, and the primary processing circuit may distribute data to the n basic processing circuits of the first row. By adopting the dynamic data transmission strategy, different data may be transferred to the basic processing circuits through different data input interfaces, in this way, the basic processing circuits may not need to distinguish the type of the data. Instead, the basic processing circuits can determine the data type as long as it determines which input interface the data is received from, then the kind of the data will be determined.

The primary processing circuit may be further configured to perform operations of the neural network in series and transmit the data with the basic processing circuits connected to the primary processing circuit. The successive operations include but are not limited to: an accumulation operation, an ALU operation, an activation operation and so on.

The plurality of basic processing circuits may be configured to perform operations of the neural network in series according to the data, and transmit the result to the primary processing circuit through the basic processing circuits connected to the primary processing circuit. The operations of the neural network performed in parallel include but are not limited to: an inner product operation, a multiplication of matrix or vector, etc. Specifically, the plurality of basic processing circuits may first perform compression processing on the transmitted data, and then perform operations in the neural network in a parallel manner according to the compressed processed data.

The primary processing circuit may include a data transmitting circuit, a data receiving circuit or an interface, and the data transmitting circuit can integrate a data distributing circuit and a data broadcasting circuit. Of course, in practical applications, the data distributing circuit and the data broadcasting circuit may be set separately. The data transmitted by the primary processing circuit to each basic processing circuit is the data for broadcasting. The data transmitted by the primary processing circuit selectively to a part of basic processing circuits is the data for distribution. Specifically, taking a convolution operation as an example, the convolution input data of the convolution operation needs to be transmitted to all the basic processing circuits, so the convolution input data is the data for broadcasting, while the convolution kernel needs to be selectively transmitted to a part of the basic data blocks, so the convolution kernel is the data for distribution. The manner that the data for distribution is specifically transmitted to which basic processing circuit can be specifically determined by the primary processing circuit in accordance with the load and other allocation methods. The data for broadcasting may be transmitted to each basic processing circuit by broadcasting (in practical applications, the data for broadcasting may be transmitted to each basic processing circuit by one time or by many times, the embodiments of the present disclosure do not limit the times of broadcasting). The data for distribution may be selectively transmitted to a part of basic processing circuits by distributing.

Optionally, an accumulator circuit of the n basic processing circuits of the $m^{th}$ row may perform an accumulation operation of the inner product. Because the n basic processing circuits of the $m^{th}$ row can receive products of all the basic processing circuits in this column, the accumulation operation of the inner product performed by the accumulator circuit of the n basic processing circuits of the $m^{th}$ row may effectively allocate computing resources, which could save power consumption. The accumulation operation of the inner product performed by the accumulator circuit of the n basic processing circuits of the $m^{th}$ row is especially suitable for the case that m is larger.

The primary processing circuit can allocate the circuit to perform compression on data. Specifically, the primary processing circuit can allocate the circuit to perform compression in an explicit or implicit manner. For the explicit manner, the primary processing circuit may transmit a special indication or instruction, if the basic processing circuits receive the special indication or instruction, the compression on data is determined to be performed; while if the basic processing circuits do not receive the special indication or instruction, the compression on data is determined not to be performed. The implicit manner may be also adopted, for example, when the basic processing circuits receive sparse data (that is, data includes 0, or the amount of data less than a preset threshold is greater than a preset number) and that an inner product operation needs to be performed, the sparse data should be compressed. For the explicit manner, the special instruction or indication may configure a descending sequence, each time the descending sequence passes through a basic processing circuit, the value is reduced by 1, and the basic processing circuits read the value of the descending sequence. If the value of the descending sequence is greater than 0, data compression is performed; if the value is equal to or less than 0, data compression is not performed. This device is configured by the basic processing circuits allocated according to an array. For example, for m basic processing circuits in an $i^{th}$ column, if the primary processing circuit needs the first five basic processing circuits to perform data compression, then the primary processing circuit may transmit a special instruction including a descending sequence, the initial value of the descending sequence may be 5, each time the descending sequence passes through a basic processing circuit, the value is reduced by 1, when the descending sequence passes through the $5^{th}$ basic processing circuit, the value of the descending sequence is 1, and when the descending sequence passes through the $6^{th}$ basic processing circuit, the value of the descending sequence is 0, the $6^{th}$ basic processing circuit will no longer perform the data compression at this time. In this way, the primary processing circuit can dynamically configure an execution body of the data compression and a count of executions.

Figure 4B:
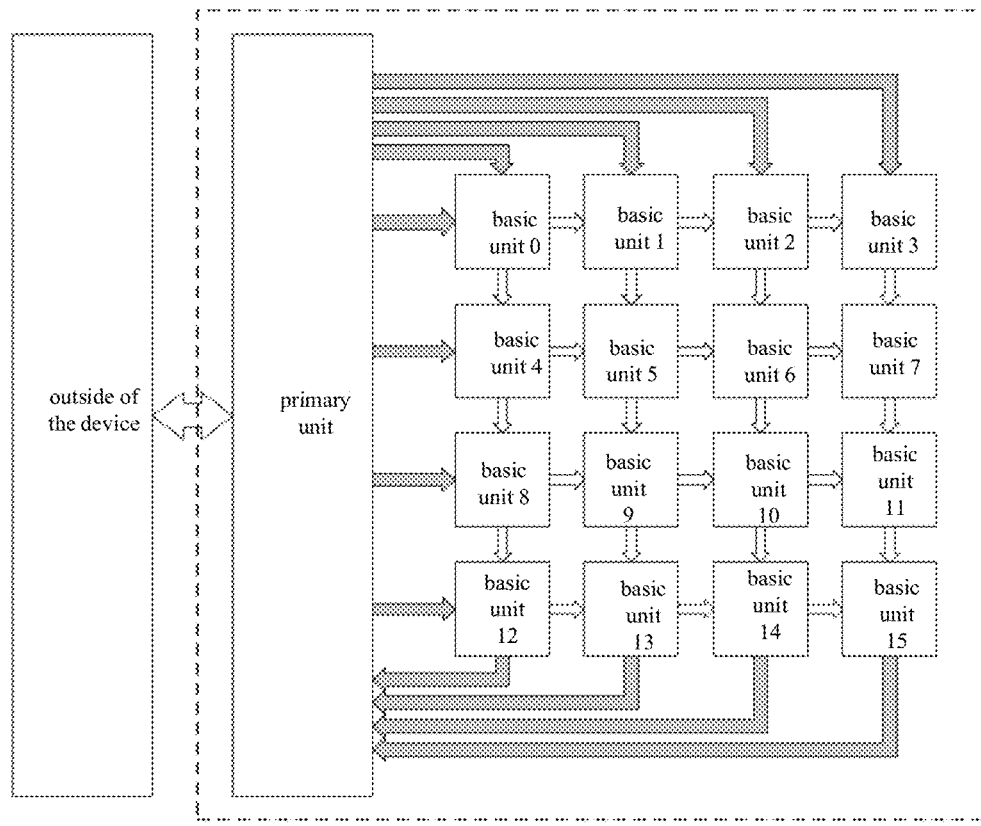
FIG. 4b is a structural diagram of another integrated circuit chip device according to an embodiment of the disclosure.

An embodiment of the present disclosure provides an integrated circuit chip device including a primary processing circuit (also called a primary unit) and a plurality of basic processing circuits (also called basic units). The structure of the embodiment is shown in FIG. 4b, where the dotted box is the internal structure of a neural network operation device, the grey-filled arrows represent a data transmission path between the primary processing circuit and a basic processing circuit array, and the hollow arrows represent a data transmission path between each basic processing circuit with its adjacent basic processing circuit in the basic processing circuit array. The length and width of the basic processing circuit array can be different, that is, the values of m and n can be different, or of course the length and width of the basic processing circuit array can be the same. This disclosure does not limit the specific values of m and n.

Figure 4C:
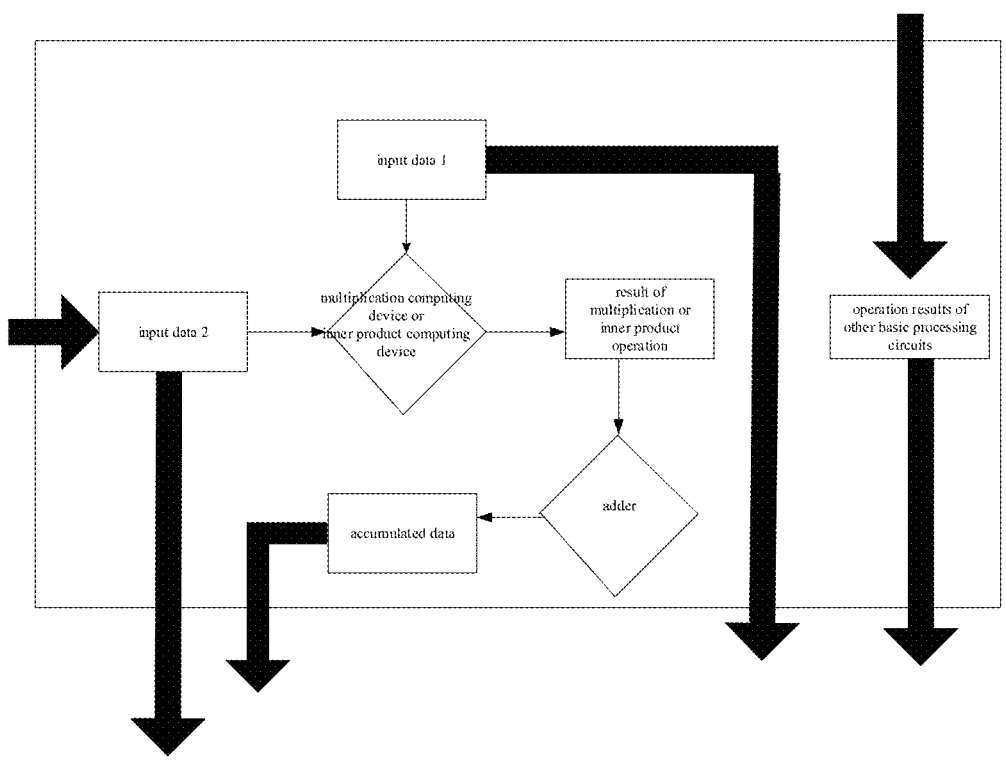
FIG. 4c is a structural diagram of a basic processing circuit according to an embodiment of the disclosure.

The structure of the basic processing circuits is shown in FIG. 4c, where the dotted box represents the boundaries of the basic processing circuits; the thick arrows intersecting with the dotted box represent the data input and output channels (if the thick arrows point to the inside of the dotted box, then the thick arrows are the input channel, while if the thick arrows point to the outside of the dotted box, then the thick arrows are the output channel); the rectangular box in the dotted box represents a storage unit circuit (a register and/or an on-chip cache), including input data 1, input data 2, results of multiplication or inner product operation, and accumulated data; and the diamond box represents the computing unit circuit, including a multiplication computing unit or an inner product operation computing unit, and an adder.

In this embodiment, the neural network operation device includes a primary processing circuit and 16 basic processing circuits (the 16 is only for illustration purposes and other values may also be used in practical applications).

In this embodiment, each basic processing circuit has two data input interfaces and two data output interfaces. In the subsequent description of this embodiment, a horizontal input interface (a horizontal arrow pointing to the unit in FIG. 4b) is referred to as input 0, and a vertical input interface (a vertical arrow pointing to the unit in FIG. 4b) is referred to as input 1; a horizontal output interface (a horizontal arrow pointing out from the unit in FIG. 4b) is referred to as output 0, and a vertical output interface (a vertical arrow pointing out from the unit in FIG. 4b) is referred to as output 1.

The data input interface and the data output interface of each basic processing circuit can be respectively connected to different units, including a primary processing circuit and other basic processing circuits.

In this embodiment, the input 0 of the basic processing circuits 0, 4, 8, 12 (serial numbers of the basic processing circuits are shown in FIG. 4b) is connected to the data output interface of the primary processing circuit.

In this embodiment, the input 1 of the basic processing circuits 0, 1, 2, 3 is connected to the data output interface of the primary processing circuit.

In this embodiment, the output 1 of the basic processing circuits 12, 13, 14, 15 is connected to the data input interface of the primary processing circuit.

In this embodiment, the connection between the output interface of the basic processing circuits and the input interface of other basic processing circuits is shown in FIG. 1b, and will not be enumerated one by one.

Specifically, an output interface S1 of an S unit is connected to an input interface P1 of a P unit, indicating that, through the P1 interface, the P unit will be able to receive data that the S unit transmits to the S1 interface.

This embodiment includes a primary processing circuit connected to an external device (that is, the input interface and the output interface are both included), part of the data output interfaces of the primary processing circuit are connected to part of the data input interfaces of the basic processing circuits, and part of the data input interfaces of the primary processing circuit are connected to part of the data output interfaces of the basic processing circuits.

A method of using the integrated circuit chip device.

The data involved in the usage method provided by the present disclosure may be compressed data. For details on how to implement the compression of the data, please refer to the related description in the foregoing embodiments, for example, FIG. 1e to FIG. 1k, and details are not described herein again.

The operations that need to be completed in the basic processing circuits can be performed according to the following method: the control circuit of the primary processing circuit distributing the data to the basic processing circuits for operation, and correspondingly, the compression mapping circuit of the basic processing circuits compressing the data and then performing the operation. In this way, the amount of data involved in computation can be reduced, and the basic processing circuits may perform data operations more efficiently with lower power consumption.

If the data received by the basic processing circuits is sparse data, the basic processing circuits can compute the data after the compression mapping circuit compresses the sparse data. For example, when the basic processing circuits receive the sparse data transmitted from the primary processing circuit, the compression mapping circuit may compress the sparse data, and then transmit the data to the inner product computing unit circuit, the vector computing unit circuit or the accumulator circuit of the basic processing circuits to perform operation on the compressed data, so as to improve the operation efficiency and reduce the power consumption.

Figure 5A:
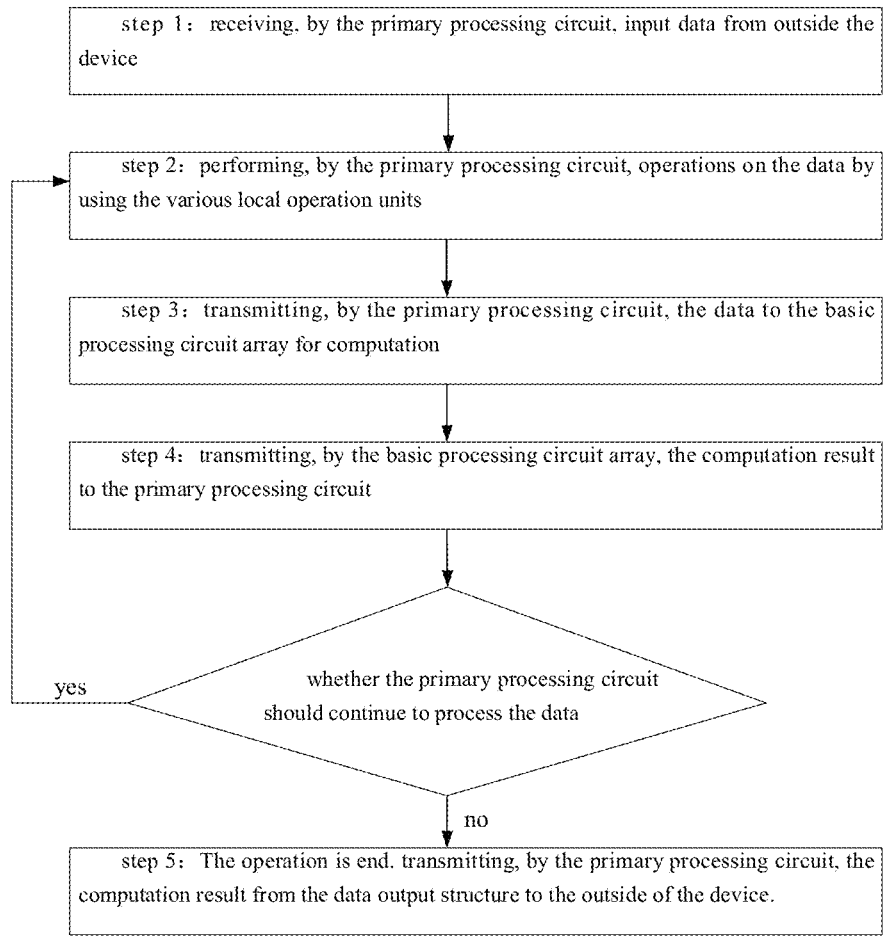
FIG. 5a is a diagram of how to use a basic processing circuit according to an embodiment of the disclosure.
Figure 5B:
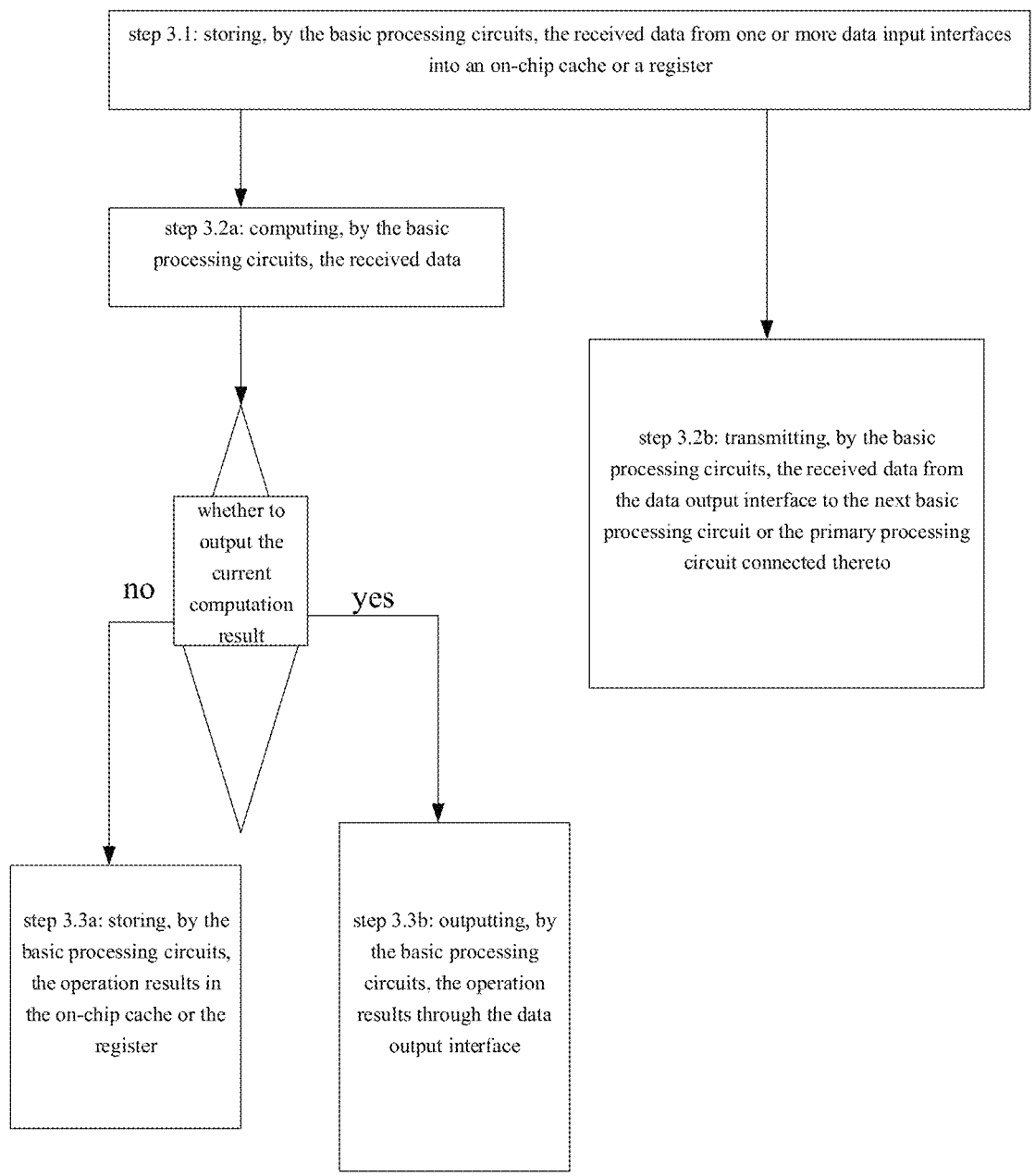
FIG. 5b is a diagram of transmitting data by a primary processing circuit according to an embodiment of the disclosure.

A method of using the basic processing circuits (as shown in FIG. 5a):

receiving, by the primary processing circuit, the input data to be computed from the outside of the device;

processing, by the primary processing circuit, the data by using various operation circuits of this unit, such as the vector operation circuit, the inner product computing unit circuit, the accumulator circuit;

transmitting (as shown in FIG. 5b), by the primary processing circuit, data to the basic processing circuit array (a collection of all basic processing circuits is called the basic processing circuit array) through the data output interface, where the primary processing circuit may broadcast data many times to the basic processing circuit array, that is, the primary processing circuit may transmit the data to a part of the basic processing circuits directly; or the primary processing circuit may distribute data to the basic processing circuit array, that is, the primary processing circuit may transmit different data to different basic processing circuits;

performing, by the basic processing circuit array, operation on the data; and receiving, by the basic processing circuits, the input data; and performing, by the basic processing circuits, operation on the received data.

Optionally, the basic processing circuits may control whether to start the compression mapping circuit in the basic processing circuits to perform compression on the transmitted data according to the operation instruction of the data, and then perform operation on the compressed data.

Optionally, after receiving the data, the basic processing circuits may transmit the data out from the data output interface of the unit (the basic processing circuits may transmit the data to other basic processing circuits that do not directly receive data from the primary processing circuit, optionally, the data may also be compressed data).

Optionally, the basic processing circuits may transmit the operation result (an intermediate operation result or a final operation result) out from the data output interface.

The primary processing circuit may receive the output data returned from the basic processing circuit array.

Optionally, the primary processing circuit may continue processing the data received from the basic processing circuit array (for example, the accumulation or activation operation may be performed on the data).

After completing the operation on the data, the primary processing circuit may transmit the processing result from the data output interface to the outside of the device.

The multiplication of matrix and vector may be performed by the circuit device, where the step of the multiplication of matrix and vector includes: an inner product operation of each row in the matrix with the vector may be performed firstly, and the results of the inner product operation may be arranged into a vector in the order of the corresponding rows.

Figure 5C:
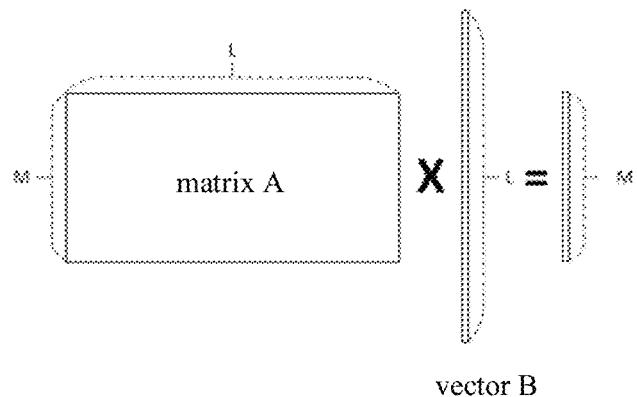
FIG. 5c is a diagram of matrix multiplied by vector according to an embodiment of the disclosure.
Figure 5D:
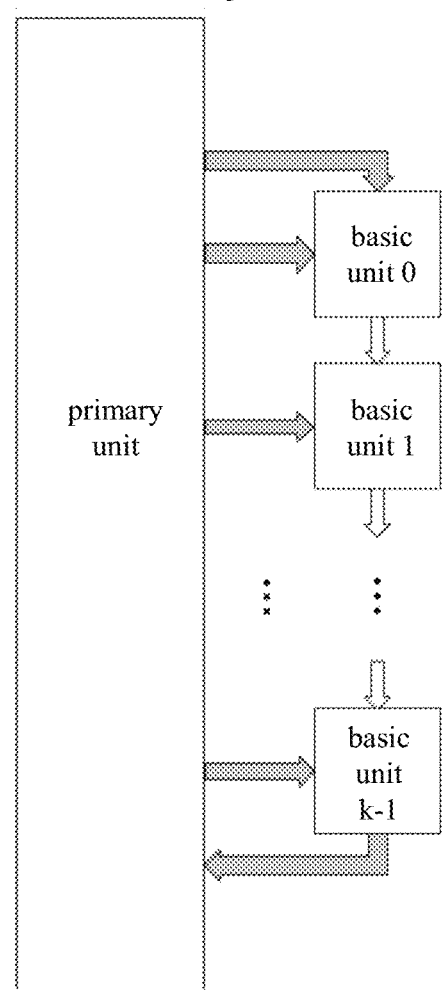
FIG. 5d is a structural diagram of an integrated circuit chip device according to an embodiment of the disclosure.

As shown in FIG. 5c, a multiplication of a matrix S with M rows and L columns and a vector P with the length being L is described below.

The multiplication as shown in FIG. 5c may use all or part of the basic processing circuits of the neural network computing device. For example, if k basic processing circuits are used, the primary processing circuit may transmit the data of part or all of the matrix S to each of the k basic processing circuits.

In an optional embodiment, the control circuit of the primary processing circuit may transmit a number or a part of numbers of a certain row in the matrix S to a certain basic processing circuit, for example, a certain basic processing circuit may transmit the first number in a third row at the first time, the second number in the third row at the second time, and the third number in the third row at the third time . . . ; or a certain basic processing circuit may transmit the first two numbers in the third row (that is, the first and second numbers) at the first time, the third and fourth numbers in the third row at the second time, and the fifth and sixth numbers in the third row at the third time . . . .

In an optional embodiment, the control circuit of the primary processing circuit may transmit a number or a part of numbers of some rows in the matrix S to a certain basic processing circuit, for example, a certain basic processing circuit may transmit the first number in a third, fourth, and fifth rows at the first time, the second number in the third, fourth, and fifth rows at the second time, and the third number in the third, fourth, and fifth rows at the third time . . . ; or a certain basic processing circuit may transmit the first two numbers in the third, fourth, and fifth rows at the first time, the third and fourth numbers in the third, fourth, and fifth rows at the second time, and the fifth and sixth numbers in the third, fourth, and fifth rows at the third time . . . .

The control circuit of the primary processing circuit may sequentially transmit the data in the vector P to a $0^{th}$ basic processing circuit.

After receiving the data of the vector P, the $0^{th}$ basic processing circuit may transmit the data to the next basic processing circuit connected to the $0^{th}$ basic processing circuit, that is, the basic processing circuit 1.

Specifically, some basic processing circuits cannot obtain all the data required for computation directly from the primary processing circuit. For example, the basic processing circuit 1 as shown in FIG. 2d only has a data input interface connected to the primary processing circuit, therefore only the data of the matrix S can be obtained from the primary processing circuit, while the data of the vector P may be transmitted from the basic processing circuit 0 to the basic processing circuit 1; similarly, the basic processing circuit 1 also needs to output the data of the vector P to the basic processing circuit 2 after receiving the data.

Optionally, after receiving the data, each of the k basic processing circuits may determine whether to start the corresponding compression mapping circuit to compress the data according to the operation instruction (that is, operation control) of the data, and then perform operation on the compressed data; optionally, each of the k basic processing circuits may transmit the compressed data to other basic processing circuits.

For example, after receiving the input matrix S or the matrix P, the basic processing circuits may enable the compression mapping circuit to delete the data whose value is a specified value (such as 0) in the input matrix S and matrix P and/or the data less than a preset threshold (such as 0.1). In practical applications, deletion may be implemented according to the corresponding mask matrix of matrix S and matrix P, for example, when the data in the mask matrix is 0, its corresponding data in the matrix S/P at the same position may be deleted. For specific descriptions, please refer to the above embodiments of data compression, which are not repeated herein. It should be understood that the matrix S and the matrix P herein may also be correspondingly understood as the input neuron (also referred to as input neuron matrix) and the weight (also referred to as weight matrix) in the foregoing embodiments.

Each of the basic processing circuits may perform operations on the data, where the operations include but are not limited to: the inner product operation, the multiplication, the addition, and the like.

In an optional embodiment, the basic processing circuits may perform multiplication on one or more sets of two numbers at a time, and then accumulate the result to the register and or on the on-chip cache.

In an optional embodiment, the basic processing circuits may perform the inner product operation on one or more sets of two vectors at a time, and then accumulate the result to the register and or on the on-chip cache.

After obtaining the result, the basic processing circuits may transmit the result out through the data output interface (that is, the basic processing circuits may transmit the result to other basic processing circuits connected the basic processing circuits).

In an optional embodiment, the result may be an intermediate result or a final result of the inner product operation.

After receiving the operation result from other basic processing circuits, the basic processing circuits may transmit the data to other basic processing circuits or the primary processing circuit connected thereto.

After receiving the result of the inner product operation of each basic processing circuit, the primary processing circuit may process the result to obtain a final result (the processing may be an accumulation operation or an activation operation, etc.).

The following is an embodiment of implementing the operation of matrix multiplying vector using the above computing device.

In an optional embodiment, the plurality of basic processing circuits used in the operation of matrix multiplying vector may be arranged in the manner as shown in FIG. 4$d$ or FIG. 4$e$.

As shown in FIG. 4$c$, the control circuit of the primary processing unit may divide the M rows of data of the matrix S into K groups, and the $i^{th}$ basic processing circuit is responsible for the operation of the $i^{th}$ group (the set of rows in the group of data is denoted as Ai). Specifically, before performing the operation of the $i^{th}$ group (the set of rows in the group of data is denoted as Ai), the $i^{th}$ basic processing circuit may determine whether it is necessary to firstly compress the Ai by using the compression mapping circuit according to the operation instruction of the data, and then perform an operation on the compressed Ai. Or before performing the operation of the $i^{th}$ group (the set of rows in the group of data is denoted as Ai), each of the basic processing units in a first column or a first row of the device may determine whether it is necessary to firstly compress the Ai by using the compression mapping circuit according to the operation instruction of the data, and then perform an operation on the compressed Ai. The present disclosure does not limit whether it is necessary to firstly compress the Ai by using the compression mapping circuit according to the operation instruction of the data. For specific descriptions of data compression, please refer to the above embodiments, which are not repeated herein.

The M rows of data is grouped in any way that the data will not be repeatedly allocated.

In an optional embodiment, the following allocation manner may be adopted: distributing $j^{th}$ row to the j % $K^{th}$ (% is a remainder operation) basic processing circuit.

In an optional embodiment, for rows that cannot be grouped evenly, it is also possible to group a part of the rows evenly, and the remaining rows may be grouped in any manner.

The control circuit of the primary processing circuit may sequentially transmit the data in part or all of the rows in the matrix S to the corresponding basic processing circuits.

In an optional embodiment, the control circuit of the primary processing circuit may transmit one or more data of one row of data in the $i^{th}$ group Mi responsible by the control circuit of the primary processing circuit to the $i^{th}$ basic processing circuit each time.

In an optional embodiment, the control circuit of the primary processing circuit may transmit one or more data of some or all rows of data in the $i^{th}$ group Mi responsible by the control circuit of the primary processing circuit to the $i^{th}$ basic processing circuit each time.

In an optional embodiment, the control circuit of the primary processing circuit may sequentially transmit the data in the vector P to the first basic processing circuit.

In an optional embodiment, the control circuitry of the primary processing circuit may transmit one or more data in the vector P each time.

The $i^{th}$ basic processing circuit may receive the data of the vector P and then transmit the data to the $i+1^{th}$ basic processing circuit connected to the $i^{th}$ basic processing circuit, optionally, the transmitted data of the vector P may be the compressed data.

Each basic processing circuit may receive one or more data from a certain row or some rows of the matrix S and one or more data from the vector P, and then perform operations on the data (the operations include but are not limited to multiplication or addition).

In an optional embodiment, the basic processing circuits may perform multiplication of one or more sets of two data each time, and accumulate the result of multiplication to the register and/or the on-chip cache.

In an optional embodiment, the basic processing circuits may perform the inner product operation of one or more sets of two vectors each time, and accumulate the result of the inner product operation to the register and/or the on-chip cache.

In an optional embodiment, the data received by the basic processing circuits may be an intermediate result, which may be stored in the register and/or the on-chip cache.

The basic processing circuits may transmit the local operation result to the next basic processing circuit or the primary processing circuit connected thereto.

In an optional embodiment, the structure as shown in FIG. 5$d$, only the output interface of the last basic processing circuit in each column is connected to the primary processing circuit. In this case, only the last basic processing circuit can directly transmit the local operation result to the primary processing circuit, the operation results of other basic processing circuits will be transmitted to the next basic processing circuit, and the basic processing circuit obtaining the operation results from its previous basic processing circuit will transmit the operation results to the next basic processing circuit until all the operation results are transmitted to the last basic processing circuit. And then, the last basic processing circuit may perform the accumulation operation on the local operation result and the received results of other basic processing circuits in the column to obtain an intermediate result, and the last basic processing circuit may transmit the intermediate result to the primary processing circuit. Or the last basic processing circuit may transmit the local operation result and the received results of other basic processing circuits in the column to the primary processing circuit directly.

Figure 5E:
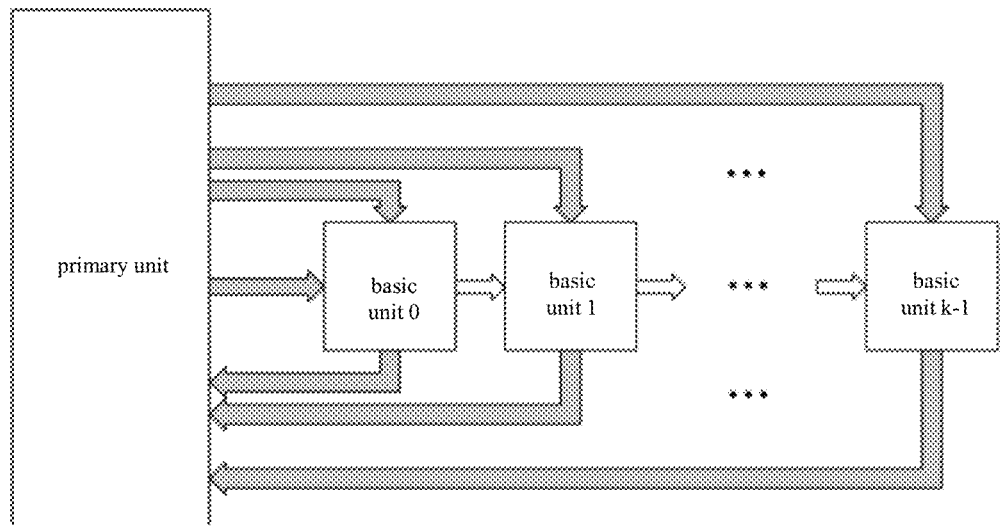
FIG. 5e is a structural diagram of another integrated circuit chip device according to an embodiment of the disclosure.

In an optional embodiment corresponding to the structure as shown in FIG. 5e, each basic processing circuit has an output interface connected to the primary processing circuit. In this case, each basic processing circuit may directly transmit the local operation result to the primary processing circuit.

After receiving the operation result transmitted by other basic processing circuits, the basic processing circuits may transmit the operation result to the next basic processing circuit or the primary processing circuit connected thereto.

The primary processing circuit may receive M results of the inner product operation, which may be taken as the operation result of matrix multiplying vector.

The circuit device may be adopted to complete the multiplication of matrix and matrix.

Figure 5F:
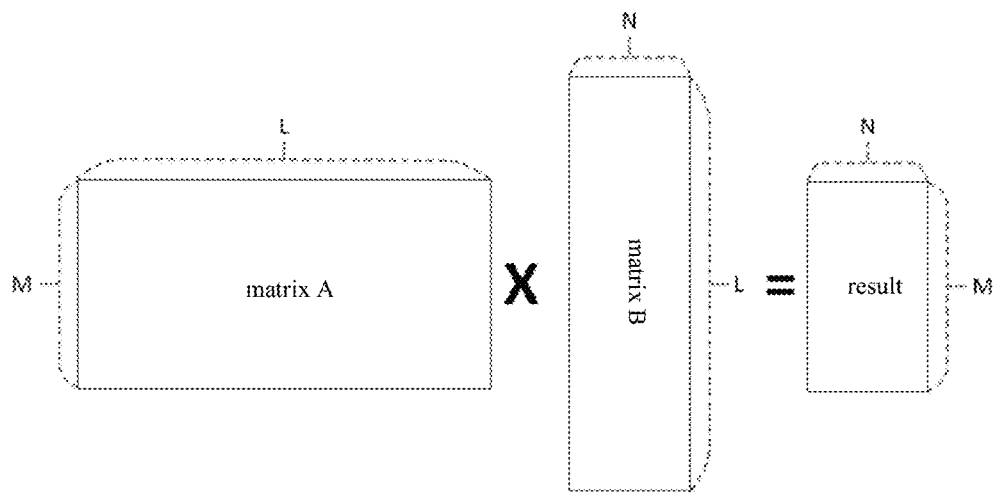
FIG. 5f is a diagram of matrix multiplied by matrix according to an embodiment of the disclosure.

A multiplication of matrix S with M rows and L columns and matrix P with L rows and N columns is described below. As shown in FIG. 5f, each row in matrix S has the same length as each column in matrix P.

The embodiment as shown in FIG. 4b will be used to describe the device adopted to complete the method.

The control circuit of the primary processing circuit may transmit data in part or all of the rows of the matrix S to the basic processing circuits that are directly connected to the primary processing circuit through the horizontal data input interface (for example, the grey-filled vertical data path at the top of FIG. 4b).

In an optional embodiment, the control circuit of the primary processing circuit may transmit a number or a part of numbers of a certain row in the matrix S to a certain basic processing circuit each time, for example, a certain basic processing circuit may transmit the first number in a third row at the first time, the second number in the third row at the second time, and the third number in the third row at the third time . . . ; or a certain basic processing circuit may transmit the first two numbers in the third row (that is, the first and second numbers) at the first time, the third and fourth numbers in the third row at the second time, and the fifth and sixth numbers in the third row at the third time . . . .

In an optional embodiment, the control circuit of the primary processing circuit may transmit a number or a part of numbers of some rows in the matrix S to a certain basic processing circuit each time, for example, a certain basic processing circuit may transmit the first number in a third, fourth, and fifth rows at the first time, the second number in the third, fourth, and fifth rows at the second time, and the third number in the third, fourth, and fifth rows at the third time . . . ; or a certain basic processing circuit may transmit the first two numbers in the third, fourth, and fifth rows at the first time, the third and fourth numbers in the third, fourth, and fifth rows at the second time, and the fifth and sixth numbers in the third, fourth, and fifth rows at the third time . . . .

The control circuit of the primary processing circuit may transmit data in part or all of the columns of the matrix P to the basic processing circuits that are directly connected to the primary processing circuit through the vertical data input interface (for example, the grey-filled horizontal data path on the left side of the basic processing circuit array in FIG. 4b).

In an optional embodiment, the control circuit of the primary processing circuit may transmit a number or a part of numbers of a certain column in the matrix P to a certain basic processing circuit each time, for example, a certain basic processing circuit may transmit the first number in a third column at the first time, the second number in the third row at the second time, and the third number in the third column at the third time . . . ; or a certain basic processing circuit may transmit the first two numbers in the third column (that is, the first and second numbers) at the first time, the third and fourth numbers in the third column at the second time, and the fifth and sixth numbers in the third column at the third time . . . .

In an optional embodiment, the control circuit of the primary processing circuit may transmit a number or a part of numbers of some columns in the matrix S to a certain basic processing circuit each time, for example, a certain basic processing circuit may transmit the first numbers in a third, fourth, and fifth columns at the first time, the second numbers in the third, fourth, and fifth columns at the second time, and the third numbers in the third, fourth, and fifth columns at the third time . . . ; or a certain basic processing circuit may transmit the first two numbers in the third, fourth, and fifth columns at the first time, the third and fourth numbers in the third, fourth, and fifth columns at the second time, and the fifth and sixth numbers in the third, fourth, and fifth columns at the third time . . . .

After receiving the data of the matrix S, the basic processing circuits may transmit the data to the next basic processing circuit connected thereto through the horizontal data output interface of the basic processing circuit (for example, the white-filled horizontal data path in the middle of the basic processing circuit array in FIG. 4b). After receiving the data of the matrix P, the basic processing circuits may transmit the data to the next basic processing circuit connected thereto through the vertical data output interface of the basic processing circuit (for example, the white-filled vertical data path in the middle of the basic processing circuit array in FIG. 4b).

Optionally, when each of the basic processing circuits includes a compression mapping circuit, after receiving the data (specifically, the data may include the data of the matrix S and the matrix P), the basic processing circuits may determine to start the corresponding compression mapping circuit to compress the data according to the operation of data; and the basic processing circuits may further transmit the compressed data to the next basic processing circuit connected thereto through the horizontal or vertical data output interface of the basic processing circuits.

For example, after receiving the input matrix S or the matrix P, the basic processing circuits may enable the compression mapping circuit to delete the data whose value is a specified value (such as 0) in the input matrix S and matrix P and/or the data less than a preset threshold (such as 0.1). In practical applications, deletion may be implemented according to the corresponding mask matrix of matrix S and matrix P, for example, when the data in the mask matrix is 0, its corresponding data in the matrix S/P at the same position may be deleted. For specific descriptions, please refer to the above embodiments of data compression, which are not repeated herein. It should be understood that the matrix S and the matrix P herein may also be correspondingly understood as the input neuron (also referred to as input neuron matrix) and the weight (also referred to as weight matrix) in the foregoing embodiments.

Optionally, when each basic processing circuit in the first column and the first row includes the compression mapping circuit, after receiving the data (specifically, the data may include the data of the matrix S and the matrix P), each basic processing circuit in the first column or the first row of the device may control whether to start the compression mapping circuit of each basic processing circuit in the first column or the first row to perform compression on the transmitted data according to the operation of the data. Each basic processing circuit in the first column or the first row may further transmit the compressed data to the next basic processing circuit connected thereto through the horizontal or vertical data output interface of the basic processing circuit. And then, each basic processing circuit in the first column or the first row may continue performing subsequent operations, for example, transmitting the data to other basic processing circuits or performing operations on the data.

Each of the basic processing circuits may perform operations on the data, optionally, the data may be the compressed data.

In an optional embodiment, the basic processing circuits may perform multiplication on one or more sets of two numbers at a time, and then accumulate the result to the register and or on the on-chip cache.

In an optional embodiment, the basic processing circuits may perform the inner product operation on one or more sets of two vectors at a time, and then accumulate the result to the register and or on the on-chip cache.

After obtaining the result, the basic processing circuits may transmit the result out through the data output interface.

In an optional embodiment, the result may be an intermediate result or a final result of the inner product operation.

Specifically, if a basic processing circuit has an output interface directly connected to the primary processing circuit, the results will be transmitted from the output interface; and if a basic processing circuit does not have an output interface directly connected to the primary processing circuit, the results will be output in the direction of the basic processing circuit that can directly output to the primary processing circuit (for example, as shown in FIG. 4b, the basic processing circuits at the bottom row may transmit the operation result directly to the primary processing circuit, and the other basic processing circuits may transmit the operation result from the vertical output interface to the next basic processing circuit).

After receiving the operation result from other basic processing circuits, the basic processing circuits may transmit the data to other basic processing circuits or the primary processing circuit connected thereto.

The results may be output in the direction of the basic processing circuit that can directly output to the primary processing circuit (for example, as shown in FIG. 4b, the basic processing circuits at the bottom row may transmit the operation result directly to the primary processing circuit, and the other basic processing circuits may transmit the operation result from the vertical output interface to the next basic processing circuit).

The primary processing circuit may receive the result of the inner product operation of each basic processing circuit to obtain the output result.

The following is an embodiment of the matrix multiplying matrix.

The basic processing circuit array arranged in the manner as shown in FIG. 4b may be used to perform the multiplication of matrix and matrix, where it is assumed that the basic processing circuit array has h rows and w columns.

The control circuit of the primary processing unit may divide the h rows of data of the matrix S into h groups, and the $i^{th}$ basic processing circuit is responsible for the operation of the $i^{th}$ group (the set of rows in the group of data is denoted as Hi).

The h rows of data is grouped in any way that the data will not be repeatedly allocated.

In an optional embodiment, the following allocation manner may be adopted: the control circuit of the primary processing unit distributing a $j^{th}$ row to the j % $h^{th}$ basic processing circuit.

In an optional embodiment, for rows that cannot be grouped evenly, it is also possible to group a part of the rows evenly, and the remaining rows may be grouped in any manner.

The control circuit of the primary processing unit may divide the W columns of data of the matrix P into w groups, and the $i^{th}$ basic processing circuit is responsible for the operation of the $i^{th}$ group (the set of rows in the group of data is denoted as Wi).

The W columns of data is grouped in any way that the data will not be repeatedly allocated.

In an optional embodiment, the following allocation manner may be adopted: the control circuit of the primary processing unit distributing a $j^{th}$ row to the j % $w^{th}$ basic processing circuit.

In an optional embodiment, for rows that cannot be grouped evenly, it is also possible to group a part of the columns evenly, and the remaining columns may be grouped in any manner.

The control circuit of the primary processing unit may transmit the data in part or all of the rows in the matrix S to the first basic processing circuit in each row of the basic processing circuit array.

In an optional embodiment, the control circuit of the primary processing circuit may transmit one or more data of one row of data in the $i^{th}$ group Hi in the charge of the control circuit of the primary processing circuit to the first basic processing circuit in the $i^{th}$ row of the basic processing circuit array each time.

In an optional embodiment, the control circuit of the primary processing circuit may transmit one or more data of some or all rows of data in the $i^{th}$ group Hi responsible by the control circuit of the primary processing circuit to the first basic processing circuit in the $i^{th}$ row of the basic processing circuit array each time.

The control circuit of the primary processing unit may transmit the data in part or all of the columns in the matrix P to the first basic processing circuit in each column of the basic processing circuit array.

In an optional embodiment, the control circuit of the primary processing circuit may transmit one or more data of one column of data in the $i^{th}$ group Wi responsible by the control circuit of the primary processing circuit to the first basic processing circuit in the $i^{th}$ column of the basic processing circuit array each time.

In an optional embodiment, the control circuit of the primary processing circuit may transmit one or more data of some or all columns of data in the $i^{th}$ group Ni responsible by the control circuit of the primary processing circuit to the first basic processing circuit in the $i^{th}$ column of the basic processing circuit array each time.

After receiving the data of the matrix S, the basic processing circuits may transmit the data to the next basic processing circuit connected thereto through the horizontal data output interface of the basic processing circuit (for example, the white-filled horizontal data path in the middle of the basic processing circuit array in FIG. 4b). After receiving the data of the matrix P, the basic processing circuits may transmit the data to the next basic processing circuit connected thereto through the vertical data output interface of the basic processing circuit (for example, the white-filled vertical data path in the middle of the basic processing circuit array in FIG. 4b).

Optionally, when each of the basic processing circuits includes a compression mapping circuit, after receiving the data (specifically, the data may include the data of the matrix S and the matrix P), the basic processing circuits may determine to start the corresponding compression mapping circuit to compress the data according to the operation of data; and the basic processing circuits may further transmit the compressed data to the next basic processing circuit connected thereto through the horizontal or vertical data output interface of the basic processing circuits.

Optionally, when each basic processing circuit in the first column and the first row includes the compression mapping circuit, after receiving the data (specifically, the data may include the data of the matrix S and the matrix P), each basic processing circuit in the first column or the first row of the device may compress the data. Each basic processing circuit in the first column or the first row may further transmit the compressed data to the next basic processing circuit connected thereto through the horizontal or vertical data output interface of the basic processing circuit. For details, please refer to the related description in the above embodiments.

Each basic processing circuit may perform operations on the data, and optionally, the data may be the compressed data.

In an optional embodiment, the basic processing circuits may perform multiplication on one or more sets of two numbers at a time, and then accumulate the result to the register and or on the on-chip cache.

In an optional embodiment, the basic processing circuits may perform the inner product operation on one or more sets of two vectors at a time, and then accumulate the result to the register and or on the on-chip cache.

After obtaining the result, the basic processing circuits may transmit the result out through the data output interface.

In an optional embodiment, the result may be an intermediate result or a final result of the inner product operation.

Specifically, if a basic processing circuit has an output interface directly connected to the primary processing circuit, the results will be transmitted from the output interface; and if a basic processing circuit does not have an output interface directly connected to the primary processing circuit, the results will be output to the direction of the basic processing circuit that can directly output to the primary processing circuit (for example, the basic processing circuits at the bottom row may transmit the operation result directly to the primary processing circuit, and the other basic processing circuits may transmit the operation result from the vertical output interface to the next basic processing circuit).

After receiving the operation result from other basic processing circuits, the basic processing circuits may transmit the data to other basic processing circuits or the primary processing circuit connected thereto.

The results may be output to the direction of the basic processing circuit that can directly output to the primary processing circuit (for example, the basic processing circuits at the bottom row may transmit the operation result directly to the primary processing circuit, and the other basic processing circuits may transmit the operation result from the vertical output interface to the next basic processing circuit).

The primary processing circuit may receive the result of the inner product operation of each basic processing circuit to obtain the output result.

The terms "horizontal" and "vertical" in the above description are only used to describe the examples as shown in FIG. 4b. In practice, it is only necessary to identify that the "horizontal" and "vertical" interfaces of each unit represent two different interfaces.

The circuit device is adopted to complete the full connection operation.

If the input data of a full connection layer is a vector (that is, the input of the neural network is a single sample), then a weight matrix of the full connection layer is taken as the matrix S, and an input vector is taken as the vector P, in this way, a multiplication of matrix and vector may be performed by using the device.

If the input data of the full connection layer is a matrix (that is, the input of the neural network is multiple samples), then a weight matrix of the full connection layer is taken as the matrix S, an input vector is taken as the matrix P, or a weight matrix of the full connection layer is taken as the matrix P, an input vector is taken as a matrix S, in this way, a multiplication of matrix and matrix could be performed by using the device.

The circuit device is adopted to complete the convolution operation.

The convolution operation is described below.

Figure 6A:
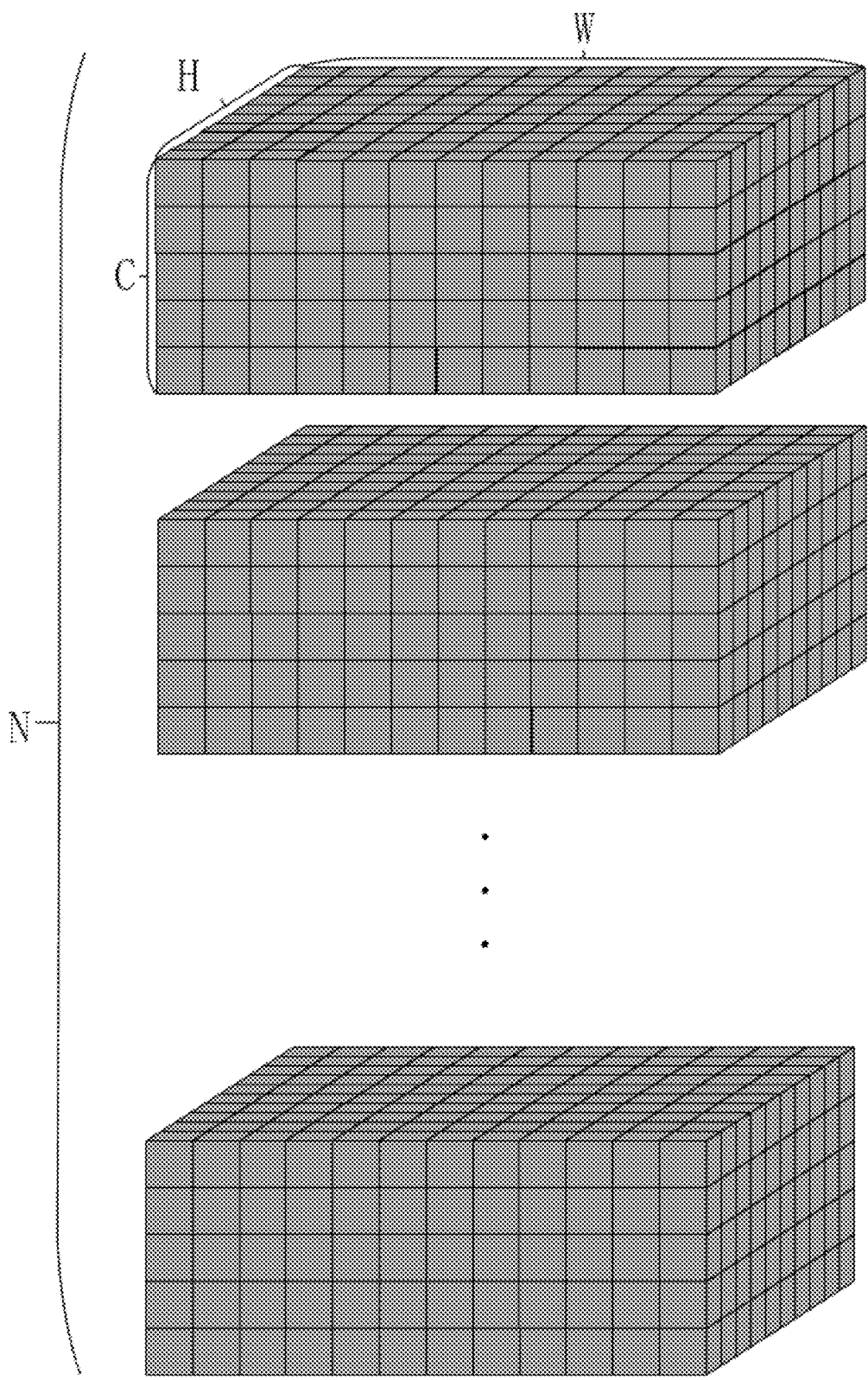
FIG. 6a is a diagram of input data of convolution operations according to an embodiment of the disclosure.
Figure 6B:
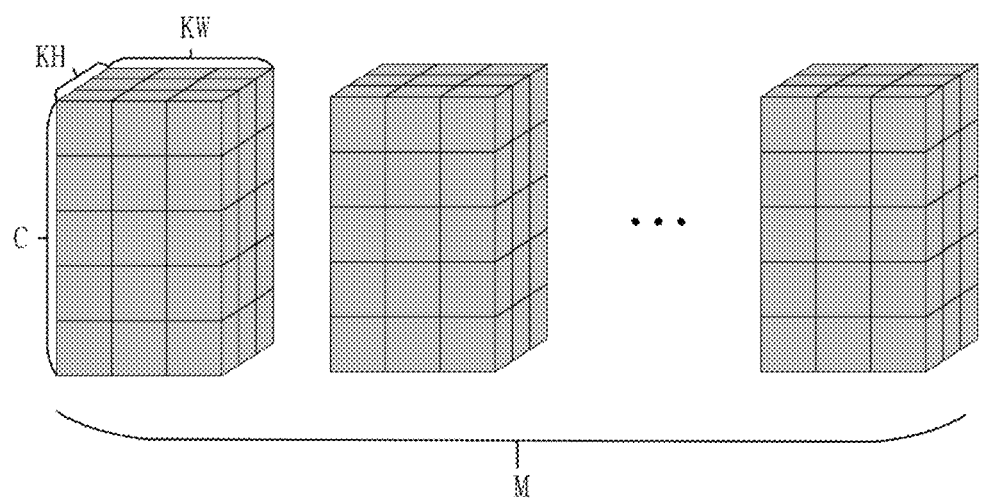
FIG. 6b is a diagram of a convolution kernel according to an embodiment of the disclosure.
Figure 6C:
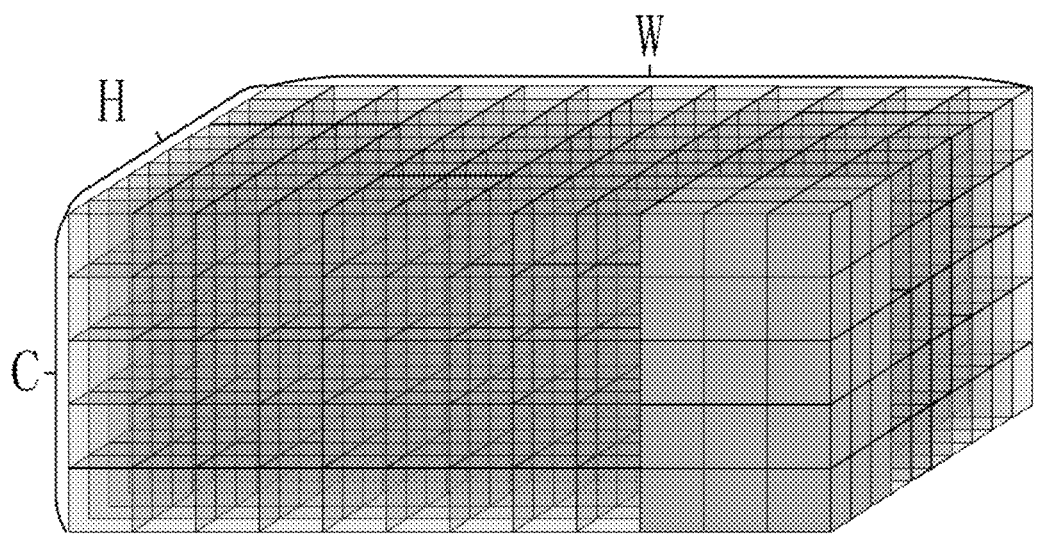
FIG. 6c is a diagram of an operation window of a three-dimensional data block of input data according to an embodiment of the disclosure.
Figure 6D:
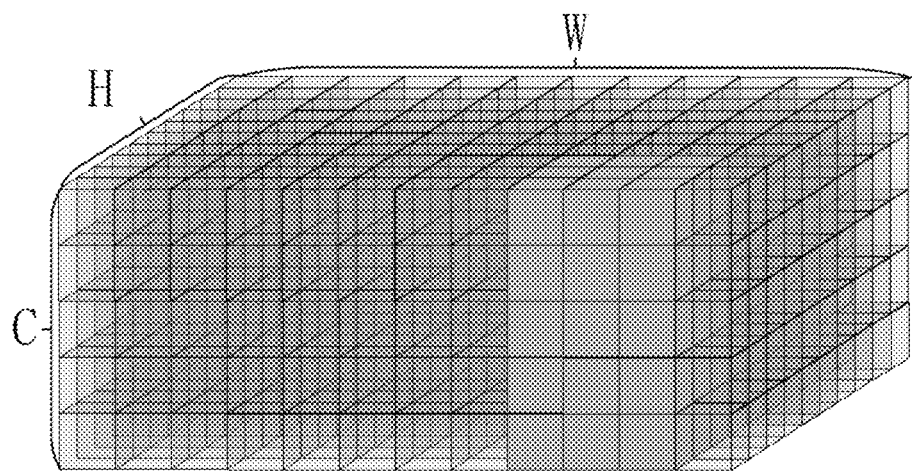
FIG. 6d is a diagram of another operation window of a three-dimensional data block for input data according to an embodiment of the disclosure.
Figure 6E:
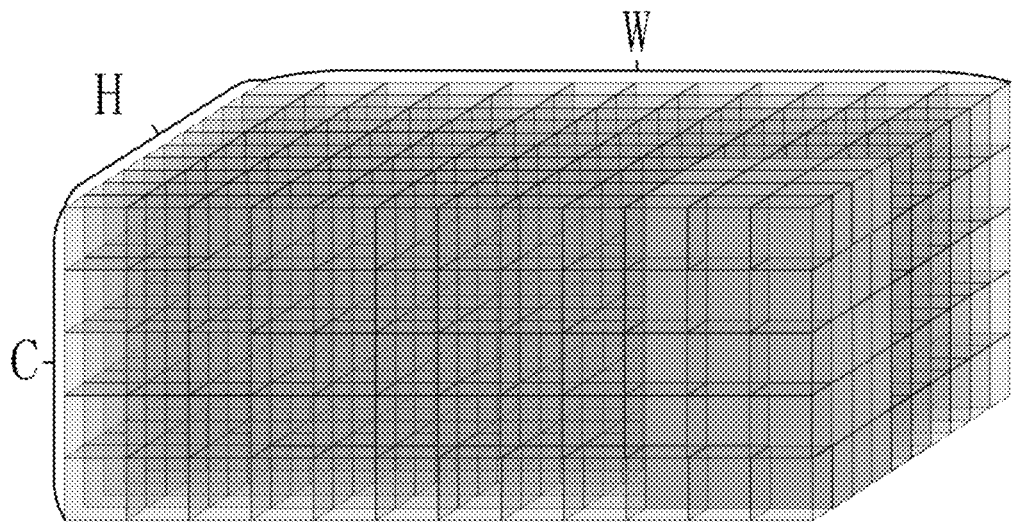
FIG. 6e is a diagram of another operation window of a three-dimensional data block for input data according to an embodiment of the disclosure.

In the figures below, a square represents a number, and input data is represented by FIG. 6a (there are N samples, where each sample has C channels, the height of a feature map of each channel is H, and the width of a feature map of each channel is W); a weight, that is, a convolution kernel is also represented by FIG. 6b (there are M convolution kernels, where each convolution kernel has C channels with KH height and KW width). For N samples of the input data, the rules of convolution operation are the same, and the following is the description of the convolution operation on a sample. For a sample, same operations may be performed on each of the M convolution kernels, that is, a plane feature map may be obtained by performing operation on each kernel, in this way, M plane feature maps may be obtained by performing operation on M convolution kernels (for a sample, the output of convolution is M feature maps); and for a convolution kernel, the inner product operation may be performed on each position in a plane in a sample, and then the convolution kernels may slide along the H and W directions. For example, FIG. 6c shows a corresponding figure of the inner product operation performed on a convolution kernel in the lower right corner of a sample of input data. FIG. 6d shows the position of the convolution sliding one space to the left, and FIG. 6e shows the position of the convolution sliding up one space.

The embodiment as shown in FIG. 4b may be used to describe the device adopted to perform the method.

The control circuit of the primary processing circuit may transmit data in part or all of the convolution kernels of the weight to the basic processing circuits that are directly connected to the primary processing circuit through the horizontal data input interface (for example, the grey-filled vertical data path at the top of FIG. 4b).

In an optional embodiment, the control circuit of the primary processing circuit may transmit a number or a part of numbers of a certain convolution kernel in the weight to a certain basic processing circuit each time, for example, a certain basic processing circuit may transmit the first number in a third row at the first time, the second number in the third row at the second time, and the third number in the third row at the third time . . . ; or a certain basic processing circuit may transmit the first two numbers in the third row at the first time, the third and fourth numbers in the third row at the second time, and the fifth and sixth numbers in the third row at the third time . . . .

In the other case of an optional embodiment, the control circuit of the primary processing circuit may transmit a number or a part of numbers of some convolution kernels in the weight to a certain basic processing circuit each time, for example, a certain basic processing circuit may transmit the first numbers in a third, fourth, and fifth rows at the first time, the second numbers in the third, fourth, and fifth rows at the second time, and the third numbers in the third, fourth, and fifth rows at the third time . . . ; or a certain basic processing circuit may transmit the first two numbers in the third, fourth, and fifth rows at the first time, the third and fourth numbers in the third, fourth, and fifth rows at the second time, and the fifth and sixth numbers in the third, fourth, and fifth rows at the third time . . . .

The control circuit of the primary processing circuit may divide the input data according to the position of the convolution, and the control circuit of the primary processing circuit may further transmit the some or all position data of convolution of the input data to the basic processing circuits that are directly connected to the primary processing circuit through the vertical data input interface (for example, the grey-filled horizontal data path on the left side of the basic processing circuit array in FIG. 4b).

In an optional embodiment, the control circuit of the primary processing circuit may transmit a number or a part of numbers of a certain position data of convolution to a certain basic processing circuit, for example, a certain basic processing circuit may transmit the first number in a third column at the first time, the second number in the third row at the second time, and the third number in the third column at the third time . . . ; or a certain basic processing circuit may transmit the first two numbers in the third column at the first time, the third and fourth numbers in the third column at the second time, and the fifth and sixth numbers in the third column at the third time . . . .

In the other case of an optional embodiment, the control circuit of the primary processing circuit may transmit a number or a part of numbers of some position data of convolution to a certain basic processing circuit, for example, a certain basic processing circuit may transmit the first number in a third, fourth, and fifth columns at the first time, the second number in the third, fourth, and fifth columns at the second time, and the third number in the third, fourth, and fifth columns at the third time . . . ; or a certain basic processing circuit may transmit the first two numbers in the third, fourth, and fifth columns at the first time, the third and fourth numbers in the third, fourth, and fifth columns at the second time, and the fifth and sixth numbers in the third, fourth, and fifth columns at the third time . . . .

After receiving the data of the weight, the basic processing circuits may transmit the data to the next basic processing circuit connected thereto through the horizontal data output interface of the basic processing circuit (for example, the white-filled horizontal data path in the middle of the basic processing circuit array in FIG. 4b). After receiving the input data, the basic processing circuits may transmit the data to the next basic processing circuit connected thereto through the vertical data output interface of the basic processing circuit (for example, the white-filled vertical data path in the middle of the basic processing circuit array in FIG. 4b).

Optionally, after receiving the data (specifically, the data may include the data in part or all of the convolution kernels of the weight), the basic processing circuits may determine to start the corresponding compression mapping circuit to compress the data according to the operation of data; and the basic processing circuits may further transmit the compressed data to the next basic processing circuit connected thereto through the horizontal or vertical data output interface of the basic processing circuits. For details, please refer to the related description in the foregoing embodiments.

Or, after receiving the data (specifically, the data may include the data in part or all of the convolution kernels of the weight), each basic processing unit in the first column or the first row of the device may compress the data; each basic processing unit in the first column or the first row may further transmit the compressed data to the next basic processing circuit connected thereto through the horizontal or vertical data output interface of the basic processing unit. For details, please refer to the related description in the foregoing embodiments.

Each basic processing circuit may perform operations on the data, and optionally, the data may be the compressed data.

In an optional embodiment, the basic processing circuits may perform multiplication on one or more sets of two numbers at a time, and then accumulate the result to the register and or on the on-chip cache.

In an optional embodiment, the basic processing circuits may perform the inner product operation on one or more sets of two vectors at a time, and then accumulate the result to the register and or on the on-chip cache.

After obtaining the result, the basic processing circuits may transmit the result out through the data output interface.

In an optional embodiment, the result may be an intermediate result or a final result of the inner product operation.

Specifically, if a basic processing circuit has an output interface directly connected to the primary processing circuit, the results will be transmitted from the output interface; and if a basic processing circuit does not have an output interface directly connected to the primary processing circuit, the results will be output to the direction of the basic processing circuit that can directly output to the primary processing circuit (for example, the basic processing circuits at the bottom row may transmit the operation result directly to the primary processing circuit, and the other basic processing circuits may transmit the operation result from the vertical output interface to the next basic processing circuit).

After receiving the operation result from other basic processing circuits, the basic processing circuits may transmit the data to other basic processing circuits or the primary processing circuit connected thereto.

The results may be output to the direction of the basic processing circuit that can directly output to the primary processing circuit (for example, the basic processing circuits at the bottom row may transmit the operation result directly to the primary processing circuit, and the other basic processing circuits may transmit the operation result from the vertical output interface to the next basic processing circuit).

The primary processing circuit may receive the result of the inner product operation of each basic processing circuit to obtain the output result.

In an embodiment, the present disclosure provides a neural network operation device, which includes functional units configured to perform all or part of the implementation methods provided in the method embodiments described above.

Figure 7:
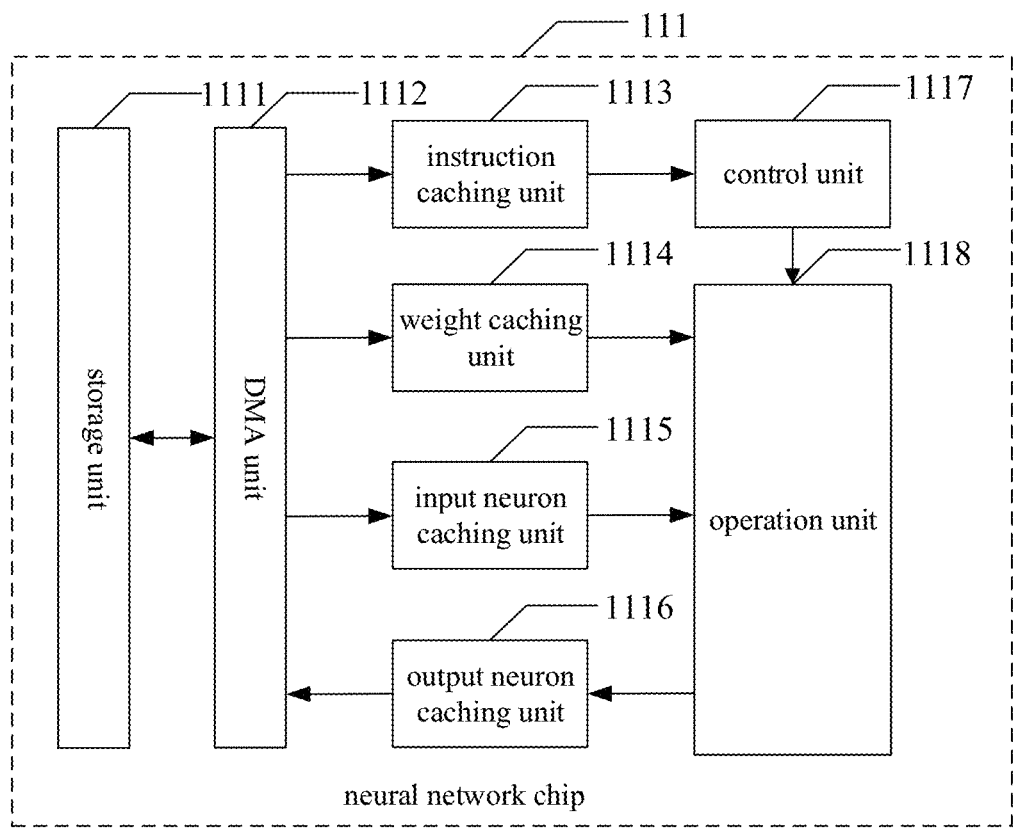
FIG. 7 is a structural diagram of a neural network chip according to an embodiment of the disclosure.

In an embodiment, the present disclosure provides a chip (as shown in FIG. 7) configured to perform all or part of the implementation methods provided in the method embodiments described above.

In an embodiment, the present disclosure provides an electronic device, which includes the functional units configured to perform all or part of the implementation methods provided in the method embodiments described above.

The electronic devices may include data processing devices, robots, computers, printers, scanners, tablets, smart terminals, mobile phones, driving recorders, navigators, sensors, webcams, servers, cloud servers, cameras, cameras, projectors, watches, headphones, mobile storage, wearable devices, vehicles, household appliances, and/or medical devices.

The vehicles may include an aircraft, a ship, and/or a car; the household appliance may include a television, an air conditioner, a microwave oven, a refrigerator, a rice cooker, a humidifier, a washing machine, an electric lamp, a gas stove, a range hood; the medical device may include a nuclear magnetic resonance instrument, a B-ultrasound, and/or an electrocardiograph.

What is claimed is:

1. An integrated circuit chip device, comprising a primary processing circuit, k branch circuits, and k groups of basic processing circuits, wherein the primary processing circuit is connected to the k branch circuits respectively, each branch circuit of the k branch circuits corresponds to one group of basic processing circuits of the k groups of basic processing circuits, and one group of basic processing circuits includes at least one basic processing circuit, wherein
   each of the branch circuits includes a compression mapping circuit configured to perform compression on each data in a neural network operation;
   the primary processing circuit is configured to perform operations of the neural network in series and transmit the data to the k branch circuits connected to the primary processing circuit;
   the k branch circuits are configured to forward the data between the primary processing circuit and the k groups of basic processing circuits, and control whether to start the compression mapping circuit to perform compression on the transmitted data; and
   the k basic processing circuits are configured to perform operations of the neural network in series according to the data or the compressed data, and transmit an operation result to the primary processing circuit.

2. The integrated circuit chip device of claim 1, further comprising:
   the primary processing circuit is configured to obtain data blocks to be computed and an operation instruction, divide the data blocks to be computed into a data block for distribution and a data block for broadcasting according to the operation instruction, split the data block for distribution to obtain a plurality of basic data blocks, distribute the plurality of basic data blocks to the k branch circuits connected to the primary processing circuit, and broadcast the data block for broadcasting to the k branch circuits connected to the primary processing circuit;
   the k branch circuits are configured to receive the basic data blocks and the data block for broadcasting, start the compression mapping circuit to perform compression on the basic data blocks and the data block for broadcasting, and then forward the compressed basic data blocks and the data block for broadcasting to the k groups of basic processing circuits;
   the basic processing circuits are configured to perform an inner product operation on the compressed basic data block and the data block for broadcasting to obtain an operation result, and transmit the operation result to the primary processing circuit;
   the primary processing circuit is configured to process the operation result to obtain the data blocks to be computed and an instruction result of the operation instruction;
   wherein the data blocks to be computed are at least one input neuron and/or one weight to be computed.

3. The integrated circuit chip device of claim 2, wherein the compression mapping circuit includes a second sparse processing unit, a third sparse processing unit, and a connection relation processing unit;
   wherein the second sparse processing unit is configured to receive third input data, obtain first connection relation data according to the third input data, and transmit the first connection relation data to the connection relation processing unit;
   the third sparse processing unit is configured to receive fourth input data, obtain second connection relation data according to the fourth input data, and transmit the second connection relation data to the connection relation processing unit;
   the connection relation processing unit is configured to obtain third connection relation data according to the first connection relation data and the second connection relation data, and transmit the third connection relation data to a second data processing unit;
   the second data processing unit is configured to compress the third input data and the fourth input data according to the third connection relation data after receiving the third input data, the fourth input data and the third connection relation data, so as to obtain fourth output data and fifth output data; wherein
   when the third input data includes at least one input neuron and the fourth input data includes at least one weight, the first connection relation data is connection relation data of the input neuron, and the second connection relation data is connection relation data of the weight, the fourth output data is a processed input neuron, and the fifth output data is a processed weight; when the third input data includes at least one weight, and the fourth input data includes at least one input neuron, the first connection relation data is connection relation data of the weight, the second connection relation data is connection relation data of the input neuron, the fourth output data is a processed weight, and the fifth output data is a processed input neuron.

4. The integrated circuit chip device of claim 3, wherein the connection relation data of the input neuron and the connection relation data of the weight are composed of a string or a matrix represented by 0 and 1, and are independent of an output neuron; or
   the connection relation data of the input neuron and the connection relation data of the weight are represented in a form of a direct index or a stride index;
   wherein, when the connection relation data of the input neuron is represented in the form of the direct index, the connection relation data is a string composed of 0 and 1, wherein 0 indicates that an absolute value of the input neuron is less than or equal to a first threshold, and 1 indicates that an absolute value of the input neuron is greater than the first threshold;
   when the connection relation data of the input neuron is represented in the form of the stride index, the connection relation data is a string composed of a distance value between an input neuron whose absolute value is greater than the first threshold and a previous input neuron whose absolute value is greater than the first threshold;

when the connection relation data of the weight is represented in the form of the direct index, the connection relation data is a string composed of 0 and 1, where 0 indicates that an absolute value of the weight is less than or equal to a second threshold, that is, an input neuron corresponding to the weight is not connected to an output neuron corresponding to the weight, and 1 indicates that the absolute value of the weight is greater than the second threshold, that is, the input neuron corresponding to the weight is connected to the output neuron corresponding to the weight; the connection relation data of the weight represented by the direct index form has two representation orders: a string of 0 and 1 composed of connection state of each output neuron and all input neurons for representing the connection relation data of the weight; or a string of 0 and 1 composed of connection state of each input neuron and all output neurons for representing the connection relation data of the weight; and when the connection relation data of the weight is represented in the form of the stride index, the connection relation data is a string composed of a distance value between an input neuron connected to an output neuron and a previous input neuron connected to the output neuron.

5. The integrated circuit chip device of claim 4, wherein when the first connection relation data and the second connection data are represented in the form of the stride index, and a string representing the first connection relation data and the second connection relation data are stored in order of physical address from lowest to highest, the connection relation processing unit is configured to:

accumulate each element in the string of the first connection relation data and elements whose memory physical addresses are lower than the memory physical address of the element to obtain a new element, wherein the new element constitutes fourth connection relation data; accumulate each element in the string of the second connection relation data and elements whose memory physical addresses are lower than the memory physical address of the element, wherein an obtained new element constitutes a fifth connection relation data;

select same elements from the string of the fourth connection relation data and the string of the fifth connection relation data, and sort the elements in order of smallest to largest to form a new string; and subtract an adjacent element whose value is smaller than that of a minuend element from each element in the new string, wherein an obtained new element constitutes the third connection relation data.

6. The integrated circuit chip device of claim 4, wherein when the first connection relation data and the second connection relation data are both represented in the form of the direct index, the connection relation processing unit is configured to perform an AND operation on the first connection relation data and the second connection relation data to obtain the third connection relation data.

7. The integrated circuit chip device of claim 4, wherein when any one of the first connection relation data and the second connection relation data is represented in the form of the stride index and the other is represented in the form of the direct index, the connection relation processing unit is configured to:

convert the first connection relation data represented in the form of the stride index into connection relation data represented in the form of the direct index;

convert the second connection relation data represented in the form of the stride index into connection relation data represented in the form of the direct index; and perform the AND operation on the first connection relation data and the second connection relation data to obtain the third connection relation data.

8. The integrated circuit chip device of claim 4, wherein when any one of the first connection relation data and the second connection relation data is represented in the form of the stride index and the other is represented in the form of the direct index, and the strings representing the first connection relation data and the second connection relation data are stored in order of lowest to highest physical addresses, the connection relation processing unit is configured to:

convert, if the first connection relation data is represented in the form of the stride index, the second connection relation data into the connection relation data represented in the form of the stride index;

convert, if the second connection relation data is represented in the form of the stride index, the first connection relation data into the connection relation data represented in the form of the stride index;

accumulate each element in the string of the first connection relation data and elements whose memory physical addresses are lower than the memory physical address of the elements, wherein an obtained new element constitutes the fourth connection relation data; accumulate each element in the string of the second connection relation data and elements whose memory physical addresses are lower than the memory physical address of the elements, wherein an obtained new element constitutes a fifth connection relation data;

select same elements from the string of the fourth connection relation data and the string of the fifth connection relation data, and sort the elements in order of smallest to largest to form a new string; and subtract an adjacent element whose value is smaller than that of the minuend element from each element in the new string, and an obtained new element constitutes the third connection relation data.

9. The integrated circuit chip device of claim 2, wherein before starting the compression mapping circuits to perform compression on the basic data blocks and the data block for broadcasting, the k branch circuits are further configured to:

group the at least one input neuron to obtain M groups of input neurons by using the compression mapping circuits, wherein the M is an integer greater than or equal to 1;

determine whether each group of input neurons of the M groups of input neurons meets a first preset condition, wherein the first preset condition includes that a count of input neurons whose absolute values are less than or equal to a third threshold in a group of input neurons is less than or equal to a fourth threshold;

delete a group of input neurons when any one of the M groups of input neurons does not meet the first preset condition;

group the at least one weight to obtain N groups of weights, wherein the N is an integer greater than or equal to 1;

determine whether each group of weights of the N groups of weights meets a second preset condition, wherein the second preset condition includes that a count of weights whose absolute values are less than or equal to a fifth threshold in a group of weights is less than or equal to a sixth threshold; and delete a group of weights when any one of the N groups of weights does not meet the second preset condition.

10. The integrated circuit chip device of claim 2, wherein
the primary processing circuit is configured to split the data block for broadcasting to the k branch circuits by one time; or the primary processing circuit is configured to split the data block for broadcasting into a plurality of partial data blocks for broadcasting, and sequentially broadcast the plurality of partial data blocks for broadcasting to the k branch circuits.

11. The integrated circuit chip device of claim 10, wherein
the basic processing circuits are configured to perform an inner product operation on the partial data blocks for broadcasting and the basic data blocks to obtain an inner product operation result, accumulate the inner product operation result to obtain partial operation results, and then transmit the partial operation result to the primary processing circuit.

12. The integrated circuit chip device of claim 11, wherein
the basic processing circuits are configured to reuse the partial data blocks for broadcasting to perform the inner product operation of the partial data blocks for broadcasting and the n basic data blocks to obtain n partial processing results, accumulate the n partial processing results to obtain n partial operation results, and transmit the n partial operation results to the primary processing circuit, wherein n is an integer greater than or equal to 2.

13. An electronic device, comprising:
an integrated circuit chip device that includes:
a primary processing circuit, k branch circuits, and k groups of basic processing circuits, wherein the primary processing circuit is connected to the k branch circuits respectively, each branch circuit of the k branch circuits corresponds to one group of basic processing circuits of the k groups of basic processing circuits, and one group of basic processing circuits includes at least one basic processing circuit, wherein each of the branch circuits includes a compression mapping circuit configured to perform compression on each data in a neural network operation;

the primary processing circuit is configured to perform operations of the neural network in series and transmit the data to the k branch circuits connected to the primary processing circuit;

the k branch circuits are configured to forward the data between the primary processing circuit and the k groups of basic processing circuits, and control whether to start the compression mapping circuit to perform compression on the transmitted data; and the k basic processing circuits are configured to perform operations of the neural network in series according to the data or the compressed data, and transmit an operation result to the primary processing circuit.

14. The electronic device of claim 13, further comprising:
the primary processing circuit is configured to obtain data blocks to be computed and an operation instruction, divide the data blocks to be computed into a data block for distribution and a data block for broadcasting according to the operation instruction, split the data block for distribution to obtain a plurality of basic data blocks, distribute the plurality of basic data blocks to the k branch circuits connected to the primary processing circuit, and broadcast the data block for broadcasting to the k branch circuits connected to the primary processing circuit;

the k branch circuits are configured to receive the basic data blocks and the data block for broadcasting, start the compression mapping circuit to perform compression on the basic data blocks and the data block for broadcasting, and then forward the compressed basic data blocks and the data block for broadcasting to the k groups of basic processing circuits;

the basic processing circuits are configured to perform an inner product operation on the compressed basic data block and the data block for broadcasting to obtain an operation result, and transmit the operation result to the primary processing circuit;

the primary processing circuit is configured to process the operation result to obtain the data blocks to be computed and an instruction result of the operation instruction;

wherein the data blocks to be computed are at least one input neuron and/or one weight to be computed.

15. The electronic device of claim 14, wherein the compression mapping circuit includes a second sparse processing unit, a third sparse processing unit, and a connection relation processing unit;

wherein the second sparse processing unit is configured to receive third input data, obtain first connection relation data according to the third input data, and transmit the first connection relation data to the connection relation processing unit;

the third sparse processing unit is configured to receive fourth input data, obtain second connection relation data according to the fourth input data, and transmit the second connection relation data to the connection relation processing unit;

the connection relation processing unit is configured to obtain third connection relation data according to the first connection relation data and the second connection relation data, and transmit the third connection relation data to a second data processing unit;

the second data processing unit is configured to compress the third input data and the fourth input data according to the third connection relation data after receiving the third input data, the fourth input data and the third connection relation data, so as to obtain fourth output data and fifth output data; wherein when the third input data includes at least one input neuron and the fourth input data includes at least one weight, the first connection relation data is connection relation data of the input neuron, and the second connection relation data is connection relation data of the weight, the fourth output data is a processed input neuron, and the fifth output data is a processed weight; when the third input data includes at least one weight, and the fourth input data includes at least one input neuron, the first connection relation data is connection relation data of the weight, the second connection relation data is connection relation data of the input neuron, the fourth output data is a processed weight, and the fifth output data is a processed input neuron.

16. The electronic device of claim 15, wherein
the connection relation data of the input neuron and the connection relation data of the weight are composed of a string or a matrix represented by 0 and 1, and are independent of an output neuron; or the connection relation data of the input neuron and the connection relation data of the weight are represented in a form of a direct index or a stride index;

wherein, when the connection relation data of the input neuron is represented in the form of the direct index, the connection relation data is a string composed of 0 and 1, wherein 0 indicates that an absolute value of the input neuron is less than or equal to a first threshold, and 1 indicates that an absolute value of the input neuron is greater than the first threshold;

when the connection relation data of the input neuron is represented in the form of the stride index, the connection relation data is a string composed of a distance value between an input neuron whose absolute value is greater than the first threshold and a previous input neuron whose absolute value is greater than the first threshold;

when the connection relation data of the weight is represented in the form of the direct index, the connection relation data is a string composed of 0 and 1, where 0 indicates that an absolute value of the weight is less than or equal to a second threshold, that is, an input neuron corresponding to the weight is not connected to an output neuron corresponding to the weight, and 1 indicates that the absolute value of the weight is greater than the second threshold, that is, the input neuron corresponding to the weight is connected to the output neuron corresponding to the weight; the connection relation data of the weight represented by the direct index form has two representation orders: a string of 0 and 1 composed of connection state of each output neuron and all input neurons for representing the connection relation data of the weight; or a string of 0 and 1 composed of connection state of each input neuron and all output neurons for representing the connection relation data of the weight; and when the connection relation data of the weight is represented in the form of the stride index, the connection relation data is a string composed of a distance value between an input neuron connected to an output neuron and a previous input neuron connected to the output neuron.

17. The electronic device of claim 16, wherein
when the first connection relation data and the second connection data are represented in the form of the stride index, and a string representing the first connection relation data and the second connection relation data are stored in order of physical address from lowest to highest, the connection relation processing unit is configured to:
accumulate each element in the string of the first connection relation data and elements whose memory physical addresses are lower than the memory physical address of the element to obtain a new element, wherein the new element constitutes fourth connection relation data; accumulate each element in the string of the second connection relation data and elements whose memory physical addresses are lower than the memory physical address of the element, wherein an obtained new element constitutes a fifth connection relation data;
select same elements from the string of the fourth connection relation data and the string of the fifth connection relation data, and sort the elements in order of smallest to largest to form a new string; and
subtract an adjacent element whose value is smaller than that of a minuend element from each element in the new string, wherein an obtained new element constitutes the third connection relation data.

18. The electronic device of claim 16, wherein
when the first connection relation data and the second connection relation data are both represented in the form of the direct index, the connection relation processing unit is configured to perform an AND operation on the first connection relation data and the second connection relation data to obtain the third connection relation data.

19. The electronic device of claim 16, wherein
when any one of the first connection relation data and the second connection relation data is represented in the form of the stride index and the other is represented in the form of the direct index, the connection relation processing unit is configured to:
convert the first connection relation data represented in the form of the stride index into connection relation data represented in the form of the direct index;
convert the second connection relation data represented in the form of the stride index into connection relation data represented in the form of the direct index; and
perform the AND operation on the first connection relation data and the second connection relation data to obtain the third connection relation data.

20. A neural network operation method, comprising:
performing, by a primary processing circuit of an integrated circuit chip device, operations of a neural network in series,
wherein the integrated circuit chip device further includes k branch circuits, and k groups of basic processing circuits,
wherein the primary processing circuit is connected to the k branch circuits respectively,
wherein each branch circuit of the k branch circuits corresponds to one group of basic processing circuits of the k groups of basic processing circuits, and
wherein one group of basic processing circuits includes at least one basic processing circuit;
forwarding, by the k branch circuits, the data between the primary processing circuit and the k groups of basic processing circuits;
controlling, by the k branch circuits, whether to start the compression mapping circuit to perform compression on the transmitted data;
performing, by the k basic processing circuits, operations of the neural network in series according to the data or the compressed data; and
transmitting, by the k basic processing circuits, an operation result to the primary processing circuit.

* * * * *